(12) United States Patent
Sasaki et al.

(10) Patent No.: US 7,972,945 B2
(45) Date of Patent: Jul. 5, 2011

(54) PLASMA DOPING APPARATUS AND METHOD, AND METHOD FOR MANUFACTURING SEMICONDUCTOR DEVICE

(75) Inventors: Yuichiro Sasaki, Osaka (JP); Katsumi Okashita, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/808,285

(22) PCT Filed: Dec. 11, 2008

(86) PCT No.: PCT/JP2008/003705
§ 371 (c)(1),
(2), (4) Date: Jun. 15, 2010

(87) PCT Pub. No.: WO2009/084160
PCT Pub. Date: Jul. 9, 2009

(65) Prior Publication Data
US 2010/0297836 A1    Nov. 25, 2010

(30) Foreign Application Priority Data
Dec. 28, 2007  (JP) .................... 2007-339665

(51) Int. Cl.
  *H01L 21/26*      (2006.01)
(52) U.S. Cl. ......... 438/513; 438/514; 438/515; 118/665
(58) Field of Classification Search .......... 438/513, 438/514, 515; 118/665
See application file for complete search history.

(56) References Cited

U.S. PATENT DOCUMENTS

| 4,912,065 | A |   | 3/1990  | Mizuno et al. |
|-----------|---|---|---------|---------------|
| 5,460,708 | A |   | 10/1995 | Takeuchi et al. |
| 6,020,592 | A | * | 2/2000  | Liebert et al. ............ 250/492.21 |
| 6,207,537 | B1 |  | 3/2001  | Satoh et al. |
| 6,237,527 | B1 | * | 5/2001 | Kellerman et al. ....... 118/723 E |
| 6,660,140 | B2 |  | 12/2003 | Buchanan et al. |
| 6,719,886 | B2 |  | 4/2004  | Drewery et al. |
| 7,358,511 | B2 |  | 4/2008  | Sasaki et al. |
| 2004/0045507 | A1 | | 3/2004 | Okumura et al. |
| 2007/0111548 | A1 | | 5/2007 | Sasaki et al. |
| 2007/0176124 | A1 | | 8/2007 | Sasaki et al. |

FOREIGN PATENT DOCUMENTS

JP    61-183467    8/1986

(Continued)

OTHER PUBLICATIONS

Notification of Transmittal of English translation of International Preliminary Report on Patentability issued in International Application No. PCT/JP2008/003705 filed Dec. 11, 2008.

*Primary Examiner* — Thinh T Nguyen
(74) *Attorney, Agent, or Firm* — McDermott Will & Emery LLP

(57) ABSTRACT

A top plate, disposed on an upper portion of a vacuum container so as to face a substrate-placing area of a sample electrode, is provided with an impurity-containing film that contains an impurity, and is formed on a top plate peripheral edge portion area that is a face exposable to a plasma generated in the vacuum container, and is located on a peripheral edge of a top plate center portion area that faces the center portion of the substrate-placing area.

12 Claims, 33 Drawing Sheets

| SUBSTRATE OUTER DIAMETER (DIAMETER) | 200mm | 200mm | 200mm | |
|---|---|---|---|---|
| OUTER DIAMETER (DIAMETER) OF SUBSTRATE SUPPORTING PORTION (SUBSTRATE CHUCK PORTION) | 200mm | 300mm | 450mm | SAME AS SUBSTRATE DIAMETER |
| TOP PLATE (DIAMETER) | LARGER THAN 200mm SMALLER THAN 340mm | LARGER THAN 300mm SMALLER THAN 510mm | LARGER THAN 300mm SMALLER THAN 765mm | CONSTANT RATIO TO SUBSTRATE DIAMETER |
| OPENING PORTION OF FILM CONTAINING BORON (RATIO) | 0.125 OR MORE 0.75 OR LESS | 0.125 OR MORE 0.75 OR LESS | 0.125 OR MORE 0.75 OR LESS | RATIO OF OPENING PORTION BASED ON RADIUS OF SUBSTRATE SUPPORTING PORTION |
| THICKNESS OF FILM CONTAINING BORON | 0.01 $\mu$m OR MORE 100 $\mu$m OR LESS | 0.01 $\mu$m OR MORE 100 $\mu$m OR LESS | 0.01 $\mu$m OR MORE 100 $\mu$m OR LESS | CONSTANT REGARDLESS OF SUBSTRATE OUTER DIAMETER |

FOREIGN PATENT DOCUMENTS

| | | |
|---|---|---|
| JP | 05-044025 | 2/1993 |
| JP | 05-320891 | 12/1993 |
| JP | 09-129615 | 5/1997 |
| JP | 11-214320 | 8/1999 |
| JP | 2004-047695 | 2/2004 |
| JP | 2005-005328 | 1/2005 |
| WO | WO 2004/109785 A1 | 12/2004 |
| WO | WO 2006/121131 A1 | 11/2006 |

* cited by examiner

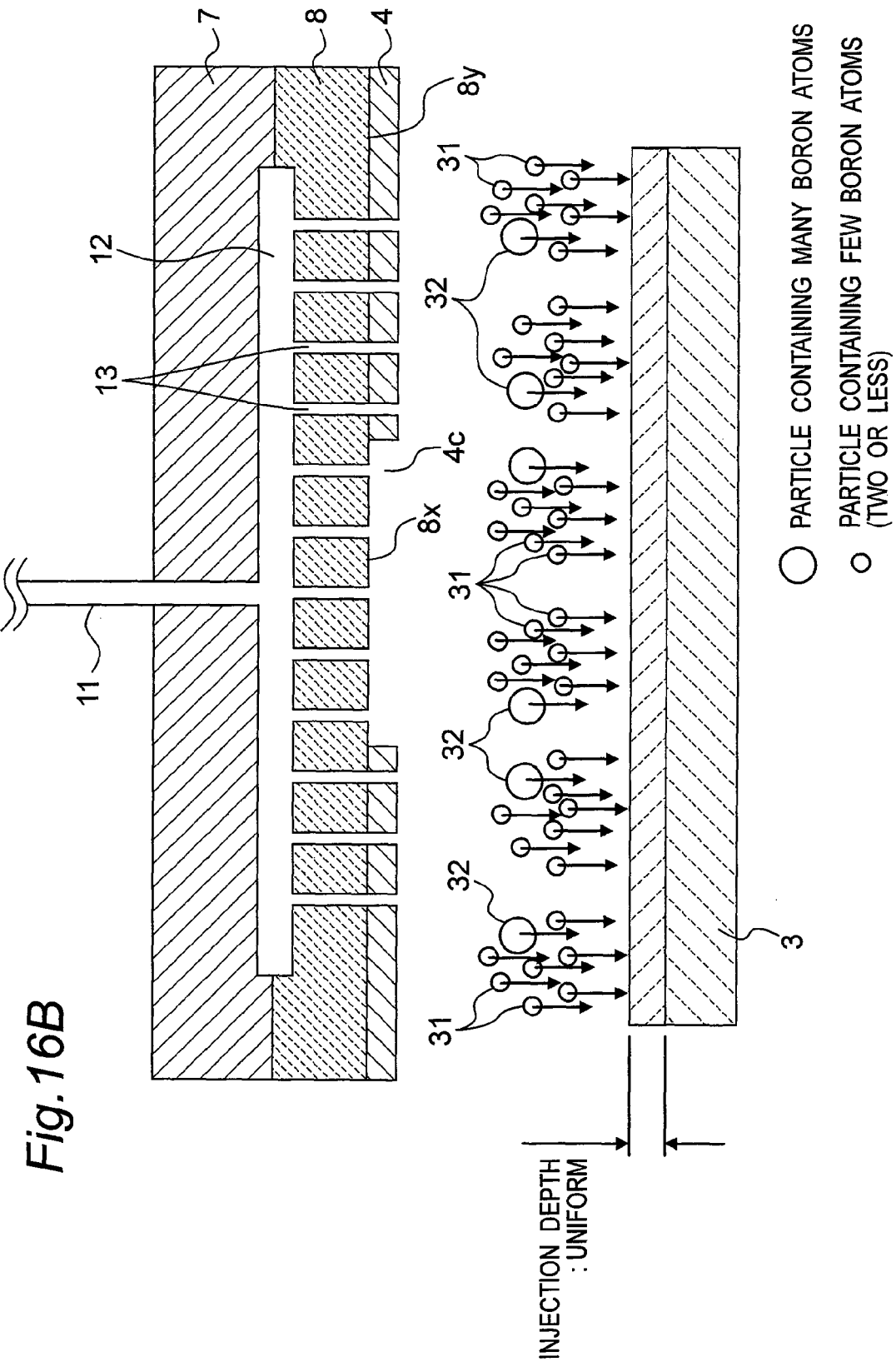

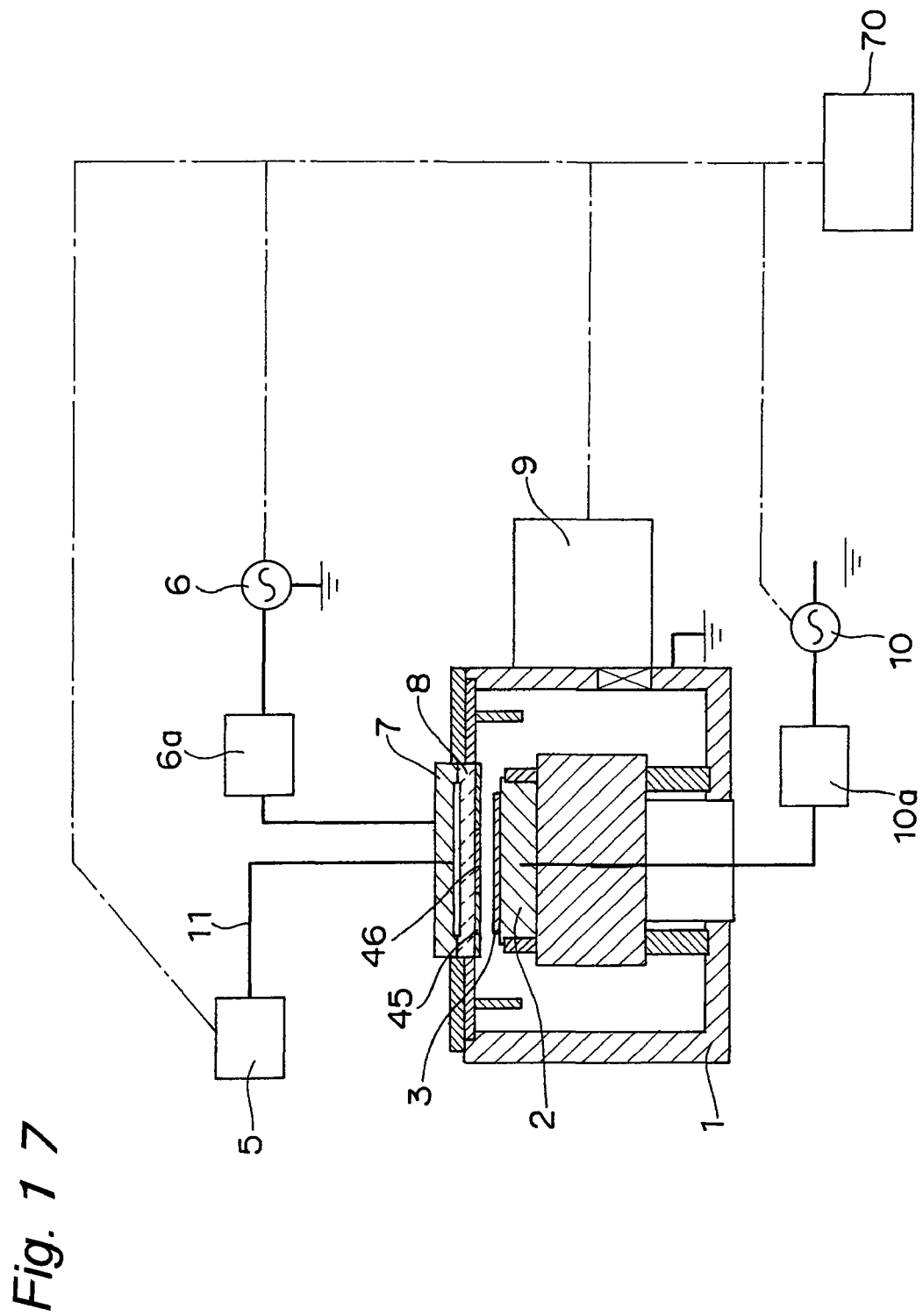

20sec
607.6 ohm/sq.
8.15 %

60sec
389.8 ohm/sq.
5.83 %

120sec
284.9 ohm/sq.
2.69 %

200sec
238.4 ohm/sq.
1.11 %

Fig.22C

| SUBSTRATE OUTER DIAMETER (DIAMETER) | 200mm | 200mm | 200mm | |
|---|---|---|---|---|
| OUTER DIAMETER (DIAMETER) OF SUBSTRATE SUPPORTING PORTION (SUBSTRATE CHUCK PORTION) | 200mm | 300mm | 450mm | SAME AS SUBSTRATE DIAMETER |
| TOP PLATE (DIAMETER) | LARGER THAN 200mm SMALLER THAN 340mm | LARGER THAN 300mm SMALLER THAN 510mm | LARGER THAN 300mm SMALLER THAN 765mm | CONSTANT RATIO TO SUBSTRATE DIAMETER |
| OPENING PORTION OF FILM CONTAINING BORON (RATIO) | 0.125 OR MORE 0.75 OR LESS | 0.125 OR MORE 0.75 OR LESS | 0.125 OR MORE 0.75 OR LESS | RATIO OF OPENING PORTION BASED ON RADIUS OF SUBSTRATE SUPPORTING PORTION |
| THICKNESS OF FILM CONTAINING BORON | 0.01 μm OR MORE 100 μm OR LESS | 0.01 μm OR MORE 100 μm OR LESS | 0.01 μm OR MORE 100 μm OR LESS | CONSTANT REGARDLESS OF SUBSTRATE OUTER DIAMETER |

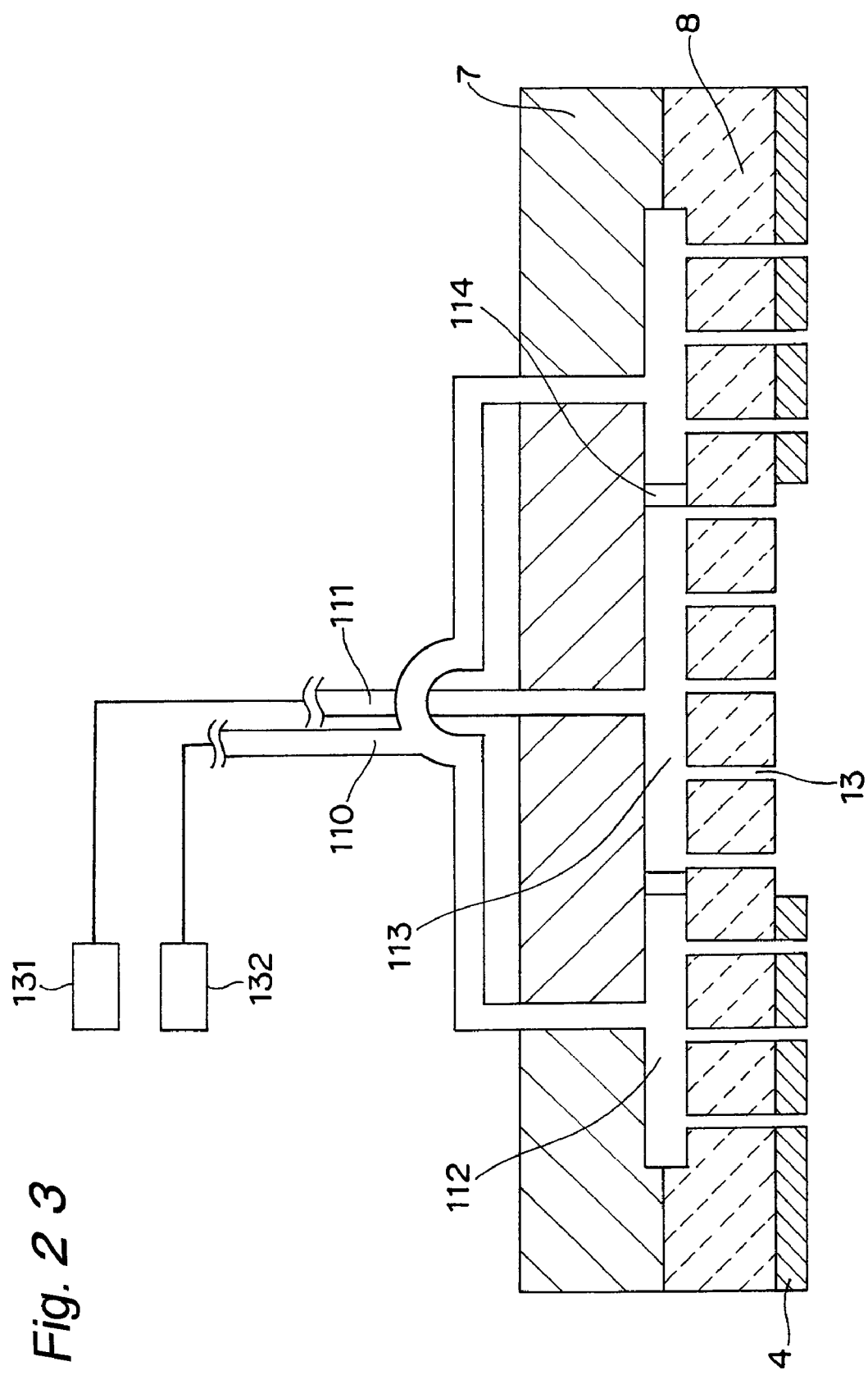

INJECTION DEPTH

SHEET RESISTANCE
(DOSE AMOUNT)

PLASMA DOPING APPARATUS AND METHOD, AND METHOD FOR MANUFACTURING SEMICONDUCTOR DEVICE

RELATED APPLICATIONS

This application is the U.S. National Phase under 35 U.S.C. §371 of International Application No. PCT/JP2008/003705, filed on Dec. 11, 2008, which in turn claims the benefit of Japanese Application No. 2007-339665, filed on Dec. 28, 2007, the disclosures of which Applications are incorporated by reference herein.

TECHNICAL FIELD

The present invention relates to a plasma doping apparatus and method, as well as a method for manufacturing a semiconductor device, and more particularly concerns a plasma doping apparatus and method used for introducing an impurity to a surface of a solid-state sample, such as a semiconductor substrate, and a method for manufacturing such a semiconductor device.

BACKGROUND ART

As a technique for introducing an impurity to a surface of a solid-state sample, a plasma doping method has been known in which an impurity is ionized and the ionized impurity is introduced to a solid-state material at low energy (for example, see Patent Document 1).

FIG. 24 shows a schematic structure of a plasma processing device used for a plasma doping method serving as a conventional impurity-introducing method described in Patent Document 1. In FIG. 24, a sample electrode 202 on which a sample 201 made of a silicon substrate is placed is provided in a vacuum container 200. A gas supply device 203 for supplying a doping material gas containing a desired element, such as $B_2H_6$, and a pump 204 for reducing the pressure of the inside of the vacuum container 200 are provided in the vacuum container 200 so that the inside of the vacuum container 200 can be maintained at a predetermined pressure. A microwave is projected into the vacuum container 200 through a quartz plate 206 serving as a dielectric window by a microwave waveguide tube 205. By an interaction between this microwave and a DC magnetic field formed by an electromagnet 207, a microwave plasma 208 with a magnetic field (electron cyclotron resonance plasma) is formed in the vacuum container 200. A high-frequency power supply 210 is connected to the sample electrode 202 with a capacitor 209 interposed therebetween so as to control the electric potential of the sample electrode 202. Here, a gas to be supplied from the gas supply device 203 is supplied into the vacuum container 200 through a gas blowing hole 211, and exhausted into the pump 204 from an exhaust outlet 212.

In the plasma processing device having this structure, the doping material gas, for example, $B_2H_6$, introduced from the gas blowing hole 211, is formed into plasma by a plasma generating means configured by the microwave waveguide tube 205 and the electromagnet 207 so that boron ions in the plasma 208 are introduced into the surface of the sample 201 by the high-frequency power supply 210.

After a metal wiring layer has been formed on the sample 201 to which an impurity is thus introduced, a thin oxide film is formed on the metal wiring layer in a predetermined oxidizing atmosphere, and a gate electrode is then formed on the sample 201 by a CVD device or the like so that, for example, an MOS transistor is obtained.

Patent Document 2 and Patent Document 6 have disclosed a technique in which a substance 223 containing an impurity is preliminarily adhered to an inner wall face of a vacuum container 222 of a dielectric window 221 of an ICP plasma device 220 as shown in FIG. 25, and by introducing a nitrogen, helium or argon gas into the vacuum container 222, a plasma is generated in the vacuum container 222 so that the impurity is introduced into a semiconductor.

In this method, the substance 223 containing an impurity, such as arsenic, phosphorus, or boron, is preliminarily adhered to an inner wall face of the dielectric window 221, and by forming a nitrogen, helium, or argon gas into a plasma inside the vacuum container 222, the substance 223 containing the impurity, adhered to the inner wall face of the dielectric window 221, is sputtered, and this is used as a material and introduced into the silicon substrate 224. Moreover, another method using the similar structure has been proposed in which a dielectric window having an inner wall to which a substance containing an impurity is preliminarily adhered is arranged in a helicon-wave plasma device or a magnetic neutral loop plasma device, in which, in place of a coil 225, an antenna and an electromagnet serving as a magnetic-field forming device are used, so that a plasma doping process is carried out.

Patent Document 3 has disclosed a plasma doping method that uses a plasma doping apparatus as shown in FIG. 26 to form an impurity-introduced layer on a substrate to be processed, and is provided with step (a) for preparing a vacuum container 230 having an inner wall on which a film 231 containing a first impurity has been formed; step (b) in which, after the step (a), the substrate 234 to be processed is placed on the sample base 232; step (c) in which, after the step (b), a plasma containing a second impurity is generated in the vacuum container 230 with high-frequency power being supplied to an electrode made from the sample base 232, so that the first impurity and the second impurity are introduced into the substrate 234 to be processed to form the impurity introducing layer. This method is a modified method obtained from those of Patent Document 1, Patent Document 2, and Patent Document 6, and is devised by newly taking it into account that, when a plasma doping process is carried out by using an ICP plasma device as shown in FIG. 25, a film containing an impurity is formed on the inner wall of the vacuum container during the process with a very large amount of the impurity being generated from the film. By utilizing this fact, Patent Document 3 has achieved superior in-plane uniformity and reproducibility of the dose amount that have not been obtained by a conventional plasma doping process by adjusting the sum of the amounts of the first impurity derived from the film containing the impurity, which has not been taken into account in the conventional plasma doping process, and the second impurity contained in plasma, which has been taken into account in the conventional plasma doping process.

Moreover, FIGS. 1, 5, and 6 of Patent Document 4 have proposed a sputtering electrode in which a target to be sputtered by plasma has a shape similar to an annular shape (a shape having a concave portion in the center), in a sputtering device as shown in FIG. 27.

Furthermore, in FIG. 12, Patent Document 5 has disclosed a device that supplies a gas from a micro-nozzle placed opposing to the substrate toward the substrate in a manner like a shower.

Patent Document 1: U.S. Pat. No. 4,912,065
Patent Document 2: JP-A No. 2004-047695

Patent Document 3: WO/2006/121131
Patent Document 4: JP-A No. 61-183467
Patent Document 5: JP-A No. 2005-5328
Patent Document 6: US. Patent Application A1 Laid-Open
No. 2004/0045507

DISCLOSURE OF INVENTION

Issues to be Solved by the Invention

However, in an attempt to introduce an impurity into a semiconductor by utilizing the conventional plasma doping apparatus and method as shown in Patent Documents 1 to 6, as well as by using a plasma doping method in which a parallel flat-plate device is used, an issue arises in which the depth profile of the impurity becomes non-uniform within the in-plane of the substrate.

That is, in the plasma doping process using the parallel flat-plate device, since a film containing an impurity is hardly formed on the side faces of the inner wall of the vacuum container during the process, the process stability is extremely improved. This is a common phenomenon also in a dry etching process using the parallel flat-plate device, and forms an advantage obtained when using the parallel flat-plate device. However, although no issue is raised on the uniformity within the in-plane of the substrate in the dry etching process using the parallel flat-plate device, a serious issue is raised on the uniformity in the case of the plasma doping process, that is, the injection depth of the impurity becomes non-uniform within the in-plane of the substrate, in other words, the uniformity in the injection depth of the impurity is not obtained with high precision within the in-plane of the substrate.

In view of the above-mentioned conventional issues, the present invention has been devised, and its objective is to provide a plasma doping apparatus and method and a method for manufacturing a semiconductor device that can make the injection depth of an impurity uniform within the in-plane of the substrate even when a parallel flat-plate device is used, without impairing the advantage of the parallel flat-plate device that since a film containing an impurity is hardly formed on side faces of the inner face of the vacuum container during the process, it is possible to obtain high stability in processes.

Means for Solving the Issues

In order to achieve the above-mentioned object, the present inventors have examined the reason that, when a conventional parallel flat-plate plasma device is applied to a plasma doping process, no uniformity with high precision in the injection depth is obtained within the in-plane of the substrate, and have obtained the following findings.

Here, the present inventors have examined so as to obtain the uniformity with high precision in a manufacturing process for forming a source-drain extension area of a silicon device, which is required, in particular, for the uniformity with high precision in the injection depth, and considered to be difficult to maintain the uniformity, as an applied device for plasma doping. With these examinations, issues, which have been conventionally difficult to expose, can be easily recognized.

FIGS. 28A to 28H are partial cross-sectional views that show processes for forming the source-drain extension area of a planer device with the use of plasma doping.

First, as shown in FIG. 28A, an SOI substrate, formed by pasting an n-type silicon layer 263 onto the surface of a silicon substrate 261 with an oxide silicon substrate 262 interposed therebetween, is prepared, and an oxide silicon film 264 is formed on the surface as a gate oxide film.

Moreover, as shown in FIG. 28B, a polycrystal silicon layer 265A used for forming a gate electrode 265 (see FIG. 28D) is formed on the oxide silicon film 264.

Next, as shown in FIG. 28C, a mask R is formed on the polycrystal silicon layer 265A by photolithography.

Thereafter, as shown in FIG. 28D, the polycrystal silicon layer 265A and the oxide silicon 264 are patterned by using the mask R so that the gate electrode 265 is formed on the oxide silicon film 264.

Moreover, as shown in FIG. 28E, by using the gate electrode 265 as a mask, boron is introduced by a plasma doping process so that a layer 266 of a shallow p-type impurity area is formed on the n-type silicon layer 263 so as to obtain a dose amount of about 1E15 cm$^{-2}$.

Thereafter, as shown in FIG. 28F, after an oxide silicon film 267 has been formed on the surface of the p-type impurity area layer 266, the upper face and side faces of the gate electrode 265, as well as on the side faces of the oxide silicon film 264, by an LPCVD (Law Pressure CVD) method, the oxide silicon 267 is etched by an anisotropic etching process so that, as shown in FIG. 28G, the oxide silicon film 267 is allowed to remain only on the side walls of the gate electrode 265.

By introducing ions by using the oxide silicon film 267 and the gate electrode 265 as masks, boron is introduced as shown in FIG. 28H so that a source-drain area made of a p-type impurity area layer 268 is formed. Then, this is subjected to a heating treatment so that boron ions are activated.

In this manner, a MOSFET in which a shallow p-type impurity area layer 266 is formed on the inside of the source-drain area made of the p-type impurity area layer 268 is formed.

At this time, during the process for forming the shallow p-type impurity area layer 266, a plasma doping process is carried out by using any one of the plasma devices and the like, selected from Patent Documents 1 to 6, shown in FIGS. 24 to 27.

By using the device as shown in FIG. 24 disclosed in Patent Document 1, a source-drain extension area was formed, and FIG. 29A shows the distribution of the injection depth within the in-plane of the substrate in the source-drain extension area, after the plasma doping process, and FIG. 29B shows the distribution of the sheet resistance within the in-plane of the substrate after the heating treatment, respectively. In the device of FIG. 24, a gas introducing pathway is placed only on one side (portion on the upper side of Figs, in FIGS. 29A and 29B), viewed from the substrate. Therefore, more dose amount is given to a portion (portion on the upper side of FIGS. 29A and 29B) near the gas introducing pathway within the in-plane of the substrate so that the injection depth is made deeper and the sheet resistance is lowered. In contrast, less dose amount is given to a portion (portion on the lower side of FIGS. 29A and 29B) far from the gas introducing pathway within the in-plane of the substrate so that the injection depth is made shallower and the sheet resistance is raised (since the dose amount and the sheet resistance have an inverse relationship, the relationship is hereinafter described by using only the sheet resistance without describing the dose amount. Moreover, since the diffusion depth after the heating treatment is represented by a distribution in which the injection depth is transferred, only the injection depth is described without describing the diffusion depth).

In this manner, in the device in which the gas introducing pathway is disposed only on one side, when viewed from the substrate, since the injection depth within the in-plane of the substrate is deep with the portion having a low sheet resistance being biased on one side, an issue arises in which the yield of the semiconductor device is extremely reduced.

Next, in the case where the device, as shown in FIG. 25 disclosed in Patent Document 2 and Patent Document 6, is used, distributions within the in-plane of the substrate of the injection depth of the layer of the source-drain extension area and the sheet resistance are respectively shown in FIGS. 30A and 30B. In this device and method, no disclosure that indicates that the gas contains an impurity is found, and the device is considered to be effective when the gas contains nitrogen, helium, or argon. Since the supply of boron into plasma is carried out symmetrically with respect to the center of the substrate, the uniformity of the dose amount of boron introduced into the substrate surface can be improved in comparison with the aforementioned Patent Document 1. However, since boron is supplied to the peripheral edge portion of the substrate only from the peripheral edge portion of a top plate although boron is supplied to the center portion of the substrate from the entire top plate, the injection depth is deep within the in-plane of the substrate with the result that a portion with a low sheet resistance is concentrated on the center portion. The resulting issue is that there is a reduction in the yield of the semiconductor device. Moreover, in the case where plasma doping processes are successively carried out a large number of silicon substrates 3, since the substance containing an impurity that has been adhered to the inner wall face of the dielectric window is reduced, the reproducibility is lowered. Moreover, a re-adhering process of the substrate containing an impurity has to be carried out regularly, resulting in another issue that the production efficiency is lowered.

Next, in the case where the device, as shown in FIG. 26 disclosed in Patent Document 3, is used, distributions within the in-plane of the substrate of the injection depth of the layer of the source-drain extension area and the sheet resistance thereof are respectively shown in FIGS. 31A and 31B. In the case where a plasma doping process is carried out by using an ICP plasma device as shown in FIG. 26, films containing an impurity are formed on the side walls (inner side) 230a of the vacuum container 230 and a top plate 235 during the process. Here, a gas containing an impurity is introduced into the vacuum chamber 230 through holes 236 having a shower shape, formed on the top plate 235. By forming the gas containing an impurity into a plasma so as to introduce the impurity contained in the plasma onto the substrate 234, as well as by sputtering the film containing the impurity, the impurity is also introduced onto the substrate 234 from the film. The first impurity from the film containing the impurity is introduced onto the substrate 234 respectively from the film formed on the top plate 235 and the film formed on the side walls 230a. Here, more impurity is introduced into the center portion of the substrate 234 from the film formed on the top plate 235, while more impurity is introduced onto the peripheral edge portion of the substrate 234 from the film formed on the side walls 230a. As a result, the first impurity from the films containing the impurity is more easily introduced to the substrate uniformly. Moreover, the second impurity contained in the plasma, which is derived from the gas containing the impurity, and has been conventionally taken into account, can be uniformly introduced onto the substrate 234 by using a conventional method, such as adjusting the distribution of the flow rate of a gas to be introduced into the vacuum container 230 through the holes 236 having a shower shape. Therefore, in accordance with Patent Document 3, as shown in FIGS. 31A and 31B, it was easy to make the injection depth and the sheet resistance uniform within the in-plane of the substrate. However, in this method, it is a premise that films containing impurities are formed on both of the side faces (inner side) 230a of the vacuum container 230 and the top plate 235. Since the rate of the amount of impurity occupied by those derived from the films containing impurities in the entire amount of impurity injection is too large to leave it out of consideration, it is essential in this method to stabilize both of the amount of injected impurity from the films containing an impurity formed on the side walls (inner side) 230a of the vacuum container 230 and the amount of injected impurity from the film containing an impurity formed on the top plate 235. Here, in dry etching or CVD, many methods have been proposed so as to manage the states (for example, thickness) of a deposit adhering to the top plate in a stable manner for a long period of time, for example, by removing the deposit to adhere to the top plate by using an etching gas with a bias voltage being applied to a gas-exciting electrode placed on the top plate.

However, an issue arises in which it is difficult to manage the thickness of a deposit (film containing an impurity) adhering to the side walls (inner side) 230a of the vacuum container 230. In an attempt to apply a bias voltage to the side walls (inner side) 230a of the vacuum container 230, a bias applying electrode, which is unnecessary from the viewpoint of plasma doping process, needs to be attached to a side wall of the device to cause the device itself to become bulky, and this is not so easy in comparison with managing the thickness of the deposit formed on the top plate. Moreover, even if no film containing an impurity is formed on a side wall (inner side) 230a of the vacuum container 230, another issue arises. That is, even in the case where, by allowing a film containing an impurity to preliminarily adhere to the top plate 235, not as a naturally formed film during the process, but as a film formed by using another method such as deposition, the film is formed only on the top plate 235, while no film containing an impurity being formed on the side wall (inner side) 230a of the vacuum container 230, a film containing the impurity is gradually formed on the side walls (inner side) 230a of the vacuum container 230 during the repetitive processes. The resulting issue is that, during the period until the end of the formation, it is difficult to obtain good reproducibility.

As described above, in Patent Document 3, although the injection depth and the sheet resistance can be uniformly maintained within the in-plane of the substrate, there is an issue that it becomes difficult to stably maintain the stability of the process for a long period of time due to the premise that a film containing an impurity, formed on the side walls (inner side) 230a of the vacuum container 230, needs to be utilized.

Moreover, FIGS. 1, 5, and 6 of Patent Document 4 have proposed a plate-magnetron-type sputtering device in which a target 260 has a shape similar to an annular shape (a shape having a concave portion in the center), as shown in FIG. 27. However, this device has no mechanism to apply a bias voltage to a sample. Therefore, since no impurity can be introduced into a semiconductor while a deposition layer can be formed thereon by allowing an impurity to adhere to the surface of the semiconductor, the resulting issue is that it is not possible to control the injection depth of the impurity in accordance with a device design. Moreover, there is no mechanism for introducing a gas containing an impurity into the vacuum container. The resulting issue is that it is not possible to control the dose amount of the impurity in accordance with a device design.

Here, the following description will discuss a difference of the present invention from a combination of Patent Documents 3 and 4, which is considered to be, in particular, close to the present invention among the aforementioned Patent Documents.

The target 260 having a shape similar to an annular shape, disclosed in Patent Document 4, is not provided with holes through which a process gas that is essential for generating a plasma is allowed to pass. In the case where the target 260 described in Patent Document 4 is attached to the top plate 235 of the device of FIG. 26 disclosed in Patent Document 3 (or to a nozzle of the device disclosed in Patent Document 5), since the target 260 has no holes through which a gas is allowed to pass, it is not possible to introduce a process gas into the vacuum container 230, resulting in an issue in that it becomes difficult to generate a plasma itself. From this point, even upon viewing Patent Document 3 and Patent Document 4, it is not easy for persons skilled in the art to simply combine these with each other. This is presumably because Patent Document 4 has no idea for allowing a gas to flow through the target 260.

Moreover, in Patent Document 4, a sputtering process is carried out from the target 260 containing no impurities, or hardly any impurities, to the substrate, so as to steadily deposit, in particular, concave/convex portions on the peripheral edge of a substrate; therefore, the target 260 is made larger than the substrate with a concave portion being formed in the center of the target 260, so that particles of the target 260 are allowed to jump from the center of the target 260 toward the substrate, while the particles of the target 260 are also allowed to jump from the peripheral edge portion of the target 260 toward the substrate, so as to subsequently form a uniform deposition layer on the substrate, and this technique is completely different from the doping technique. Although, by one glance, the cross-sectional shape of the target 260 seems to be similar to the cross-sectional shape of the film of an impurity of the top plate of the present invention, the functions thereof are completely different from each other.

Supposing that this simple idea has been obtained from Patent Document 2 and Patent Document 6, the following description will discuss a difference of the present invention from combinations of Patent Documents 2, 4, 5, and 6.

No reference about the parallel flat-plate device is found in Patent Documents 2, 3, 4, 5, and 6. Therefore, even in the case where holes through which a gas is allowed to flow, as described in Patent Documents 2 and 6, are formed in the target 260 described in Patent Document 4 so that, by positioning the holes formed through the target 260 to fit to the positions of holes 236 formed through the top plate 235 described in FIG. 26 of Patent Document 3 (or positions of nozzle holes of the device disclosed in Patent Document 5), the resulting target is placed on the device described in Patent Document 3 (or the device described in Patent Document 5), the following issues arise. That is, even when a film containing an impurity, as described above, is formed on the top plate 235, a film containing the impurity is gradually formed on side walls (inner side) 230a of the vacuum container 230 during the repetitive processes. The resulting issue is that, during the period until the end of the formation, it is difficult to obtain good reproducibility. Another issue is that it is difficult to manage the thickness of the deposition (film containing an impurity) to adhere to the side walls (inner side) 230a of the vacuum container 230. The subsequent issue is that it becomes difficult to stably maintain the stability of the process for a long period of time.

Based upon the above-mentioned findings, the present inventors have come to invent a plasma doping apparatus and a method for manufacturing a semiconductor device that make it possible to remarkably improve the uniformity of the injection depth and distribution of sheet resistance over the entire face of the substrate, and also to achieve stability for a long period of time.

In order to achieve the above-mentioned object, the present invention has the following structures.

According to a first aspect of the present invention, there is provided a parallel flat-plate plasma doping apparatus comprising:
a vacuum container;
a sample electrode that is placed in the vacuum container, and has a substrate-placing area on which a substrate is placed;
a high-frequency power supply for applying high-frequency power to the sample electrode;
an exhaust device for evacuating the vacuum container;
a gas supply device for supplying a gas containing an impurity into the vacuum container; and
a plasma generation mechanism for exciting the gas to generate a plasma,
the plasma doping apparatus further comprising:
a top plate disposed on an upper portion of the vacuum container so as to face the substrate-placing area of the sample electrode and provided with an impurity-containing film that contains the impurity, with the film being formed on a top plate peripheral edge portion area that is a face exposable to the plasma generated in the vacuum container and is located on a peripheral edge of a top plate center portion area that faces a center portion of the substrate-placing area of the sample electrode.

According to a second aspect of the present invention, there is provided the plasma doping apparatus according to the first aspect, wherein the film has an annular shape, and is not located on the top plate center portion area of the top plate, but located only on the top plate peripheral edge portion area of the top plate.

According to a third aspect of the present invention, there is provided the plasma doping apparatus according to the first aspect, wherein the film is located on the top plate center portion area and the top plate peripheral edge portion area of the top plate with a thickness thereof being made thicker on the top plate peripheral edge portion area than that on the top plate center portion area of the top plate.

According to a fourth aspect of the present invention, there is provided the plasma doping apparatus according to the first aspect, wherein the film is located on the top plate center portion area and the top plate peripheral edge portion area of the top plate, and the plasma doping apparatus comprises a plasma contact preventive layer being formed on the top plate center portion area of the top plate so as not to be made in contact with the plasma.

According to a fifth aspect of the present invention, there is provided the plasma doping apparatus according to any one of the first to fourth aspects, wherein the film has an outer diameter that is a same as, or larger than an outer diameter of the substrate-placing area of the sample electrode.

According to a sixth aspect of the present invention, there is provided the plasma doping apparatus according to any one of the first to fifth aspects, wherein the gas containing an impurity, to be supplied from the gas supply device is a gas containing $B_2H_6$ with $B_2H_6$ having a concentration in a range of from 0.01% by mass or more to 1.0% by mass or less.

According to a seventh aspect of the present invention, there is provided the plasma doping apparatus according to any one of the first to sixth aspects, wherein the impurity-containing film, located on the top plate peripheral edge portion area of the top plate, has an opening portion in a center portion with a size in a range of from 18 mm or more to 113 mm or less in radius from a center of the impurity-containing film.

According to an eighth aspect of the present invention, there is provided the plasma doping apparatus according to any one of the first to seventh aspects, wherein a through hole that is used for introducing a gas, and connected to the gas supply device is formed on the impurity-containing film so that the gas is supplied into the vacuum container from the gas supply device through the through hole.

According to a ninth aspect of the present invention, there is provided the plasma doping apparatus according to any one of the first to eighth aspects, further comprising:

a detection device for detecting information as to an applicable or inapplicable state of the impurity-containing film of the top plate; and a control unit that controls so as to carry out operations of: forming the impurity-containing film on the top plate peripheral edge portion area of the top plate in a state where no substrate is placed on the sample electrode; carrying out the plasma doping process in a state where the substrate is placed on the sample electrode after the formation of the impurity-containing film; and comparing a value of the information as to an applicable or inapplicable state of the impurity-containing film detected by the detecting device after the plasma doping process with a reference value so that, if the value is the reference value or less, the plasma doping process is again carried out, and if the value exceeds the reference value, a process for removing the impurity-containing film from the top plate center portion area of the top plate is carried out.

According to a 10th aspect of the present invention, there is provided a plasma doping method comprising:

placing a substrate on a substrate-placing area of a sample electrode placed in a vacuum container; and evacuating the vacuum container by using an exhausting device, while supplying a gas containing an impurity into the vacuum container from a gas supply device with a high-frequency power being applied to the sample electrode from a high-frequency power supply, while the gas is being excited by a plasma generation mechanism to generate a plasma, so that a plasma doping process is carried out, the method further comprising, by the plasma generated between the top plate and the substrate of the sample electrode, introducing the impurity in the gas supplied into the vacuum chamber from the gas supply device, and an impurity, contained in an impurity-containing film that is formed on a top plate peripheral edge portion area that is a face exposable to the plasma generated in the vacuum container of a top plate disposed on an upper portion of the vacuum container so as to face the substrate-placing area of the sample electrode, and is located on a peripheral edge of a top plate center portion area that faces a center portion of the substrate-placing area of the sample electrode, into the substrate placed on the substrate-placing area of the sample electrode.

According to an 11th aspect of the present invention, there is provided the plasma doping method according to the 10th aspect, wherein, to the center portion area of the substrate facing the top plate center portion area of the top plate, the impurity in the gas supplied into the vacuum container is mainly introduced, while, to the peripheral edge portion area of the substrate facing the top plate peripheral edge portion area of the top plate, the impurity in the gas supplied into the vacuum container and the impurity, derived from the impurity-containing film that is located in the top plate peripheral edge portion area of the top plate and has an annular shape, are introduced.

According to a 12th aspect of the present invention, there is provided the plasma doping method according to the 10th or 11th aspect, wherein the gas containing an impurity, to be supplied from the gas supply device is a gas containing $B_2H_6$, with $B_2H_6$ having a concentration in a range of from 0.01% by mass or more to 1.0% by mass or less.

According to a 13th aspect of the present invention, there is provided a method for manufacturing a semiconductor device by carrying out the plasma doping process by use of the plasma doping method according to any one of the 10th to 12th aspects.

EFFECTS OF THE INVENTION

In accordance with the present invention, it becomes possible to provide a plasma doping apparatus and method and a method for manufacturing a semiconductor device that can particularly improve the uniformity within the in-plane of the substrate of the injection depth and distribution of sheet resistance over the entire face of the substrate, and also achieve stability for a long period of time.

BRIEF DESCRIPTION OF DRAWINGS

These and other aspects and features of the present invention will become clear from the following description taken in conjunction with the preferred embodiments thereof with reference to the accompanying drawings, in which:

FIG. 16B is an explanatory view that shows the injection depth of boron in the case where molecules containing boron that are derived from decomposed $B_2H_6$ in a plasma and molecules containing boron that are sputtered out of a boron-containing film by the plasma are uniformly introduced into the surface of a substrate in a working example as one example of the embodiment;

FIG. 17 is a partial cross-sectional view showing a parallel flat-plate plasma doping apparatus in which the center portion and the peripheral edge portion of a top plate are made from materials different from each other in a third embodiment of the present invention;

FIG. 22C is a table that shows actual examples of the relationship between the substrate and the top plate;

FIG. 23 is a partially enlarged cross-sectional view showing a parallel flat-plate plasma doping apparatus relating to a modified embodiment of the present invention in which two gas supplying systems are installed;

BEST MODE FOR CARRYING OUT THE INVENTION

Referring to drawings, the following description will discuss embodiments of the present invention in detail.

First Embodiment

Figure 1:
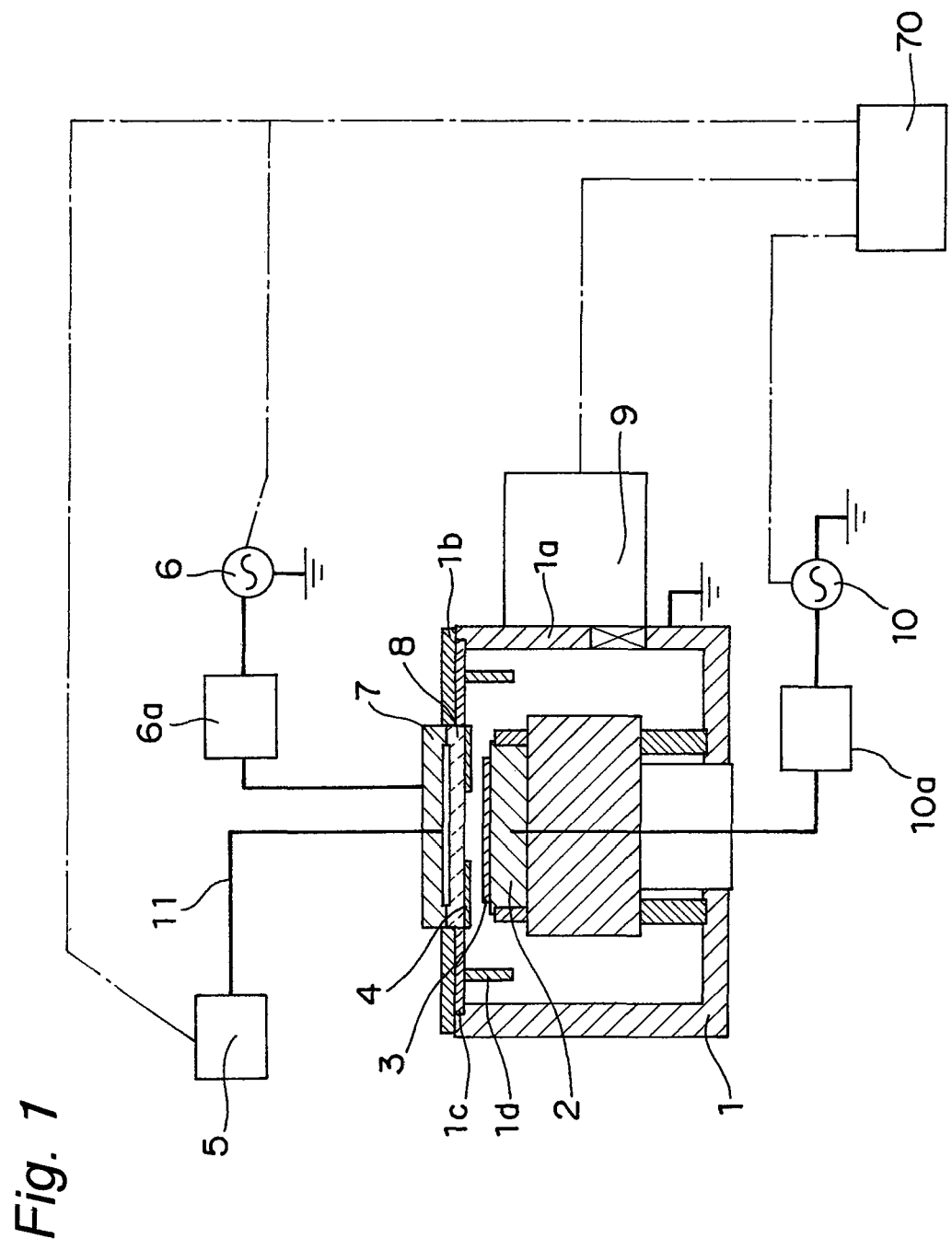
FIG. 1 is a partial cross-sectional view showing a parallel flat-plate plasma doping apparatus that functions as one example of a plasma doping apparatus in accordance with a first embodiment of the present invention, and is provided with a top plate on which an annular boron-containing film is formed.
Figure 2:
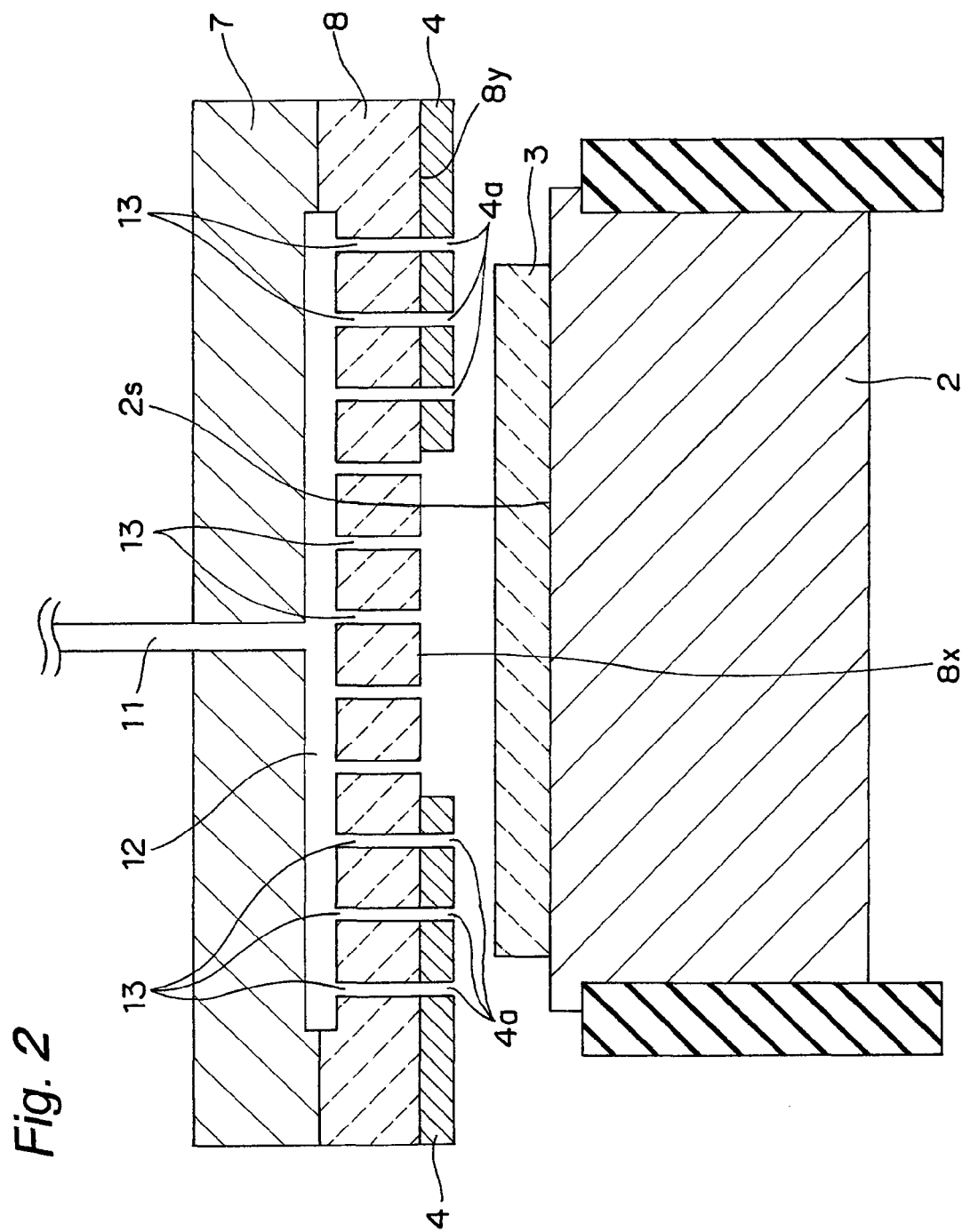
FIG. 2 is a partially enlarged cross-sectional view that shows the structures of the top plate and boron-containing film of the parallel flat-plate plasma doping apparatus of FIG. 1 in detail.

Referring to FIGS. 1 and 2, the following description will discuss features of a parallel flat-plate plasma doping apparatus that is provided with a top plate on which a film that contains an impurity and has an annular shape is formed, and serves as one example of a plasma doping apparatus in accordance with a first embodiment of the present invention, and the results of a plasma doping process using such a device.

In the first embodiment, processes are explained in which in a case where a film (boron-containing film) 4 containing boron serving as one example of a film containing an impurity and $B_2H_6$ diluted with He serving as one example of a plasma-doping gas are used, boron is introduced onto a round-shaped silicon substrate 3 serving as one example of a substrate, by using a plasma doping apparatus and method according to the first embodiment of the present invention.

FIG. 1 is a partial cross-sectional view showing a parallel flat-plate plasma doping apparatus provided with a top plate 8 on which an annular boron-containing film 4 is formed. A sample electrode 2 on which a silicon substrate 3 is to be placed is arranged in a vacuum container 1 that is earthed. A gas supply device 5 and a gas supply pipe 11 that are used for diluting $B_2H_6$ with He so as to supply the resulting gas into the vacuum container 1, and a pump 9 serving as one example of an exhausting device for pressure-reducing the inside of the vacuum container 1 are installed on a side face 1a of the vacuum container 1 so that the inside of the vacuum container 1 can be kept at a predetermined pressure. By supplying electric power to an antenna 7 disposed on a ceiling portion 1b of the vacuum container 1 from a gas-exciting high-frequency power supply 6 through a matching box 6a, a gas is excited so that a plasma is generated between a top plate 8, placed in the vacuum container 1 below the antenna 7 of the ceiling portion 1b of the vacuum container 1, and the sample electrode 2 placed in a manner so as to oppose the top plate 8. The antenna 7, the gas-exciting high-frequency power supply 6, and the like are allowed to form a plasma generating mechanism. A high-frequency power supply 10 is connected to the sample electrode 2 through a matching box 10a so as to control the electric potential of the sample electrode 2. Note that reference numeral 1c represents an insulating cover for use in preventing deposits from accumulating on the inner face of the ceiling portion 1b of the vacuum container 1, and reference numeral 1d represents an inner cover for use in preventing deposits from accumulating on the side walls 1a of the vacuum container 1. Reference numeral 70 represents a control unit that controls a plasma doping operation, and is connected to the gas supply device 5, the high-frequency power supply 6, the pump 9, and the high-frequency power supply 10 so as to control the operations of the respective devices.

Note that the gap between the top plate 8 and the sample electrode 2 is set to, for example, 1 cm to 10 cm. In the case where the gap is less than 1 cm, an issue arises in which a plasma is hardly generated. In the case where the gap exceeds 10 cm, an issue arises in which the plasma is easily subjected to influences from side faces of the vacuum container 1. Thus, by setting the gap to an interval of from 1 cm to 10 cm, it is possible to obtain the effect that a plasma is easily generated without being influenced by the side walls.

Although not shown in the Figures, the upper electrode configured by the antennas 35a, 35b and the top plate 8 and the vacuum container 1 are electrically insulated from each other.

FIG. 2 is a partial cross-sectional view that shows structures of the top plate 8 and the boron-containing film 4 in detail. The top plate 8 is formed by, for example, silicon. A boron-containing film 4, used for introducing boron into the round-shaped silicon substrate 3 serving as one example of the substrate, is formed on the inner face side of the vacuum container 1 of the top plate with an annular shape. The thickness of the boron-containing film 4 is preferably set to 100 μm or less since, when it is too thick, the film might drop onto the substrate 3 from the top plate 8. For example, the thickness of the boron-containing film 4 is set in a range of from 5 μm to several ten μms. Here, $B_2H_6$ is diluted with He, and the resulting gas is introduced into a gas chamber 12 that corresponds to a space placed between the antenna 7 and the top plate 8 through a gas supply pipe 11. A large number of gas introducing holes (gas supply holes) 13 are formed through the top plate 8 so as to allow the gas chamber 12 to communicate with an opening of the inner face of the top plate 8 on the vacuum container 1. Moreover, gas-introducing through holes 4a are formed through the boron-containing film 4 so as to allow $B_2H_6$ and He flowing from the gas chamber 12 to the gas-introducing through holes 13 to pass and flow into the vacuum container 1. Here, $B_2H_6$ and He, thus introduced into the gas chamber 12, are introduced into the vacuum container 1 through the gas introducing holes 13 and the through holes 4a. The boron-containing film 4 is formed on an inner face of the top plate 8 on the vacuum container 1 corresponding to a face to be exposed to plasma generated in the vacuum container 1 (for example, a lower face of the top plate 8), that is, top-plate peripheral edge area 8y at the peripheral edge of a top plate center portion area 8x that faces the center portion of a substrate placing area 2s of the sample electrode 2 with an annular shape (for example, a round ring shape).

Note that the top plate 8 and the sample electrode 2 have sizes larger than that of the substrate 3, and are formed into a round shape, or a quadrilateral shape, such as a square shape and a rectangular shape. Among these, the top plate 8 and the sample electrode 2 are desirably formed into round shapes. In the case where the top plate 8 and the sample electrode 2 are formed into square shapes or rectangular shapes, an anisotropic property is always exerted at each of the corners of the square shape or the rectangular shape, when viewed from the substrate center portion, with the result that it becomes difficult to obtain uniformity in the dose amount and injection depth. In contrast, in the case where the top plate 8 and the sample electrode 2 are formed into round shapes, since all the portions are made equal to one another, when viewed from the substrate center portion, no anisotropic property is exerted, and it becomes possible to easily obtain uniformity in the dose amount and injection depth.

Specific device and method for forming the annular boron-containing film 4 on the inner face of the top plate 8 on the vacuum container 1 will be described later, and the following description will discuss a method for carrying out a plasma doping process by using the parallel flat-plate plasma doping apparatus in which the annular boron-containing film 4 is formed on the inner face of the top plate 8 on the vacuum container 1, and the results of the plasma doping process.

After an annular boron-containing film 4 has been formed on the inner face of the top plate 8 on the vacuum container 1, a silicon substrate 3 is carried into the vacuum container 1, and placed on the sample electrode 2, by using a known means. The vacuum container 1 is pressure-reduced by a pump 9, and maintained at a predetermined pressure, while $B_2H_6$ diluted with He is being introduced into the vacuum container 1 from the gas supply device 5. Here, the concentration of $B_2H_6$ serving as a plasma doping gas to be introduced into the vacuum container 1 is, for example, set to 1% by mass.

Next, by supplying electric power (source power) to the antenna 7 from the high-frequency power supply 6, $B_2H_6$ is excited so that a plasma is generated between the top plate 8 and the silicon substrate 3 in the vacuum container 1.

Next, an application of a bias voltage is started from the high-frequency power supply 10 to the silicon substrate 3 through the sample electrode 2. Thus, boron is introduced into the silicon substrate 3. Here, upon introducing boron, for example, the following conditions are set: The pressure of the vacuum container 1 is 0.6 Pa, the source power of the high-frequency power supply 6 is 500 W, the bias voltage (Vpp) of the high-frequency power supply 10 is 200 V, the substrate temperature of the silicon substrate 3 is 20° C. and the doping time of boron during which the bias voltage is applied is set to 30 seconds.

At this time, boron is introduced into the silicon substrate 3 not only from $B_2H_6$, but also from the annular boron-containing film 4.

Figure 3:
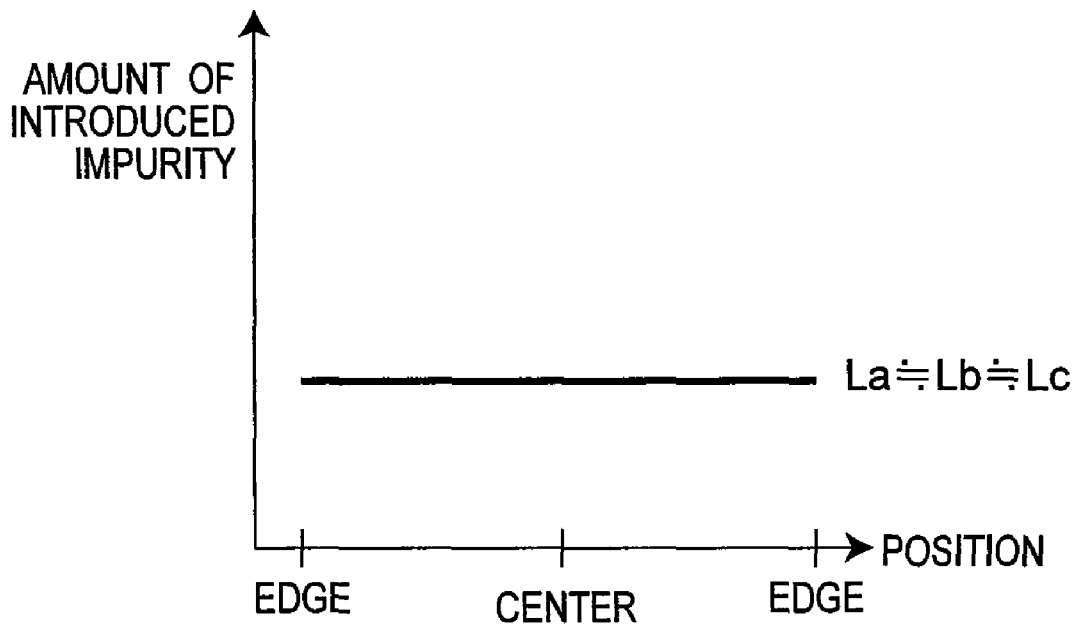
FIG. 3 is a graph that indicates a relationship between the position on the surface of a silicon substrate and the amount of boron introduced onto the silicon substrate due to the annular boron-containing film, in the parallel flat-plate plasma doping apparatus of FIG. 1.
Figure 4:
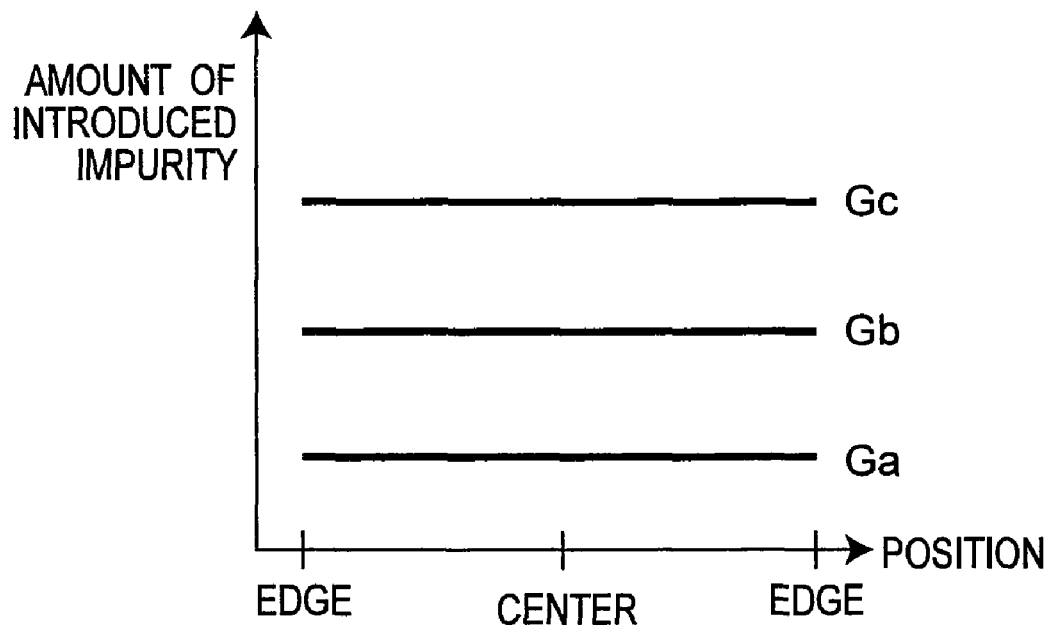
FIG. 4 is a graph that indicates the position on the surface of a silicon substrate and the dose amount of boron introduced onto the silicon substrate due to $B_2H_6$, in the parallel flat-plate plasma doping apparatus of FIG. 1.

Here, referring to FIGS. 3 and 4, the following description will discuss the amount of boron derived from the annular boron-containing film 4 that is a solid-state film containing boron, and introduced into the silicon substrate 3, and the amount of boron derived from $B_2H_6$ that is a gas containing boron, and introduced into the silicon substrate 3.

FIG. 3 is a graph that shows the relationship between the position on the surface of the silicon substrate 3 and the amount of boron (amount of introduced impurity) derived from the annular boron-containing film 4 and introduced into the silicon substrate 3. The amount of introduced boron derived from the annular boron-containing film 4 is made virtually uniform within the in-plane of the silicon substrate 3. This is a particular effect obtained by the fact that the boron-containing film 4 is formed into an annular shape. Moreover, in the case where the concentration of $B_2H_6$ is varied to a, b, and c (a<b<c) within a range of from 0.01% by mass or more to 1.0% by mass or less described later, supposing that the amount of introduced boron from the annular boron-containing film 4 at the gas concentration of a is La, that the amount of introduced boron from the annular boron-containing film 4 at the gas concentration of b is Lb, and the amount of introduced boron from the annular boron-containing film at the gas concentration of b is Lc, La≅Lb≅Lc is satisfied. That is, as shown in FIG. 3, independent of the concentration of $B_2H_6$, the relationship between the position on the surface of the silicon substrate 3 and the amount of boron (amount of introduced impurity) derived from the annular boron-containing film 4 and introduced into the silicon substrate 3 is indicated by a single straight line virtually in parallel with the axis of abscissas. Therefore, the amount of introduced boron from the annular boron-containing film 4 can be made constant within a permissible range in practical use independent of the concentration of $B_2H_6$. Note that the range in which the concentration of $B_2H_6$ is varied is preferably set in a range of from 0.01% by mass or more in $B_2H_6$ concentration to 1.0% by mass or less therein. The reason for this is explained as follows. In the case where $B_2H_6$ is diluted with He into 1.0% by mass or less, which is a low concentration, since the quantities of B radicals, B ions, hydrogen radicals, and hydrogen ions are extremely small in comparison with He radicals and He ions, main factors that sputter the annular boron-containing film 4 to release boron from the annular boron-containing film 4 correspond to He radicals and He ions in the plasma. Therefore, when diluted to such a low concentration, there is no large difference between the quantities of He radicals and He ions forming the main factors even if the concentration of $B_2H_6$ is different, with the result that the amount of boron derived from the annular boron-containing film 4 and introduced into the silicon substrate is made constant within a permissible range in practical use. However, in the case where the concentration of $B_2H_6$ is less than 0.01% by mass, since the amount of introduced boron derived from $B_2H_6$ becomes extremely small, it becomes difficult to obtain a desired dose amount. For this reason, the concentration of $B_2H_6$ is desirably set to 0.01% by mass or more. Moreover, in the case where the concentration of $B_2H_6$ is more than 1.0% by mass with respect to the factors for sputtering the annular boron-containing film 4 to release boron therefrom, in addition to He ions and He radicals, it is not possible to ignore B ions, B radicals, H ions, He radicals, and the like derived from $B_2H_6$. Therefore, when the concentration of $B_2H_6$ is made too high, a difference occurs in the amount of introduced boron derived from the annular boron-containing film 4 and introduced into the silicon substrate 3 when changing the setting of $B_2H_6$ concentration. For this reason, it becomes difficult to adjust the dose amount. Therefore, the range in which the concentration of $B_2H_6$ is varied is preferably set in a range of from 0.01% by mass or more to 1.0% by mass or less.

FIG. 4 is a graph that shows the relationship between the position on the surface of the silicon substrate 3 and the dose amount of boron (amount of introduced impurity) derived from $B_2H_6$ and introduced into the silicon substrate 3. With respect to the dose amount from $B_2H_6$, the amount of supply of $B_2H_6$ or the layout, the number, and the like of the introducing holes 13 are designed so that the amount of introduced boron derived from $B_2H_6$ is made uniform within the in-plane of the silicon substrate 3.

Moreover, among the cases in which the concentration of $B_2H_6$ is varied to a, b, and c (a<b<c) as described earlier, supposing that the amount of introduced boron derived from $B_2H_6$ at the gas concentration of a is Ga, that the amount of introduced boron derived from $B_2H_6$ at the gas concentration of b is Gb and the amount of introduced boron derived from $B_2H_6$ at the gas concentration of b is Gc, Ga<Gb<Gc is satisfied so that, by changing the gas concentration, it becomes possible to control the amount of injected boron derived from $B_2H_6$ and introduced into the silicon substrate 3.

Figure 5:
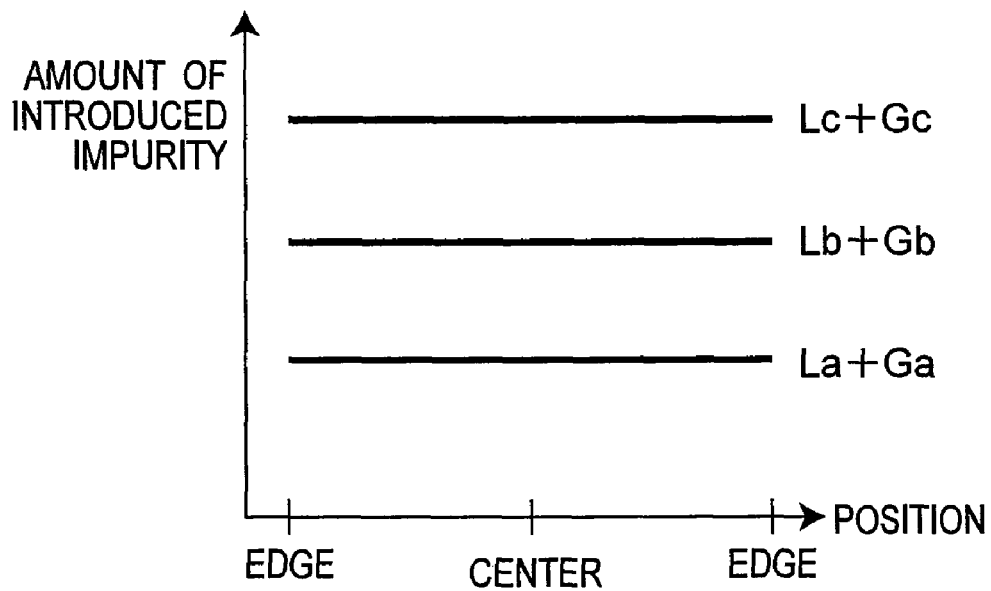
FIG. 5 is a graph that indicates the position on the surface of a silicon substrate and the dose amount of boron introduced onto the silicon substrate, in the parallel flat-plate plasma doping apparatus of FIG. 1.

FIG. 5 is a graph that shows the position on the surface of the silicon substrate 3 and the dose amount of boron (amount of introduced impurity) to be introduced into the silicon substrate 3 in the first embodiment. As described above, in the first embodiment, boron is introduced into the silicon substrate 3 not only from $B_2H_6$, but also from the annular boron-containing film 4 formed on the inner face of the top plate 8 on the vacuum container 1. That is, dose amounts of boron to be introduced into the silicon substrate 3 by respective plasma doping processes with the gas concentration a, the gas concentration b, and the gas concentration c correspond to sums of values La+Ga, Lb+Gb, and Lc+Gc, obtained by adding the amounts of introduced boron from the annular boron-containing film 4, La, Lb, and Lc to the amounts of introduced boron from $B_2H_6$, Ga, Gb, and Gc. Here with the effects that the amount of introduced boron from the annular boron-containing film 4 and the amount of introduced boron from $B_2H_6$ can be respectively uniformly adjusted within the in-plane of the silicon substrate 3, the dose amount of boron to be introduced into the silicon substrate 3 by the plasma doping process of the first embodiment is made uniform within the in-plane of the silicon substrate 3.

Figure 6:
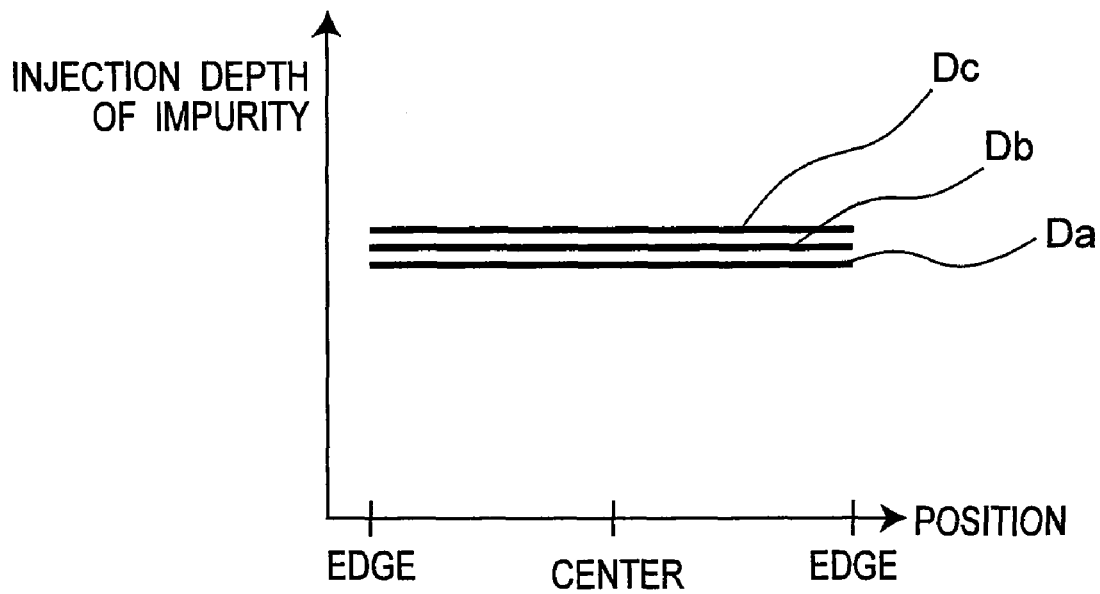
FIG. 6 is a graph that indicates a relationship between the position on the surface of a silicon substrate and the injection depth of boron introduced onto the silicon substrate, in the parallel flat-plate plasma doping apparatus of FIG. 1.

Referring to FIG. 6, the following description will discuss the injection depth of boron.

Since the amount of supply of $B_2H_6$ or the layout, the number, and the like of the introducing holes 13 are designed so that the distribution of boron ions derived from $B_2H_6$ is made uniform in a plasma, the injection depth (injection depth of impurities) of boron derived from $B_2H_6$ is uniformly kept within the in-plane of the silicon substrate 3. Moreover, with the effect that the boron-containing film 4 is formed into an annular shape so that the amount of introduced boron from the annular boron-containing film 4 can be uniformly adjusted within the in-plane of the silicon substrate, the injection depth of boron derived from the annular boron-containing film 4 is uniformly kept within the in-plane of the silicon substrate 3. With these arrangements, in the cases of the gas concentration a, gas concentration b, and gas concentration c, the respective boron injection depths Da, Db, and Dc in the first embodiment can be uniformly adjusted within the in-plane of the silicon substrate. That is, in order to make uniform the distribution of the injection depths of boron within the in-plane of the silicon substrate 3, the amount of introduced boron derived from $B_2H_6$ and the amount of introduced boron derived from the boron-containing film 4 need to be respectively made uniform within the in-plane of the substrate, and for this reason, it is essential to form the boron-containing film 4 into an annular shape.

In accordance with the first embodiment, the top plate 8 having the boron-containing film 4 is used as an inner face of the top plate 8 on the vacuum container 1 corresponding to a face to be exposed to plasma generated in the vacuum container 1 (for example, a lower face of the top plate 8), that is, a top-plate peripheral edge portion area 8y of a top plate center portion area 8x that faces the center portion of a substrate placing area 2s of the sample electrode 2. As a result, the amount of introduced boron derived from the annular boron-containing film 4 is made virtually uniform within the in-plane of the silicon substrate 3, and the resulting remarkable effect in practical use is that not only the dose amount of boron to be introduced into the silicon substrate 3, but also the injection depth thereof can be made uniform within the in-plane of the silicon substrate 3.

Second Embodiment

Figure 7:
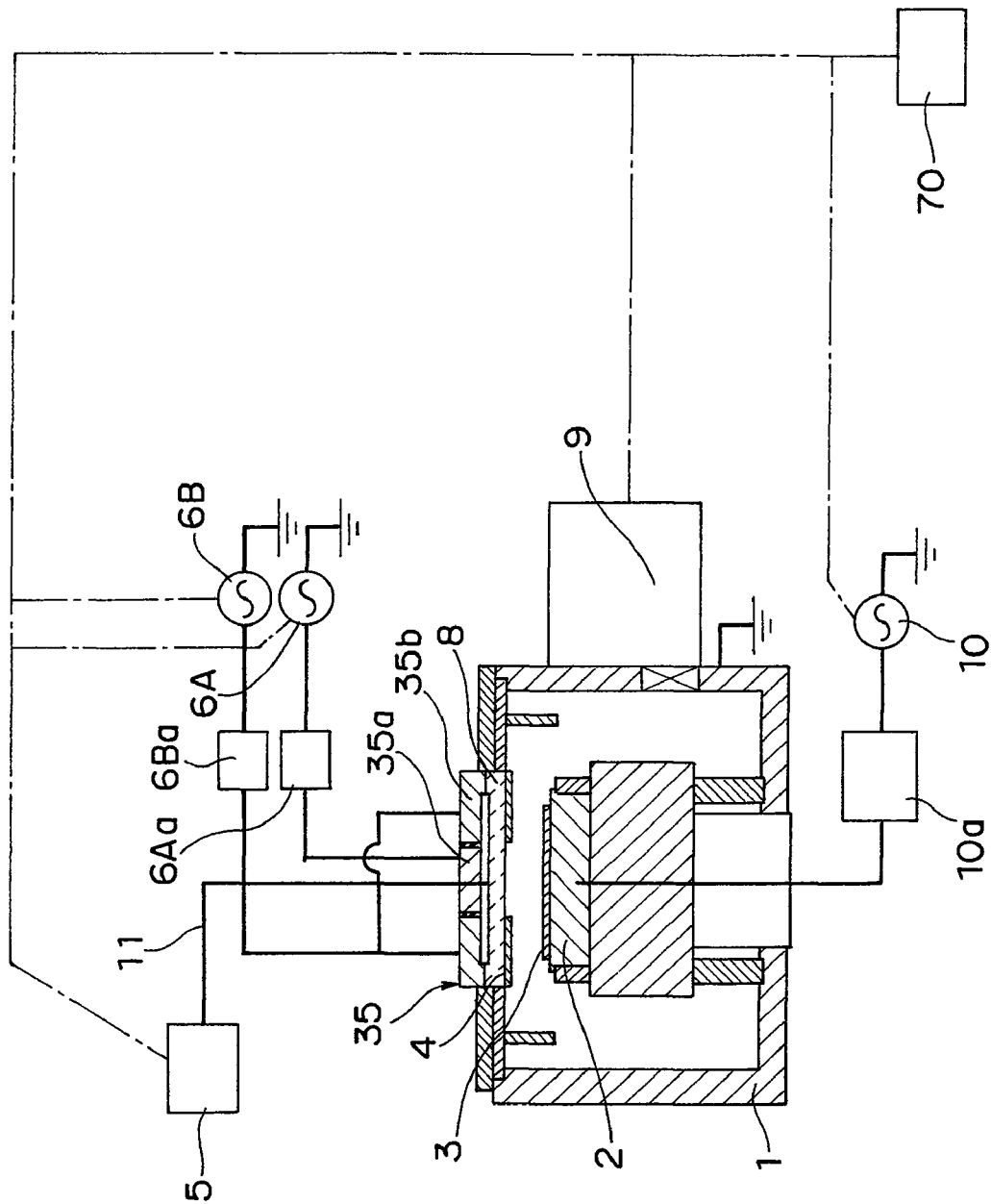
FIG. 7 is a partial cross-sectional view that shows a parallel flat-plate plasma doping apparatus in which power and frequency can be changed depending on the center portion and the peripheral edge portion of an antenna, in accordance with the parallel flat-plate plasma doping apparatus of a second embodiment of the present invention.
Figure 8:
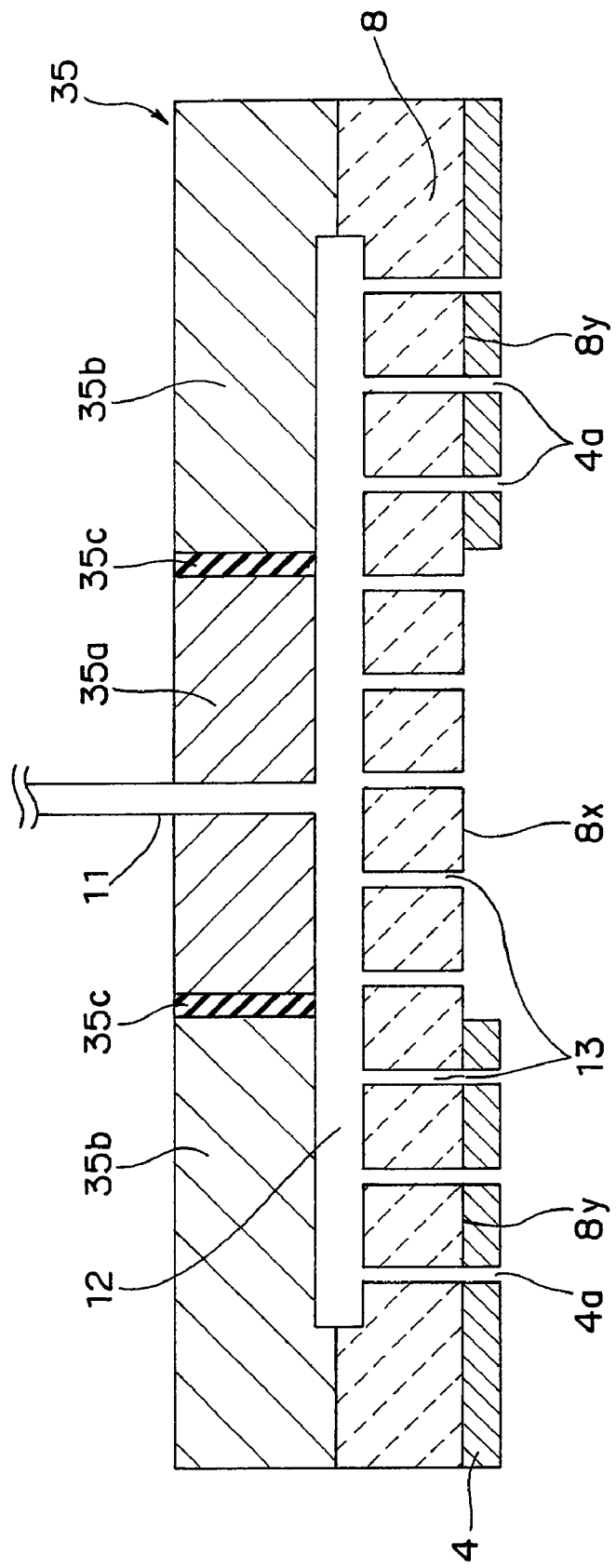
FIG. 8 is a partially enlarged cross-sectional view that shows structures of the antenna, top plate, and boron-containing film in the parallel flat-plate plasma doping apparatus of FIG. 7 in detail.

Referring to FIGS. 7 and 8, the following description will discuss features of a parallel flat-plate plasma doping apparatus provided with an antenna 35 that can change electric power or a frequency to be applicable between its center portion 35a and peripheral edge portion 35b serving as one example of a plasma doping apparatus in accordance with a second embodiment of the present invention, and explain a method for forming an annular boron-containing film 4 by using this device (first process PA and second process PB) and a plasma doping method (third process PC) using such a structure, as well as the results of this method. Those members and portions that are the same as those explained in the first embodiment are indicated by the same reference numerals.

In the second embodiment, after explaining the method for forming an annular boron-containing film 4 by using the parallel flat-plate plasma doping apparatus (first process PA and second process PB), the third process PC will be explained in which, by using the parallel flat-plate plasma doping apparatus, the boron-containing film 4 serving as one example of a film containing impurities and $B_2H_6$ diluted by He serving as one example of a plasma doping gas are used so that boron is introduced into the silicon substrate 3 in accordance with the second embodiment of the present invention.

FIG. 7 is a partial cross-sectional view showing a parallel flat-plate plasma doping apparatus provided with an antenna 35 that can change electric power or a frequency to be applicable between its center portion 35a and its peripheral edge portion 35b. A ring-shaped insulating portion 35c is placed between the round-shaped center portion 35a and the annular peripheral edge portion 35b of the antenna 35. A sample electrode 2 on which the silicon substrate 3 is placed is arranged in the vacuum container 1 that is earthed. The silicon substrate 3 is not placed on the sample electrode 2 in the first process PA and the second process PB, which will be described later with no potential being applied to the sample electrode 2 by the high-frequency power supply 10. A gas supply device 5 and a gas supply pipe 11 used for diluting $B_2H_6$ with He so as to supply the resulting gas into the vacuum container 1, and a pump 9 for pressure-reducing the inside of the vacuum container 1 are installed in the vacuum container 1 so that the inside of the vacuum container 1 can be kept at a predetermined pressure. The antenna 35 to which electric power to be used for generating a plasma is supplied is divided into an antenna 35a in the center portion and an antenna 35b on the peripheral edge portion, and placed with a ring-shaped insulating portion 35c being sandwiched in between. A high-frequency power supply 6A. for use in the center portion is connected to the antenna 35a in the center portion through a matching box 6Aa, and a high-frequency power supply 6B for used in the peripheral edge portion is connected to the antenna 35b on the peripheral edge portion through a matching box 6Ba so that electric power or a frequency to be applied to the antenna 35a in the center portion and the antenna 35b on the peripheral edge portion can be controlled respectively in an independent manner between the high-frequency power supplies 6A and 6B. Here, by changing the electric power or the frequency to be supplied to the antenna 35a in the center portion and the antenna 35b on the peripheral edge portion, voltages to be applied to the center portion 8x (corresponding to the top plate center portion area) and the peripheral edge portion By (corresponding to the top plate peripheral edge portion area) of the top plate 8 can be made different from each other. By supplying electric powers to the antenna 35a in the center portion and the antenna 35b on the peripheral edge portion, $B_2H_6$ is excited so that a plasma is generated between the top plate 8 and the sample electrode 2 in the vacuum container 1. A plasma generating mechanism is configured by the antennas 35a and 35b, the gas-exciting high-frequency power supplies 6A and 6B, and the like. A high-frequency power supply 10 is connected to the sample electrode 2 through the matching box 10a so that the electric potential of the sample electrode 2 is controlled during a plasma doping operation in the third process PC. Although not shown in the Figures, the upper electrode configured by the antennas 35a, 35b and the top plate 8, and the vacuum container 1 are electrically insulated from each other.

FIG. 8 is a partial cross-sectional view that shows detail structures of the antennas 35a and 35b in the center portion and on the peripheral edge portion, the top plate 8, and the boron-containing film 4. The top plate 8 is formed, for example, by silicon. On the inner face of the top plate 8 on the vacuum chamber 1, after a boron-containing film 300 has been formed on the entire surface thereof in the first process PA to be described later, an annular film 4 is formed from this entire surface film 300 in the second process PB, and the annular film 4 is used for a plasma doping operation in the third process PC. Here, $B_2H_6$ and He are introduced into a gas chamber 12 that corresponds to a space placed between the antenna 35a in the center portion as well as the antenna 35b on the peripheral edge portion and the top plate 8 through the gas supply pipe 11. A large number of gas introducing holes 13 are formed through the top plate 8 so as to connect the gas chamber 12 to an opening of the inner face of the top plate 8 on the vacuum container 1. Moreover, through holes 300b and 4a are formed through boron-containing films 300 and 4 so as to allow $B_2H_6$ and He flowing from the gas chamber 12 to the gas-introducing holes 13 to pass and flow into the vacuum container 1. Here, $B_2H_6$ and He, thus introduced into the gas chamber 12, are introduced into the vacuum container 1 through the gas introducing holes 13 and the through holes 300b and 4a. The entire surface film 300 is formed on the entire inner face of the top plate 8 on the vacuum container 1. That is, the entire surface film 300 is formed on all the top plate center portion area 8x corresponding to the position of the antenna 35a in the center portion and the top plate peripheral edge portion area 8y corresponding to the position of the antenna 35b on the peripheral edge portion, that is, faces to be exposed to plasma generated in the vacuum container 1 (for example, a lower face of the top plate 8). Moreover, the annular film 4 is formed with an annular shape (for example, a round ring-shape) only on the top plate peripheral edge portion area 8y on the periphery of the top plate center portion area 8x, that is, on an inner face of the top plate 8 on the vacuum container 1, corresponding to a face to be exposed to plasma generated in the vacuum container 1 (for example, a lower face of the top plate 8).

Moreover, a control unit 70 that controls plasma doping operation is installed, and the control unit is connected to the gas supply device 5, the high-frequency power supply 6, the pump 9, and the high-frequency power supply 10 so that the operations of the respective devices are controlled by the control unit 70.

In the device structure of the second embodiment, in the case where, after the annular boron containing film 4 has been formed on the inner face of the top plate 8 on the vacuum container 1 in the second process PB, the plasma doping operation is carried out in the third process PC, it is possible to obtain the remarkable effect in practical use that not only the dose amount of boron to be introduced into the silicon substrate 3, but also the injection depth thereof can be made uniform within the in-plane of the silicon substrate 3, in the same manner as in the first embodiment.

The following description will discuss a method for forming the annular boron-containing film 4 (first process PA and second process PB) by using the parallel flat-plate plasma doping apparatus provided with the antenna 35 capable of changing electric power or a frequency to be applicable between the center portion 8x and peripheral edge portion By of the top plate 8 and specific operations of the method (third process PC) for carrying out the plasma doping operation, in the second embodiment.

Figure 9A:
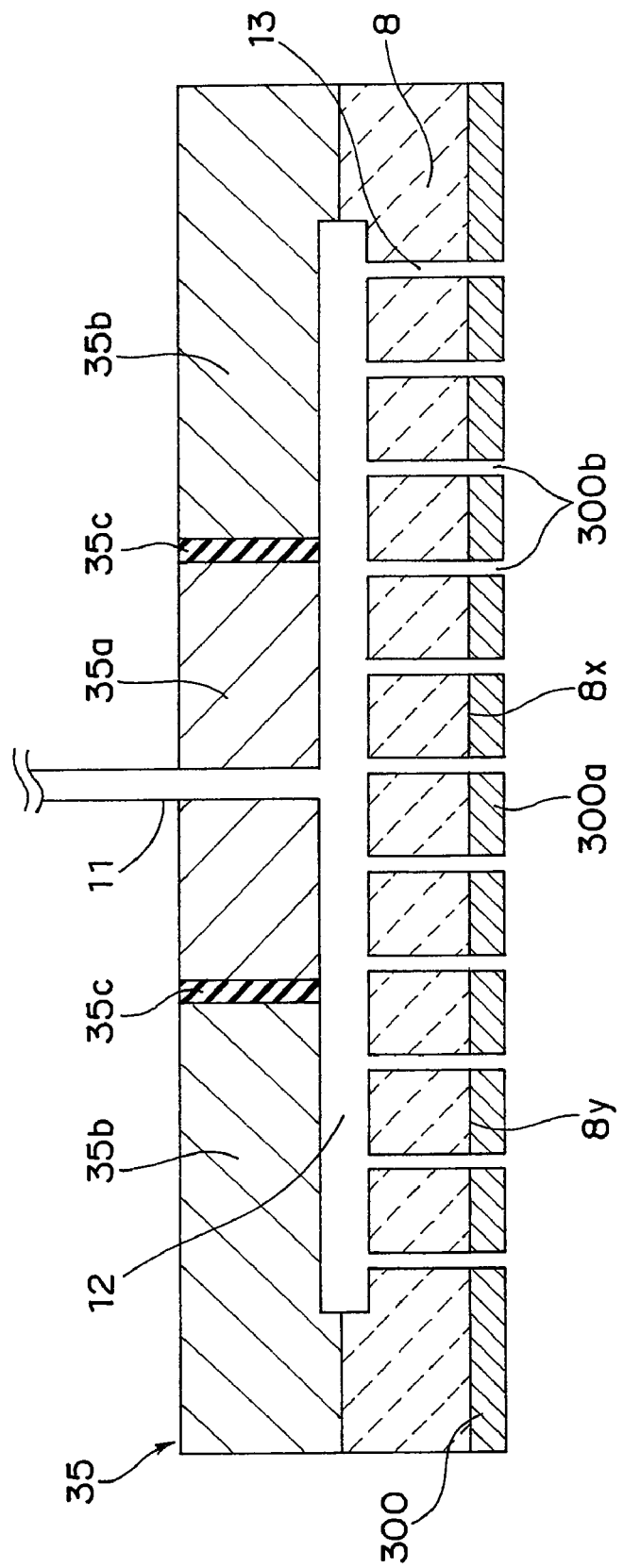
FIG. 9A is a partially enlarged cross-sectional view that shows the structures of the antenna and top plate 8 in detail, in the case where a boron-containing film is formed on the entire face of the top plate, in a first process of the second embodiment of the present invention.
Figure 9B:
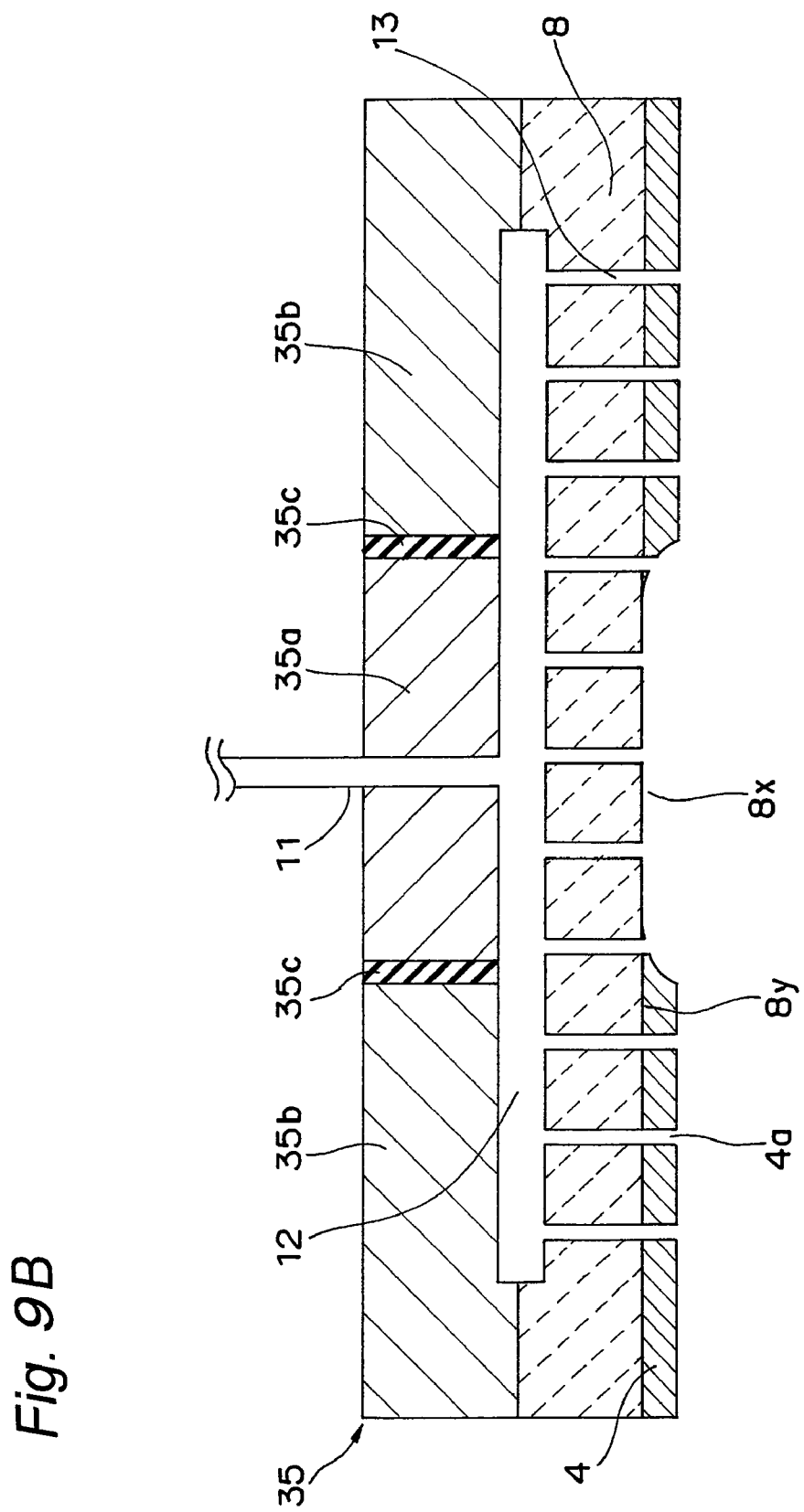
FIG. 9B is a partially enlarged cross-sectional view that shows the structures of the antenna and top plate in detail, in the case where a boron-containing film, formed in the center portion of the top plate, is removed by a sputtering process in a second process of the second embodiment of the present invention.

Referring to FIGS. 9A and 9B, the following description will discuss a method in which, after forming the boron-containing film (entire surface film) 300 on the entire surface of the inner face of the top plate 8 on the vacuum container 1 (in other words, both of the top plate center portion area 8x and the top plate peripheral edge portion area 8y) (first process PA), a film (center Portion film) 300a of the entire surface film 300 is removed by cutting by the use of a sputtering process (second process PB) so that the annular boron-containing film 4 is formed.

First, the first process PA is carried out so as to form the boron-containing film (entire surface film) 300 on the entire surface of the inner face of the top plate 8 on the vacuum container 1.

FIG. 9A is a partially enlarged cross-sectional view that shows the structures of the antenna 35 and the top plate 8 in detail when the boron-containing film (entire surface film) 300 is formed on the entire surface of the top plate 8 in the first process PA. Here, $B_2H_6$ diluted with He is introduced into the vacuum container 1 by the gas supply device 5 and the gas supply pipe 11, and by supplying electric powers (source powers) to the antenna 35a in the center portion and the antenna 35b on the peripheral edge portion from the high-frequency power supplies 6A and 6B respectively, a plasma is generated in the vacuum container 1. Here, the voltages, respectively applied to the antenna 35a in the center portion and the antenna 35b on the peripheral edge portion of the top plate 8 from the high-frequency power supplies 6A and 6B, are set to the same level. The discharging conditions at this time are, for example, set as follows: The concentration of $B_2H_6$ is set to 1% by mass, the pressure inside the vacuum container 1 is set to 0.9 Pa, and both of source powers to be respectively supplied to the antenna 35a in the center portion and the antenna 35b on the peripheral edge portion from the high-frequency power supplies 6A and 6B are 500 W, that is, the same source power. In the case where voltages to be applied to the center portion 8x and the peripheral edge portion 8y of the top plate 8 are set to the same level, an entire surface boron-containing film 300 containing boron is formed on the entire inner face of the top plate 8. Therefore, in order to form the entire surface boron-containing film 300 into an annular film 4, it is necessary to remove a center portion 300a of the boron-containing film that has been formed in the center portion 8x of the inner face of the top plate 8.

Next, the second process PB used for removing the center portion 300a of the boron-containing film, formed in the center portion 8x of the top plate 8 from the entire surface boron-containing film 300 by sputtering is carried out.

FIG. 9B is a partially enlarged cross-sectional view that shows the structures of the antenna 35 and the top plate 8 in detail in the case where the center portion 300a of the boron-containing film formed in the center portion 8x of the top plate 8 is removed by the sputtering in the second process PB.

The center portion 300a of the boron-containing film is removed from the entire surface boron-containing film 300 formed on the entire portion of the top plate 8 by sputtering. In the second process PB, source power to be supplied to the antenna 35a of the center portion 8x of the top plate 8 is set so as to be greater than the source power to be supplied to the antenna 35b on the peripheral edge portion 8y of the top plate 8 so that the sputter rate to the center portion 300a of the boron-containing film of the center portion 8x of the top plate 8 is made greater. The discharging conditions at this time are set as follows: For example, He is used as the process gas, the pressure inside the vacuum container 1 is set to 0.9 Pa, and the source power to be supplied to the antenna 35a in the center portion 8x of the top plate 8 from the high-frequency power supply 6A for the top-plate center portion is 500 W with no source power being supplied to the antenna 35b on the peripheral edge portion 8y of the top plate 8 from the high-frequency power supply 6B for the top-plate peripheral edge portion. By making the power to be supplied to the antenna 35a in the center portion greater than the power to be supplied to the antenna 35b on the peripheral edge portion, the sputter rate to the entire surface boron-containing film 300 of the top plate 8 becomes greater in the center portion 8x of the top plate 8 than that in the peripheral edge portion 8y of the top plate 8. Here, in order to make the sputter rate to the center portion 300a of the boron-containing film in the center portion of the top plate 8 greater than that in the peripheral edge portion 8y of the top plate 8, source powers having at least a difference of about 200 W may be supplied.

Therefore, from the entire surface boron-containing film 300 formed on the entire surface of the top plate 8 in the first process PA, the center portion 300a of the boron-containing film is removed by sputtering in the present second process PB with the boron-containing film on the peripheral edge portion thereof being maintained, as it is; therefore, an annular boron containing film 4 can be formed on the inner face of the top plate 8 on the vacuum container 1.

After the annular boron-containing film 4 has been formed on the inner face of the top plate 8 on the vacuum container 1 by the first and second processes PA and PB, a silicon substrate 3 is carried into the vacuum container 1, and a plasma doping process is carried out as the third process PC so that boron is introduced into the silicon substrate 3. Here, the following plasma doping conditions are set: The concentration of $B_2H_6$ is set to 1% by mass, the pressure inside the vacuum container 1 is 0.6 Pa, the bias voltage (Vpp) of the high-frequency power supply 10 is 200 V, the substrate temperature of the silicon substrate 3 is 20° C., and the doping time of boron during which the bias voltage is applied is set to 30 seconds. At this time, the electric power to be supplied to the antenna 35a of the center portion 8x of the top plate 8 and the electric power to be supplied to the antenna 35b on the peripheral edge portion 8y of the top plate 8 are set to the same value with both of the source powers being set to 50 W.

Here, in the case where the plasma doping process is successively carried out on a large number of silicon substrates 3, a boron-containing film tends to be again formed on the center portion 8x of the top plate 8. In such a case, by executing the second process PB, the boron-containing film formed on the center portion 8x of the top plate 8 can be removed.

In accordance with the second embodiment, by making the electric power to be supplied to the antenna 35a in the center portion greater than the electric power to be supplied to the antenna 35b on the peripheral edge portion, the sputter rate to the entire surface boron-containing film 300 of the top plate 8 can be made greater in the center portion than that in the peripheral edge portion. The resulting effect is that, with the vacuum container 1 being maintained in a vacuum state, the annular boron-containing film 4 can be easily formed on the top plate 8.

Moreover, in accordance with the second embodiment, the boron-containing films 300 and 4, formed in the second embodiment, are allowed to contain only the element of a gas introduced into the vacuum container 1. Therefore, the boron-containing films 300 and 4 never contain elements, such as oxygen and nitrogen, which might be contained in a film in the case where the film is preliminarily formed in the air, and the resulting effect is that only desired elements can be introduced into the silicon substrate 3.

Furthermore, in accordance with the second embodiment, even in the case where, during processes in which the plasma doping operation is successively carried out on a large number of silicon substrates 3, a boron-containing film is formed on the center portion 8x of the top plate 8, by carrying out the second process PB, the boron-containing film can be again formed into an annular boron-containing film 4.

Therefore, the second embodiment has such a remarkable effect in practical use that the effects of the present invention that both of the dose amount and the injection depth are uniformly maintained within the in-place of the silicon substrate can be obtained stably for a long period of time.

Here, in the case where the above-mentioned device in accordance with the second embodiment is used, by changing the method for adjusting parameters instead of using the above-mentioned method, the boron-containing film 4 having an annular shape can be formed by using another method. The following description will discuss the method for adjusting parameters, as a modified example of the second embodiment.

In the first process PA for forming the boron-containing film on the inner face of the top plate 8 on the vacuum container 1, electric powers to be applied to the antennas 35a and 35b in the center portion and on the peripheral edge portion are adjusted so as to make the plasma density in the vicinity of the peripheral edge portion 8y higher than that in the vicinity of the center portion 8x of the top plate 8. The discharging conditions at this time are, for example, set as follows: The concentration of $B_2H_6$ is set to 1% by mass, the pressure inside the vacuum container 1 is set to 0.9 Pa, the source power to be supplied to the antenna 35a in the center portion from the high-frequency power supply 6A for the center portion is set to 10 W, and the source power to be supplied to the antenna 35b on the peripheral edge portion from the high-frequency power supply 6B for the peripheral edge portion is set to 500 W. Here, it has been known that, in general, the boron-containing film 4 is more easily formed on a wall face located close to a portion having a high plasma density. Therefore, by carrying out a discharging process with the plasma density near the peripheral edge portion 8y being made higher than the plasma density near the center portion 8x of the top plate 8, it becomes possible to form a thicker boron-containing film 4 on the peripheral edge portion 8y with hardly any film being formed on the center portion 8x of the top plate 8.

That is, in the case where the plasma density is made higher in the vicinity of the peripheral edge portion By than that in the vicinity of the center portion 8x of the top plate 8 in the first process PA, it is possible to form a boron-containing film 4 having an annular shape on the inner face of the top plate 8 on the vacuum container 1 by using a single process without the necessity of carrying out a sputtering process on the center portion 8x of the top plate 8 by the second process PB.

Moreover, even in the case where, after forming the boron-containing film 4 having an annular shape in this manner, the plasma doping process of the third process PC is carried out, there is no difference in the results, and the effects of the present invention can be obtained.

Comparative Example 1

The following description will discuss a comparative example 1 for use in comparison with the first embodiment, in which, by using not the annular film 4, but a film 17 formed on the entire inner face of the top plate 8 on the vacuum container 1 side, a plasma doping process is carried out in the same device as that of the first embodiment.

Figure 10:
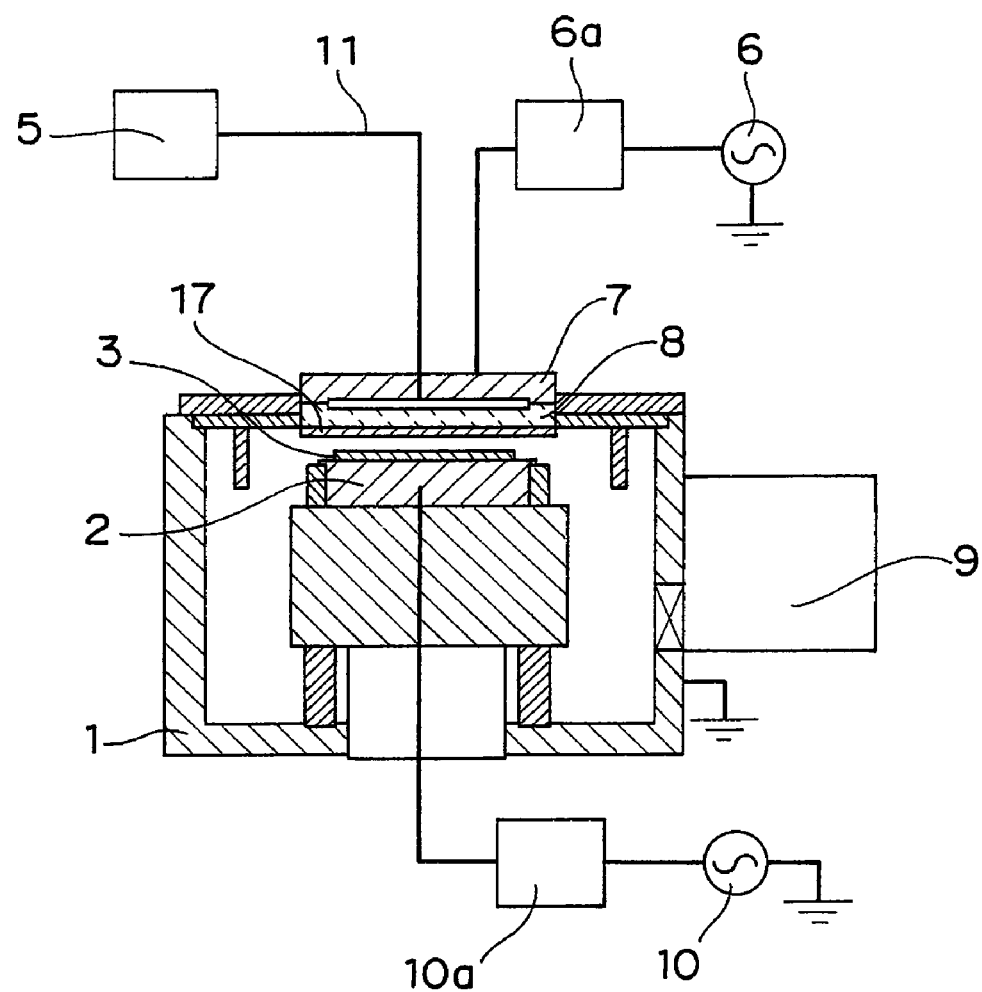
FIG. 10 is a partial cross-sectional view that shows a parallel flat-plate plasma doping apparatus provided with a top plate on the entire surface of which a boron-containing film is formed with a uniform thickness.
Figure 11:
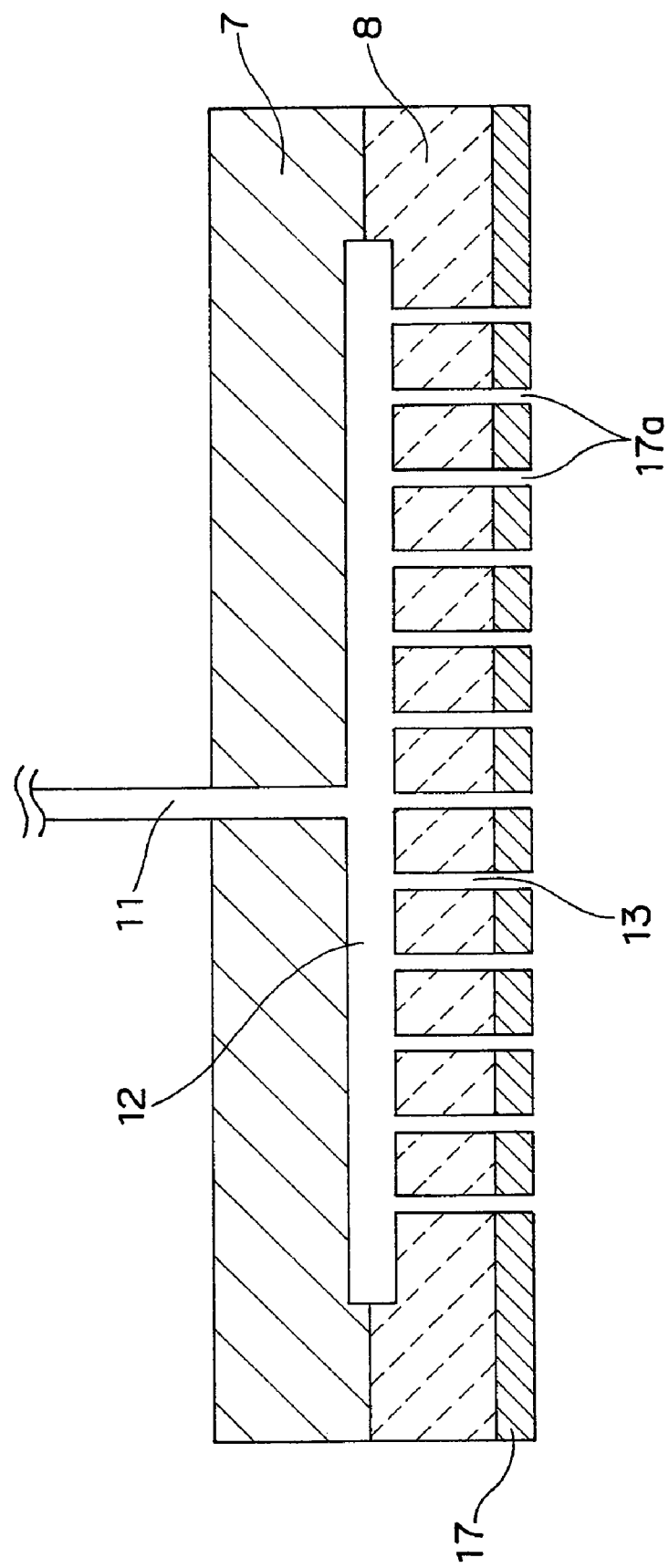
FIG. 11 is a partially enlarged cross-sectional view that shows the structures of the top plate and boron-containing film of the device of FIG. 10 in detail.

First, referring to FIGS. 10 and 11, the following description will discuss features of a parallel flat-plate plasma doping apparatus provided with a top plate 8 in which a film containing an impurity is formed on the entire inner face of the top plate 8 with a uniform thickness on the vacuum container 1 side, and the results of a plasma doping process carried out by using the device.

In the present comparative example 1, the film 17 (entire surface boron-containing film) serving as one example of a film containing an impurity and $B_2H_6$ diluted with He serving as one example of a doping gas are used, and a process in which boron is introduced into a silicon substrate 3 by the present comparative example 1 will be explained.

FIG. 10 is a partial cross-sectional view showing the parallel flat-plate plasma doping apparatus provided with the top plate 8 on which the entire surface boron-containing film 17 is formed with a uniform thickness. A sample electrode 2 on which a silicon substrate 3 is to be placed is arranged in a vacuum container 1. A gas supply device 5 used for diluting $B_2H_6$ with He so as to supply the resulting gas into the vacuum container 1, as well as a gas supply pipe 11, and a pump 9 for pressure-reducing the inside of the vacuum container 1 are installed in the vacuum container 1 so that the inside of the vacuum container 1 can be kept in a predetermined pressure. By supplying electric power to an antenna 7 from a gas-exciting high-frequency power supply 6, a plasma is generated between the top plate 8 in the vacuum container 1 and the sample electrode 2. A high-frequency power supply is connected to the sample electrode 2 so that the electric potential of the sample electrode 2 can be controlled.

FIG. 11 is a partial cross-sectional view that shows the structures of the top plate 8 and the entire surface boron-containing film 17 in detail. The top plate 8 is made of silicon. The entire surface boron-containing film 17 to be introduced into the silicon substrate 3 is formed on the entire inner surface of the top plate 8 on the vacuum container 1 with a uniform thickness. Here, $B_2H_6$ and He are introduced into a gas chamber 12 placed between the antenna 7 and the top plate 8 from the gas supply pipe 11. Gas introducing holes 13 are formed through the top plate 8. Moreover, gas-introducing through holes 17a are formed through the entire surface boron-containing film 17 so as to allow $B_2H_6$ and He to pass and flow into the vacuum container 1. Here, $B_2H_6$ and He, thus introduced into the gas chamber 12, can be introduced into the vacuum container 1 through the gas introducing holes 13 and the through holes 17a.

The following description will discuss a method in which the parallel flat-plate plasma-doping apparatus provided with the top plate 8 on which the entire surface boron-containing film 17 is formed with a uniform thickness is used, and the results obtained by the method.

After an entire surface boron-containing film 17 has been formed on the inner face of the top plate 8 on the vacuum container 1 with a uniform thickness, a silicon substrate 3 is placed on the sample electrode 2. The plasma doping conditions are set in the same manner as those of the specific example of the first embodiment. When a plasma doping process is carried out in this manner, boron is introduced into the silicon substrate 3 not only from $B_2H_6$, but also from the entire surface boron-containing film 17 having the uniform thickness. Here, referring to FIGS. 12 and 13, the following description will discuss the amounts of boron introduced to the silicon substrate 3 from the entire surface boron-containing film 17 having the uniform thickness and the amounts of boron introduced to the silicon substrate 3 from $B_2H_6$.

Figure 12:
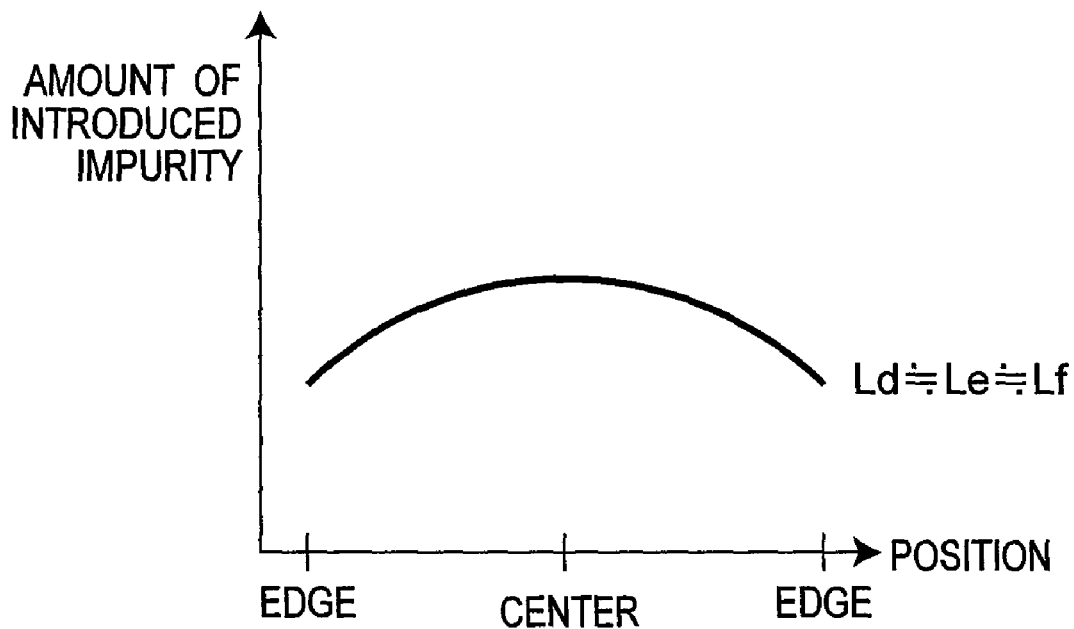
FIG. 12 is a graph that indicates a relationship between the position on the surface of a silicon substrate and the amount of boron introduced onto the silicon substrate due to a boron-containing film with a uniform thickness, in the device of FIG. 10.

FIG. 12 is a graph that shows the relationship between the positions on the surface of the silicon substrate 3 and the amount of boron (amount of introduction of an impurity) to be introduced to the silicon substrate 3 from the entire surface boron-containing film 17 with the uniform thickness.

To the center portion of the silicon substrate 3, boron is introduced not only from the center portion of the entire surface boron-containing film 17 with the uniform thickness, but also from the entire portion of the entire surface boron-containing film 17 including the peripheral edge portion thereof. In contrast, to the peripheral edge portion of the silicon substrate 3, boron is introduced from only the peripheral edge portion of the entire surface boron-containing film 17 with the uniform thickness. That is, as shown in FIG. 12, the relationship between the positions on the surface of the silicon substrate 3 and the amount of boron (amount of introduction of an impurity) to be introduced to the silicon substrate 3 from the entire surface boron-containing film 17 with the uniform thickness is indicated by a graph that is curved with a convex portion upward. Therefore, more boron derived from the entire surface boron-containing film 17 is introduced to the center portion of the silicon substrate 3.

Moreover, in the case where the concentration of $B_2H_6$ is varied in such a manner as to change d, e, and f (d<e<f) within a range of from 0.01% by mass to 1.0% by mass (that is, 0.01% by mass≦d<e<f≦1.0% by mass), supposing that, in the case of a gas concentration of d, the amount of introduced boron from the entire boron-containing film 17 with the uniform thickness is Ld, that in the case of a gas concentration of e, the amount of introduced boron from the entire boron-containing film 17 with the uniform thickness is Le, and that in the case of a gas concentration of f, the amount of introduced boron from the entire boron-containing film 17 is Lf, expressions, Ld≅Le≅Lf, are satisfied. That is, as shown in FIG. 12, independent of the concentration of $B_2H_6$, the relationship between the positions on the surface of the silicon substrate 3 and the amount of boron (amount of introduction of an impurity) to be introduced to the silicon substrate 3 from the entire surface boron-containing film 17 with the uniform thickness is indicated by a single graph that is curved with a convex portion upward. Therefore, the amount of introduced boron from the entire surface boron-containing film 17 with the uniform thickness can be set within the same permissible range in practical use, independent of the concentration of $B_2H_6$.

Figure 13:
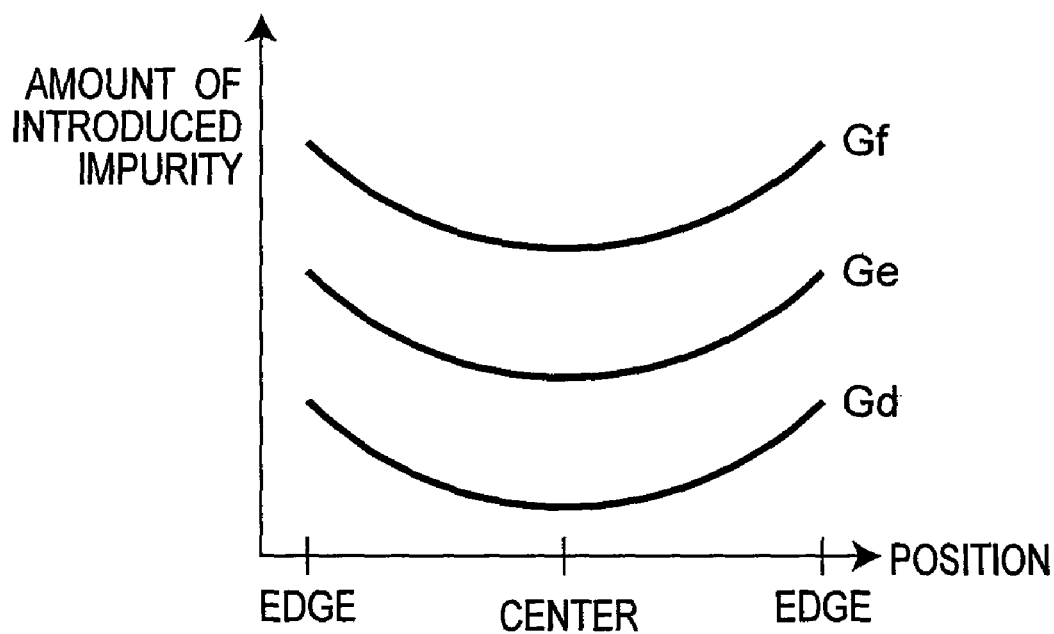
FIG. 13 is a graph that indicates the position on the surface of a silicon substrate and the dose amount of boron introduced onto the silicon substrate due to $B_2H_6$, in the device of FIG. 10.

FIG. 13 is a graph that shows the relationship between the positions on the surface of the silicon substrate 3 and the dose amount of boron to be introduced to the silicon substrate 3 from $B_2H_6$. The amount of introduction of boron from $B_2H_6$ can be varied in its distribution within the in-plane of the silicon substrate 3 by adjusting the layout of the gas supply holes 13. In the present comparative example 1, the layout of the gas supply holes 13 is adjusted so as to cancel the distribution of the amount of introduced boron derived from the entire surface boron-containing film 17 in the case of the entire surface boron-containing film with the uniform thickness being formed. That is, the amount of introduced boron derived from $B_2H_6$ is distributed in such a manner that it is small in the center portion of the silicon substrate 3, while it is large in the peripheral edge portion. Moreover, among cases in which the concentration of $B_2H_6$ is varied to d, e, and f (d<e<f), supposing that, in the case of the gas concentration of d, the amount of introduced boron derived from $B_2H_6$ is Gd, that, in the case of the gas concentration of e, the amount of introduced boron derived from $B_2H_6$ is Ge, and that, in the case of the gas concentration f, the amount of introduced boron derived from $B_2H_6$ is Gf, expressions, Gd<Ge<Gf, are satisfied so that, by changing the gas concentration, it is possible to control the amount of introduced boron into the silicon substrate 3 derived from $B_2H_6$. That is, as shown in FIG. 13, the relationship between the positions on the surface of the silicon substrate 3 and the dose amount of boron to be introduced to the silicon substrate 3 from $B_2H_6$ is indicated by a graph that is curved with a convex portion downward depending on each of the concentrations of $B_2H_6$.

Figure 14:
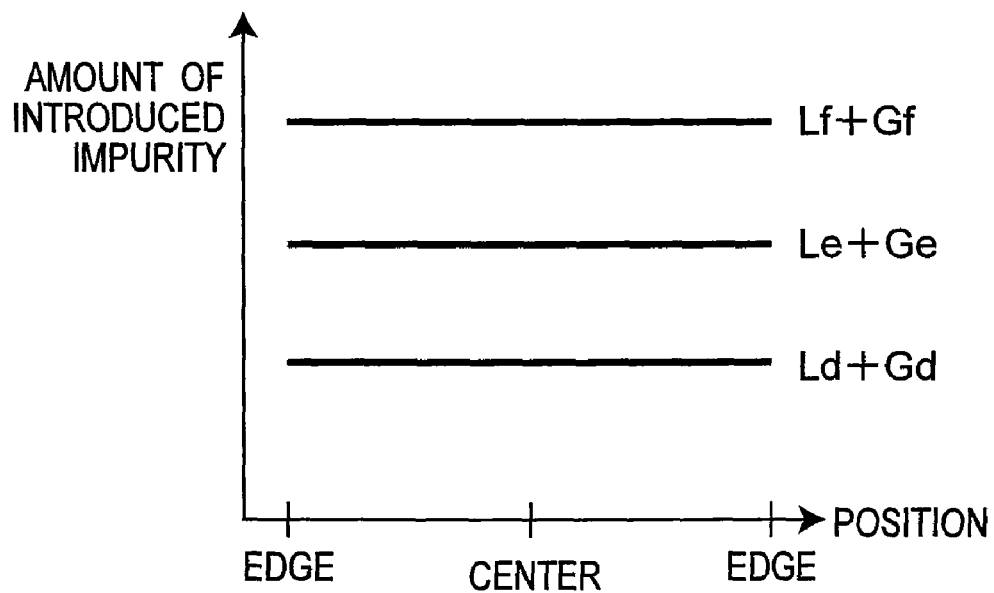
FIG. 14 is a graph that indicates the position on the surface of a silicon substrate and the dose amount of boron introduced onto the silicon substrate in a comparative example 1 in the device of FIG. 10.

FIG. 14 is a graph that indicates the positions on the surface of the silicon substrate 3 and the dose amount of boron to be introduced into the silicon substrate 3 in the present comparative example 1. In the present comparative example 1, boron is introduced not only from $B_2H_6$, but also from the entire surface boron-containing film 17 with the uniform thickness, formed on the inner face of the top plate 8 on the vacuum container 1. That is, the dose amount of boron to be introduced into the silicon substrate 3 by a plasma doping process is represented by sums of values, Ld+Gd, Le+Ge and Lf+Gf, obtained by adding the amounts of introduced boron Ld, Le, and Lf derived from the entire surface boron-containing film 26 with the uniform thickness to the amounts of introduced boron Gd, Ge, and Gf from derived from $B_2H_6$. Here, since the distribution of the amount of introduced boron from $B_2H_6$ is adjusted so as to cancel the distribution within the in-plane of the silicon substrate of the amount of introduced boron derived from the entire surface boron-containing film 17 with the uniform thickness, the plasma doping process of the present comparative example 1 can make uniform the distribution of the dose amount of boron within the in-plane of the silicon substrate. In this manner, even in the case where the entire surface boron-containing film 17 is formed on the inner face of the top plate 8 on the vacuum container 1 with a uniform thickness, it is possible to uniformly adjust the distribution of the dose amount of boron after the plasma doping process within the in-plane of the substrate.

However, the following issues arise with the boron injection depth.

Figure 15:
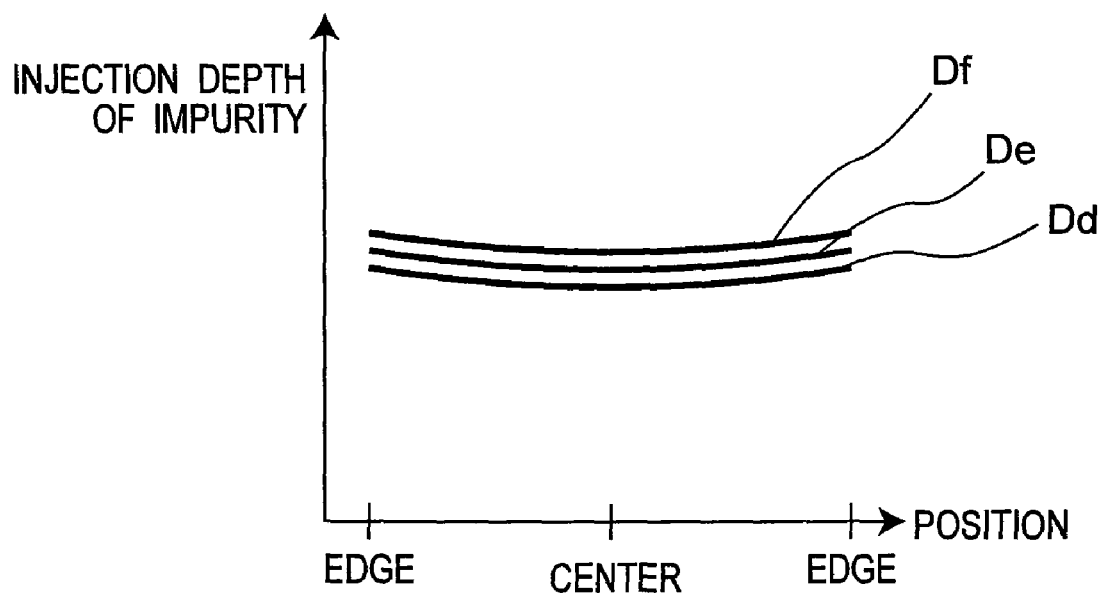
FIG. 15 is a graph that indicates the position on the surface of a silicon substrate and the injection depth of boron introduced thereon by the plasma doping process of a comparative example 1 in the device of FIG. 10.

FIG. 15 is a graph that shows positions on the surface of the silicon substrate 3 and the corresponding injection depths of boron introduced by the plasma doping process of the present comparative example 1.

Figure 16A:
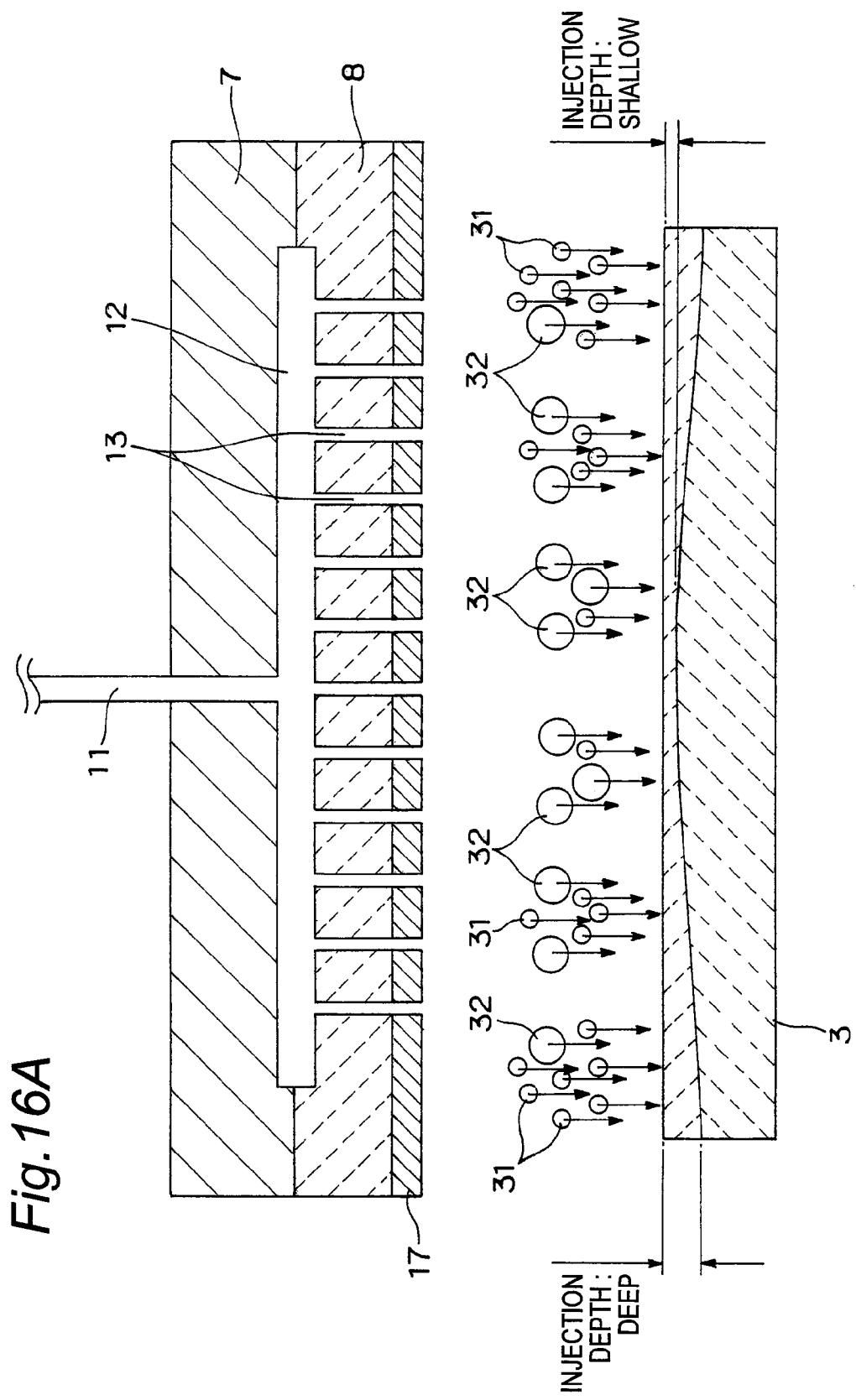
FIG. 16A is an explanatory view that shows the injection depth of boron in the case where molecules containing boron that are derived from decomposed $B_2H_6$ in a plasma and molecules containing boron that are sputtered out of a boron-containing film by the plasma are introduced into the surface of a substrate in a comparative example 1.

As shown in FIG. 16A, in the case where molecules 31 that are generated by decomposition of $B_2H_6$ in a plasma and that contain boron therein, and molecules 32 that are sputtered out of the entire surface boron-containing film 17 by the plasma and that contain boron therein, are compared with each other, the distributions of the molecular weights thereof are different from each other. The molecules 31 (molecules derived from $B_2H_6$) that are generated by decomposition of $B_2H_6$ and that contain boron therein, are smaller in their molecular weights than that of $B_2H_6$. In contrast, the molecules 32 (molecules derived from the boron-containing film) that are sputtered out of the entire surface boron-containing film 17 and that contain boron therein are considered to have greater molecular weights than that of $B_2H_6$ in general, because they are sputtered out from a solid substance. Here, since those molecules having greater molecular weights are allowed to stay at portions closer to the surface, the injection depth of boron becomes shallower, while, since those molecules having smaller molecular weights are introduced into deeper portions from the surface, the injection depth thereof becomes deeper. Consequently, such a distribution in which a greater ratio thereof is occupied by small molecules such as $B^+$ is allowed to have a deeper injection depth; in contrast, such a distribution in which a greater ratio thereof is occupied by great molecules has a shallower injection depth. Because of this, the injection depth of boron of the molecules 31 derived from $B_2H_6$ is different from the injection depth of boron of the molecules 32 derived from the boron-containing film, and in general, the injection depth of boron of the molecules 31 derived from $B_2H_6$ is deeper than the injection depth of boron of the molecules 32 derived from the boron-containing film. For this reason, the injection depth of boron is regulated by boron derived from $B_2H_6$; therefore, in this case, as shown in FIG. 13, with respect to the distribution of the amount of boron derived from $B_2H_6$, for example, the gas introducing holes 13 are uniformly arranged on the top plate 8 with the number of those located in the center being smaller, so as to make the gas flow rate on the peripheral edge portion of the substrate 3 greater than that in the center portion of the substrate 3 so that the dose amount of boron after the plasma doping process is made uniform within the in-place of the substrate.

Here, when the adjustment is made so as to make the dose amount uniformly maintained within the in-plane of the substrate, the resulting issue is that the injection depth of boron becomes shallower in the center portion of the substrate 3, while it becomes deeper on the peripheral edge portion (see FIG. 16A).

Therefore, in the case where the entire surface boron-containing film 17 is formed on the entire inner face of the top plate 8 on the vacuum container 1 with a uniform thickness as shown by the present comparative example 1, an issue arises in which, although the distribution of the dose amount of boron to be introduced into the silicon substrate 3 is made uniformly maintained within the in-plane of the substrate, the injection depth thereof is not made uniform within the in-plane of the substrate.

Moreover, in contrast, even when, by changing the plasma doping conditions and the like, the molecular weight of molecules 32 (molecules derived from the boron-containing film) containing boron sputtered out from the entire surface boron-containing film 17 is made smaller than the molecular weight of molecules 31 derived from $B_2H_6$, the distribution of the injection depth, shown in FIG. 15, is made upside down, that is, with the center portion of the substrate 3 being made deeper and the peripheral edge portion thereof being made shallower, to cause the same issue that non-uniformity occurs within the in-plane of the substrate. Moreover, since it is very difficult to make the distribution of the molecular weight of the molecules derived from the entire surface boron-containing film and the distribution of the molecular weight of the molecules 31 derived from $B_2H_6$ equal to each other, it becomes difficult to make the injection depth uniform within the in-plane of the substrate by using the structure of comparative example 1.

Comparative Example 2

The following description will discuss a comparative example 2 for use in comparison with the second embodiment, in which the same apparatus as the second embodiment is used and the source power to be supplied to the antenna 35a in the center portion is made greater than a source power to be supplied to the antenna 35b on the peripheral edge portion in a manner reversed to the arrangement of the modified example of the second embodiment.

Referring to FIGS. 7 and 8, the following description will discuss the present comparative example 2.

In the present comparative example 2, in the first process PA of the second embodiment, electric powers to be applied to the antennas 35a and 35b in the center and on the peripheral edge portion are adjusted so as to make the plasma density on the peripheral edge portion 8y higher than that in the center portion 8x of the top plate 8. The discharging conditions at this time are, for example, set as follows: The concentration of $B_2H_6$ is set to 1% by mass, the pressure inside the vacuum container 1 is set to 0.9 Pa, the source power to be supplied to the antenna 35a in the center portion is set to 500 W, and the source power to be supplied to the antenna 35b on the peripheral edge portion is set to 10 W.

In the case where the plasma density on the peripheral edge portion is made higher than that on the center portion of the top plate 8, a thicker boron-containing film is formed on the center portion of the top plate 8 with hardly any film being formed on the peripheral edge portion thereof. The resulting issue is that it is not possible to form the boron-containing film into an annular shape.

In comparison with these comparative examples 1 and 2, in accordance with the first and second embodiments, both of the dose amount and the injection depth can be made uniform, and referring to FIG. 16B (one working example of the first or second embodiment) and FIG. 16A (comparative example 1) for use in comparison, the following description will discuss this effect.

In FIG. 16A of comparative example 1, since the boron-containing film 17 is uniformly formed on the top plate 8, more particles 32 containing more boron are located on the center portion of the substrate 3 (in FIG. 16A, this is expressed by three particles 32 containing more boron, located in the center portion of the substrate 3, while reference numeral 31 represents a particle containing less boron (for example, two or less)). In contrast, less particles 32 containing more boron are located on the peripheral edge portion of the substrate 3 (in FIG. 16A, this is expressed by only one particle containing more boron located in the vicinity of the peripheral edge portion of the substrate 3). Therefore, the amount of injected boron derived from the boron-containing film 17 in FIG. 16A is not made uniform within the in-plane of the substrate with more injected boron being located on the center portion of the substrate 3 in comparison with the peripheral edge portion of the substrate 3. In order to make the dose amount uniform within the in-plane of the substrate by adjusting the positions of the gas introducing holes 13, the gas flow rate, or the like so as to cancel the biased amount of injected boron derived from the boron-containing film 17, the amount of injected boron derived from $B_2H_6$ of a gas containing $B_2H_6$ is properly distributed. For example, with the gas introducing holes 13 being uniformly arranged on the top plate 8, the gas flow rate on the peripheral edge portion of the substrate 3 is set to a higher level in comparison with that in the center portion of the substrate 3. With this arrangement, the dose amount within the in-plane of the substrate can be made uniform. However, since the sizes (mass) of the particles containing boron to be injected are different depending on the center portion of the substrate 3 and the peripheral edge portion of the substrate 3, an issue arises in that the injection depth is not made uniform.

In contrast, in FIG. 16B showing the present embodiment, the boron-containing film 4 is formed into an annular shape on the top plate 8. Thus, in the center portion of the substrate 3, due to influences from the opening 4c of the boron-containing film 4 formed in the center portion 8x of the top plate 8, in comparison with FIG. 16A, less particles 32 containing more boron are located in the center portion of the substrate 3 (in FIG. 16B, this is expressed by only one particle containing more boron located in the vicinity of the center portion of the substrate 3, while reference numeral 31 represents a particle containing less boron (for example, two or less)). Consequently, since the peripheral edge portion of the substrate 3 is less susceptible to the influences from the opening 4c of the boron-containing film 4 formed in the center portion 8x of the top plate 8, the number of particles 32 containing more boron is maintained in the same manner, in comparison with FIG. 16A. Therefore, the amount of injected boron derived from the boron-containing film 4 can be made uniform within the in-plane of the substrate. Here, for example, the gas introducing holes 13 are preliminarily arranged on the top plate 8 uniformly, and the gas flow rates through the gas introducing holes 13 are uniformly set. With this arrangement, the dose amount within the in-plane of the substrate can be made uniform. Furthermore, in this arrangement, since the sizes (masses) of the particles 32 containing boron to be injected into the substrate 3 are made equal to each other between the center portion of the substrate 3 and the peripheral edge portion of the substrate 3, it is possible to also make the injection depths uniform.

Third Embodiment

A third embodiment of the present invention has an arrangement in which, different from the second embodiment, a boron-containing film 4 having an annular shape is formed by using a single device, and a plasma doping process can be carried out, and by combining the second embodiment and the third embodiment with each other, an arrangement may be made so that it becomes more difficult to form a film containing an impurity (for example, a boron-containing film) on the center portion 8x of the top plate 8.

Figure 18:
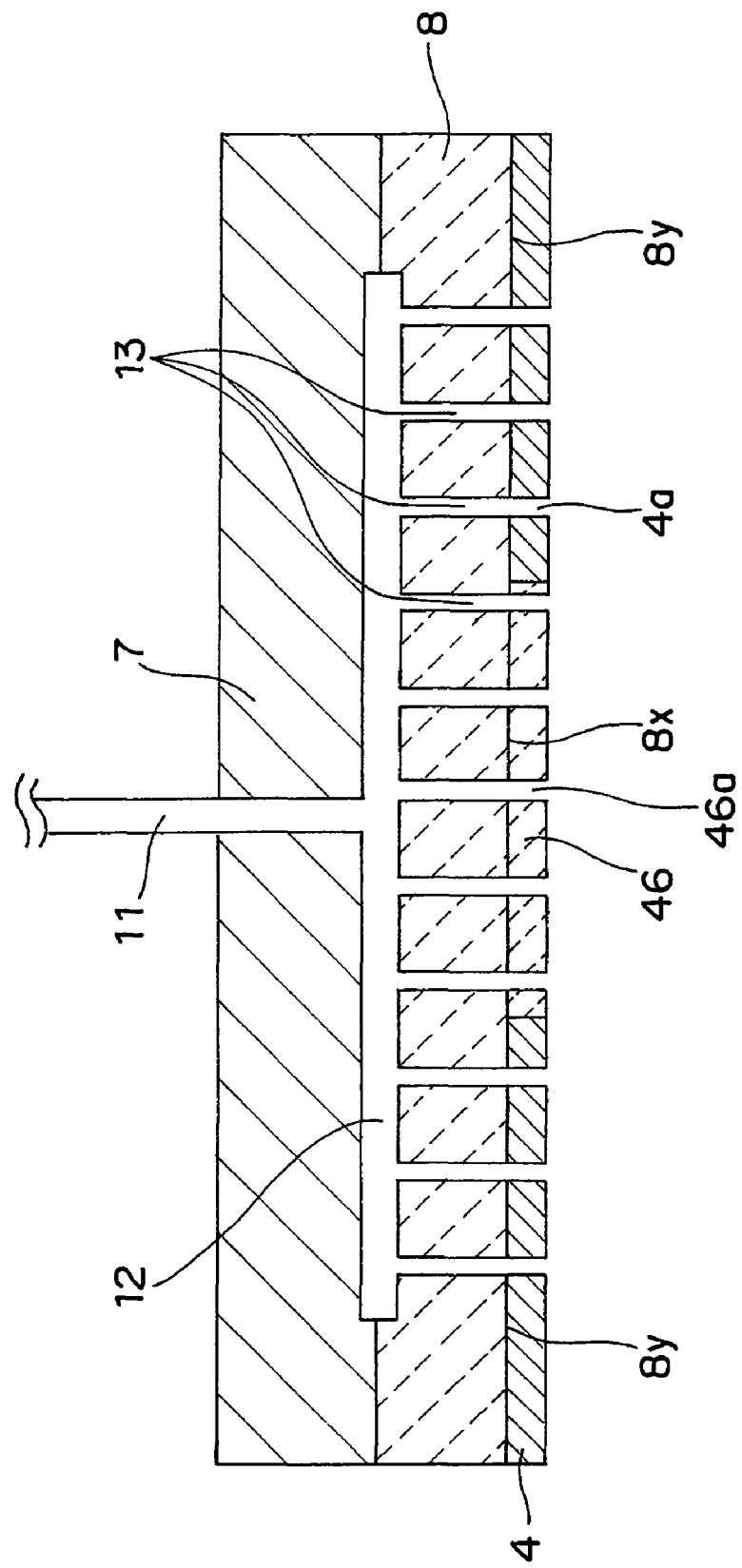
FIG. 18 is a partially enlarged cross-sectional view that shows structures of a silicon top plate, a quartz top plate portion, and a boron-containing film in detail in the third embodiment of the present invention.

Referring to FIGS. 17 and 18, the following description will discuss the third embodiment of the present invention, and explain features of a parallel flat-plate plasma doping apparatus in which the material for the center portion 8x and the material for the peripheral edge portion 8y are made different from each other on the inner face of the top plate 8 on the vacuum container, as well as explaining a method for forming a film having an annular shape with an impurity contained therein by using the above-mentioned device, and the results of a plasma doping process carried out by using the device.

In the third embodiment, in the case where a film (boron-containing film) 4 containing boron serving as one example of a film containing an impurity, and $B_2H_6$ diluted with He serving as one example of a plasma-doping gas, are used, processes in which boron is introduced into a silicon substrate 3 by using the plasma doping method of the first embodiment of the present invention will be explained.

FIG. 17 is a partial cross-sectional view showing a parallel flat-plate plasma doping apparatus in which the material for the center portion 8x and the material for the peripheral edge portion 8y are made different from each other on the inner face of the top plate 8 on the vacuum container. A sample electrode 2 on which a silicon substrate 3 is to be placed is arranged in a vacuum container 1. A gas supply device 5 used for diluting $B_2H_6$ with He so as to supply the resulting gas into the vacuum container 1, as well as a gas supply pipe 11, and a pump 9 for pressure-reducing the inside of the vacuum container 1, are arranged so that the inside of the vacuum container 1 can be kept in a predetermined pressure. By supplying electric power to an antenna 7 from a high-frequency power supply 6, a plasma is generated between the top plate 8 and the sample electrode 2. Here, the top plate 8 is made of silicon. On the center portion 8x on the inner face of the silicon top plate 8 on the vacuum container 1, a disc-shaped top plate portion 46, which serves as one example of a plasma contact-prevention layer or an impurity-film formation preventive layer and is made from a material different from that of the silicon top plate 8, is secured. The top plate portion 46 made from a different material is made from quartz that is different from silicon. A high-frequency power supply 10 is connected to the sample electrode 2 so as to control the electric potential of the sample electrode 2. Here, although not shown in the Figures, an upper electrode configured by an antenna 7 and the silicon top plate 8 and the quartz top plate portion 46; and the vacuum container 1 are electrically insulated from each other.

FIG. 18 is a partially enlarged cross-sectional view that shows the structures of the silicon top plate 8, the quartz top plate portion 46, and the boron-containing film 4 in detail. The quartz top plate portion 46 is installed on the center portion 8x on the inner face of the silicon top plate 8 on the vacuum container 1. The thickness of the quartz top portion 46 is set to, for example, 0.5 mm. The boron-containing film 4 is formed with an annular shape on a portion (peripheral edge portion 8y) on the inner face of the silicon top plate 8 on the vacuum container 1, which corresponds to a portion with no quartz top plate 46 formed thereon. Here, $B_2H_6$ and He are introduced into a gas chamber 12 placed between the antenna 7 and the silicon top plate 8 from the gas supply pipe 11. Gas introducing holes 13 are formed through the silicon top plate 8. Moreover, through holes 4a and 46a are formed through the boron-containing film 4 and the quartz top plate portion 46 so as to allow $B_2H_6$ and He to pass and flow into the vacuum container 1. Here, $B_2H_6$ and He, thus introduced into the gas chamber 12, can be introduced into the vacuum container 1 through the gas introducing holes 13 and the through holes 4a and 46a.

After an annular boron-containing film 4 has been formed on the inner surface of the silicon top plate 8 on the vacuum container 1, when a plasma doping process is carried out by using the apparatus in accordance with the third embodiment, not only the dose amount of boron to be introduced into the silicon substrate 3, but also the injection depth is made uniform within the in-plane of the silicon substrate 3 in the same manner as in the first embodiment; thus, remarkable effects in practical use can be obtained.

The following description will discuss a method for forming the annular boron containing film 4 by using the parallel flat-plate plasma doping apparatus of the third embodiment provided with the quartz top plate portion 46 on the center portion 8x of the silicon top plate 8.

While $B_2H_6$ diluted with He is being introduced into the vacuum container 1 by the gas supply device 5, the vacuum container 1 is pressure-reduced by a pump 9, and maintained at a predetermined pressure. Next, electric power (source power) is supplied to an antenna 50 from a high-frequency power supply 49 so that a plasma is generated. At this time, for example, the following conditions are set: The concentration of $B_2H_6$ is set to 1% by mass, the pressure of the vacuum container 1 is 0.9 Pa, and the source power to be supplied to the antenna 7 is set to 500 W.

When a discharging process is carried out under these conditions, a boron-containing film 4 is formed on the silicon top plate 8. In contrast, hardly any boron-containing film is formed on the quartz top plate portion 46 formed on the center portion 8x of the silicon top plate 8. The reason for this is as follows, that is, since the possibility of allowing the boron-containing film to adhere thereto is different between silicon and quartz, the quartz has such a characteristic that the boron-containing film is more hardly formed thereon in comparison with the silicon. Therefore, in the case where, after the quartz top plate portion 46 has been placed in a manner so as to cover the center portion 8x of the silicon top plate 8, a discharging process is carried out, since a thicker boron-containing film 4 is formed on a portion (peripheral edge portion 8y on the inner face of the top plate 8) to which the silicon on the inner face of the top plate 8 is exposed, when viewed from the substrate 3, an annular boron-containing film 4 is consequently formed automatically.

After the annular boron-containing film 4 has been formed on the inner face of the silicon top plate 8 on the vacuum container 1, a plasma doping process is carried out so that boron is introduced into the silicon substrate 3. Here, for example, the following plasma doping conditions are set: The concentration of $B_2H_6$ is set to 1% by mass, the pressure inside the vacuum container 1 is 0.6 Pa, the bias voltage (Vpp) of is set to 200 V, the substrate temperature is set to 20° C., and the doping time of boron during which the bias voltage is applied is set to seconds. Even when plasma doping processes are successively carried out on a large number of silicon substrates 3, a boron-containing film is hardly formed on the quartz top plate portion 46. Consequently, even when plasma doping processes are successively carried out on many silicon substrates 3, it becomes possible to easily maintain the annular boron-containing film properly into the annular shape.

Therefore, the third embodiment makes it possible to exert an effect that the annular boron-containing film 4 can be easily formed without the necessity of using a complicated device.

Another effect obtained by the third embodiment is that, even when plasma doping processes are successively carried out on a large number of silicon substrates 3, the boron-containing film 4 can be easily maintained into the annular shape.

For this reason, in accordance with the third embodiment, the remarkable effect in practical use of the present invention that the dose amount and the injection depth can be made uniform within the in-plane of the silicon substrate can be obtained for a long period of time in a stable manner.

Fourth Embodiment

In a fourth embodiment of the present invention, an example in which the plasma doping apparatus of any one of the above-mentioned embodiments is incorporated into a production flow for use in continuous production will be explained.

Figure 19:
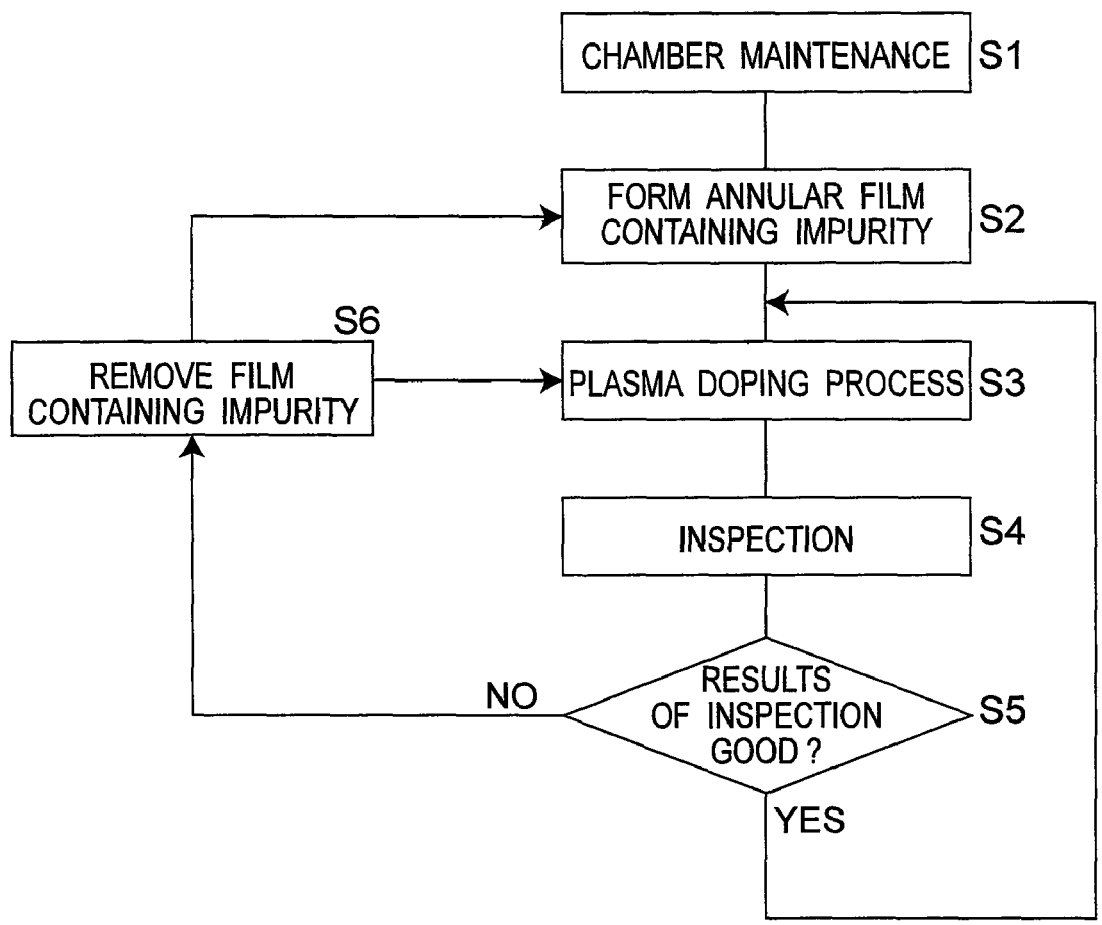
FIG. 19 is a flow chart that shows a sequence of processes used for carrying out a plasma doping process on a large number of substrates in the third embodiment of the present invention.
Figure 20:
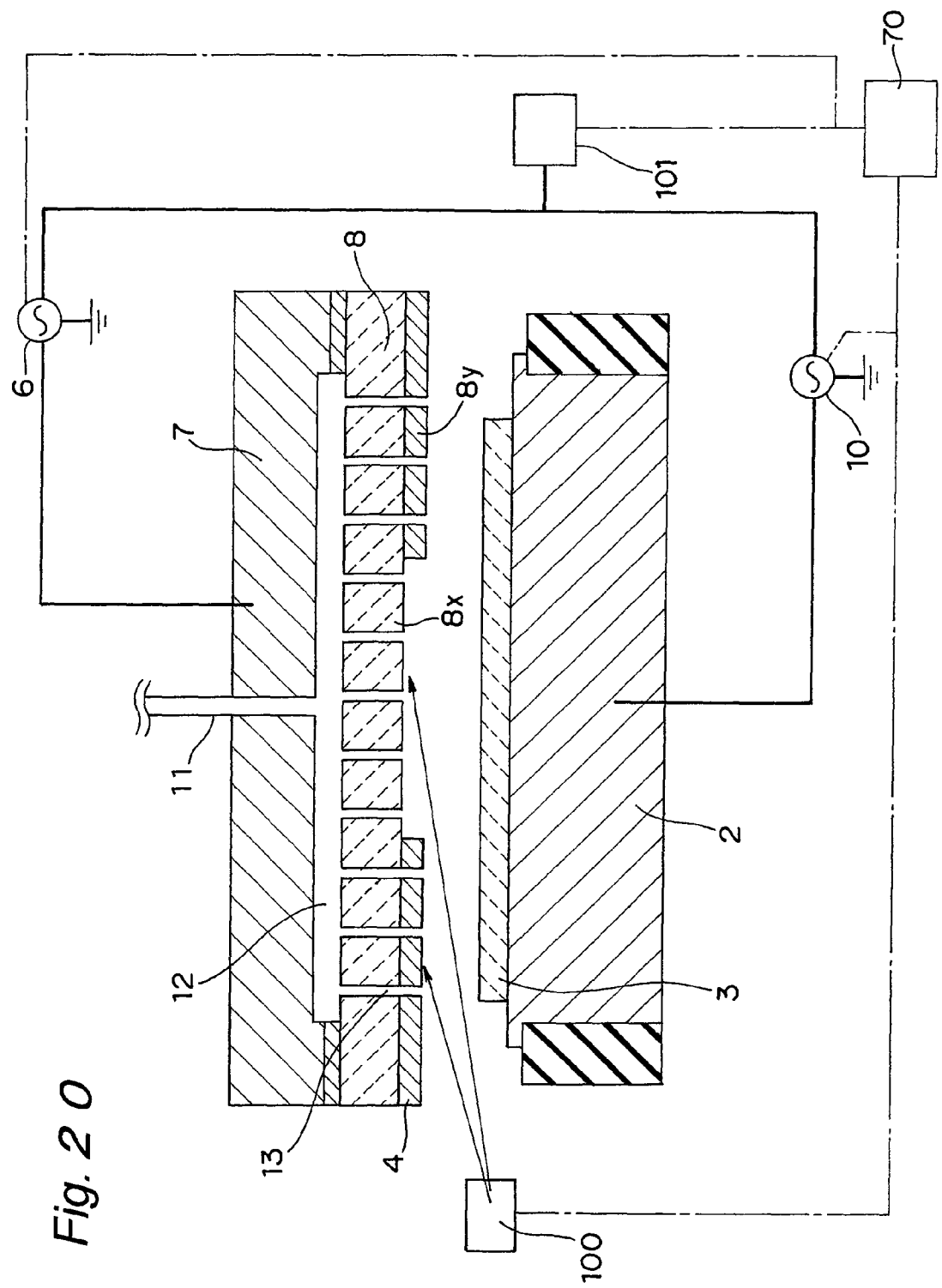
FIG. 20 is a partially enlarged cross-sectional view that shows one portion of a parallel flat-plate plasma doping apparatus provided with a detecting device.

Referring to FIG. 19, the following description will discuss a method in which a plasma doping process is carried out by using an annular boron-containing film. FIG. 19 is a view that shows a sequence of processes in which the plasma doping process in accordance with the third embodiment is carried out. FIG. 20 is a partially enlarged cross-sectional view showing one portion of a parallel flat-plate plasma doping apparatus provided with a detecting device.

First, a maintenance process is carried out on a vacuum container (chamber) 1 as step S1.

Next, under control of a control unit 70, an annular boron-containing film is formed on a circumference edge portion By on the inner face of a top plate 8, as step S2.

Next, under control of the control unit 70, plasma doping process is carried out as step S3.

Thereafter, a boron-containing film 4 adhering to the inner face of the top plate 8 is detected as step S4. This detection is carried out by using a film-thickness measuring device 100 for measuring the thicknesses of the boron-containing film 4 on the center portion 8x and the peripheral edge portion 8y of the top plate 8, or by using a counter for discharging number of times or a discharging time counter 101 connected to the high-frequency power supplies 6 and 10, so as to measure the number of discharging times or the discharging period of time. The film-thickness measuring device 100 and the counter for discharging number of times or the discharging time counter 101 respectively function as examples of detecting devices, and are respectively connected to the control unit 70 so that information as to whether or not the boron-containing film 4 can be used for the next plasma doping process (information as to whether the boron-containing film 4 is applicable or inapplicable), more specifically, the thickness of the boron-containing film 4 on the center portion 8x and the peripheral edge portion 8y of the top plate 8, or the detected discharging number of times or discharging period of time, can be detected. For example, the control unit 70 determines whether or not the information of the detection result from the detecting device 100 or 101 (information as to whether the boron-containing film 4 is applicable or inapplicable), for example, the measured film thickness, or the detected discharging number of times or discharging period of time exceeds a predetermined value (a predetermined threshold value or a reference value) (in other words, determines whether or not the information as to applicable or inapplicable state of the boron-containing film 4 means the applicable state or inapplicable state), and when the resulting value is the predetermined value or less (the predetermined threshold value or the reference value), the control unit 70 determines that the detection result is desirable (determines that the information as to applicable or inapplicable state of the boron-containing film 4 means the applicable state); in contrast, when the resulting value exceeds the predetermined value (the predetermined threshold value or the reference value), the control unit determines that the detection result is undesirable (determines that the information as to applicable or inapplicable state of the boron-containing film 4 means the inapplicable state).

Next, in step S5, the control unit 70 determines whether the detection result is desirable or undesirable. In the case where the detection result in step S5 is desirable, the plasma doping process in step S3 is successively carried out under control of the control unit 70.

In contrast, in the case where the detection result in step S5 is undesirable, the sequence proceeds to step S6, and a removing process for the boron-containing film is carried out under control of the control unit 70. The removing process for the boron-containing film (step S6) is carried out by a plasma etching process. At this time, the boron-containing film formed on the inner face of the top plate 8 may be completely removed, or only the film located on the center portion 8x on the inner face of the top plate 8 may be removed so that a boron-containing film 4 having an annular shape can be formed. In the case where the boron-containing film formed on the inner face of the top plate 8 is completely removed, the next step is again started from the process (step S2) for forming the boron-containing film. In contrast, in the case where the portion of the boron-containing film is removed with the boron-containing film 4 having the annular shape being formed, the plasma doping process (step S3) can be successively carried out.

(Reasons for Determining the Size of a Boron-Containing Film)

The following description will discuss the reasons for determining the size of a boron-containing film.

By using a parallel flat-plate plasma doping apparatus, provided with a top plate 8 on which a film containing an impurity with a uniform thickness is formed, that is the conventional art device shown in FIGS. 10 and 11, a plasma doping process was carried out, and FIGS. 21A to 21D show the results of the process.

As shown in comparative example 1, when a plasma doping process is carried out by using the device shown in FIGS. 10 and 11, boron is introduced onto the center portion of the silicon substrate 3 not only from the center portion of the entire surface boron-containing film 17, but also from the entire portion of the entire surface boron-containing film 17 including the peripheral edge portion of the film 17. In contrast, boron is introduced onto the peripheral edge portion of the silicon substrate 3 only from the peripheral edge portion of the entire surface boron-containing film 17 having a uniform thickness; therefore, more boron derived from the entire surface boron-containing film 17 is introduced into the center portion of the silicon substrate 3.

Here, in order to obtain further superior uniformity within the in-plane of the substrate based upon the results shown in FIGS. 21A to 21D of the conventional device, the size of an opening portion to be formed in the center portion of the boron-containing film is estimated so as to form the boron-containing film into an annular shape, which is the feature of the above-mentioned embodiments of the present invention.

First, suppose that the amount of introduced boron derived from $B_2H_6$ serving as a dopant gas into the silicon substrate 3 is made uniform within the in-plane of the substrate. When it is supposed in this manner, the distribution of the sheet resistance of FIGS. 21A to 21D can be regarded as indicating the distribution of the amount of introduced boron into the silicon substrate 3, derived from the entire surface boron-containing film 17 formed on the inner face of the top plate 8 on the vacuum container 1.

In order to improve the uniformity of the amount of introduced boron within the in-plane of the substrate shown in FIGS. 21A to 21D, the distribution of the amount of introduced boron derived from the boron-containing film into the silicon substrate 3 can be improved. That is, by removing the boron-containing film formed on the top plate at a portion facing a portion having a low sheet resistance of the silicon substrate 3 so as to reduce the amount of introduced boron, it is considered that the uniformity within the in-plane of the substrate can be improved.

The following description will discuss the results of estimation of the size of the opening portion to be formed in the center portion of the boron-containing film.

FIGS. 21A to 21D show the results of plasma doping processes after lapses of 20 seconds, 60 second, 120 seconds, and 200 seconds from the start of the plasma doping. Based upon the respective results, the size of the opening portion to be formed in the center portion of the boron-containing film is estimated so as to obtain better uniformity within the in-plane of the substrate.

Figure 21A:
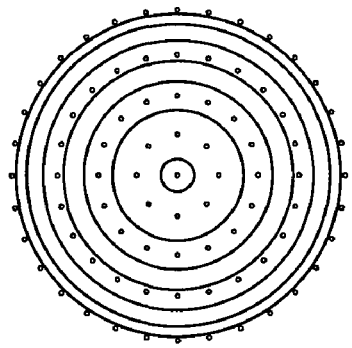
FIG. 21A is a view that shows a distribution of sheet resistance of a substrate having a diameter of 300 mm after a lapse of 20 seconds from the start of a plasma doping process, which corresponds to the results of a simulation carried out by using a conventional parallel flat-plate plasma doping apparatus provided with a top plate on which a film containing impurities with a uniform thickness is formed, shown in FIGS. 10 and 11.

FIG. 21A is a view that shows a distribution of sheet resistance of the silicon substrate 3 having a round shape with a diameter of 300 mm, after a lapse of 20 seconds from the start of plasma doping in the case where a plasma doping process is carried out by using the parallel flat-plate plasma doping apparatus shown in FIGS. 10 and 11. The range within 3 mm from the peripheral edge portion of the silicon substrate 3 is excluded from the measuring subject for sheet resistance, and the sheet resistance is measured at each of 121 positions within the measuring subject range of a diameter of 294 mm (=300 mm−3 mm×2).

A substrate center portion within a range of about 113 mm or less in radius of the silicon substrate 3 is illustrated as an area having a low sheet resistance, that is, an area to have a high dose amount. In contrast, a substrate peripheral edge portion within a range of from about 113 mm to about 150 mm in radius of the silicon substrate 3 is illustrated as an area having a high sheet resistance, that is, an area to have a low dose amount. In the case where a plasma doping process is carried out by using the parallel flat-plate plasma doping apparatus provided with the top plate 8 on which the boron-containing film is formed with the uniform thickness, the average value of the sheet resistance appears at a portion near 113 mm in radius.

Figure 22A:
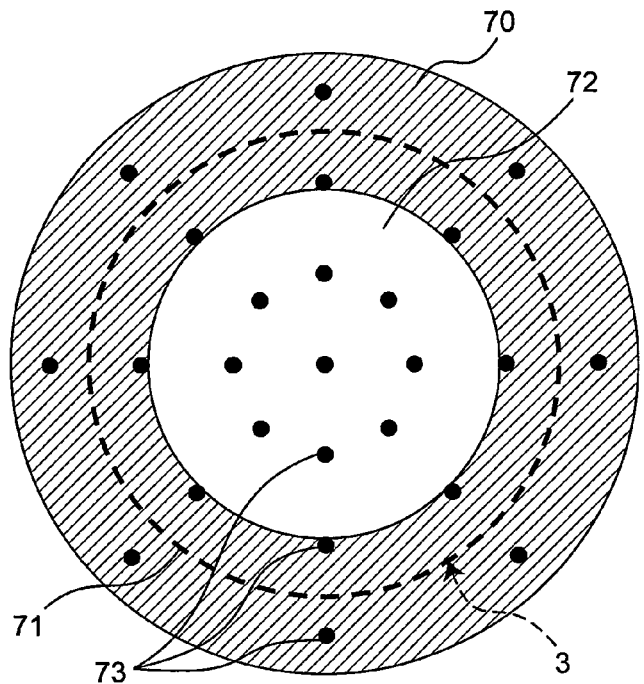
FIG. 22A is a view that shows a relationship among a portion of a top plate with a portion on which a boron containing film formed, an opening of the boron containing film, and gas introducing holes of the top plate.
Figure 22B:
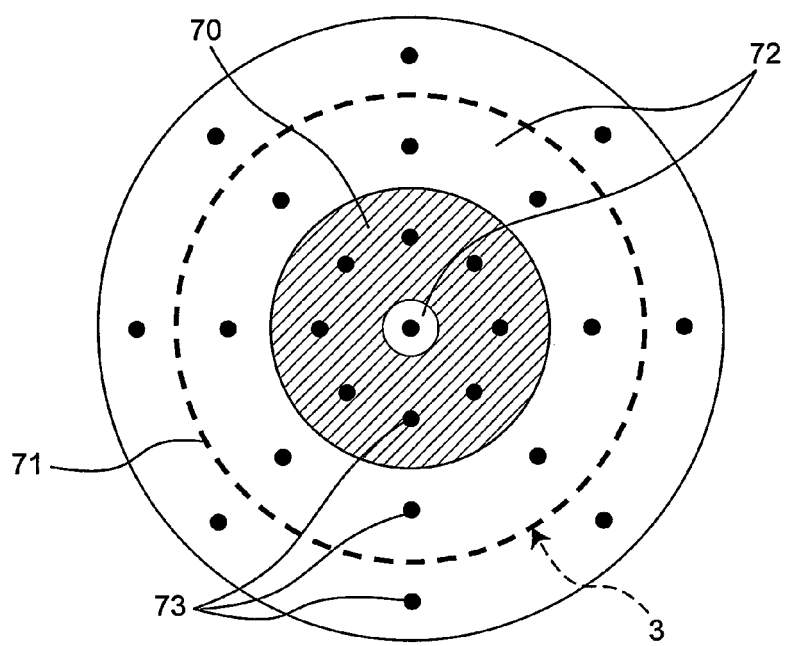
FIG. 22B is a view that shows another relationship among a portion of a top plate with a portion on which a boron containing film formed, openings of the boron containing film, and gas introducing holes of the top plate.
Figure 24:
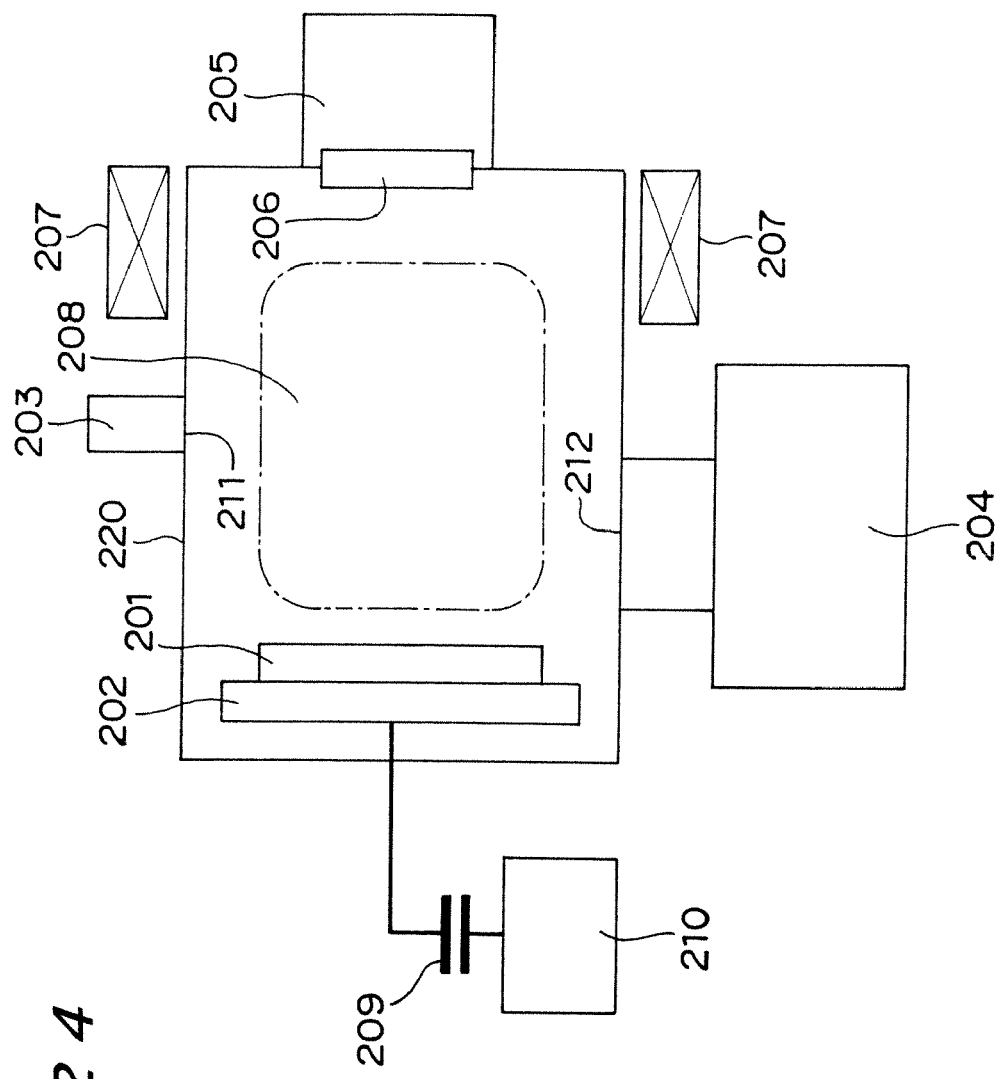
FIG. 24 is a view that shows a schematic structure of a plasma processing device for use in a plasma doping method as a conventional impurity-introducing method described in Patent Document 1.
Figure 25:
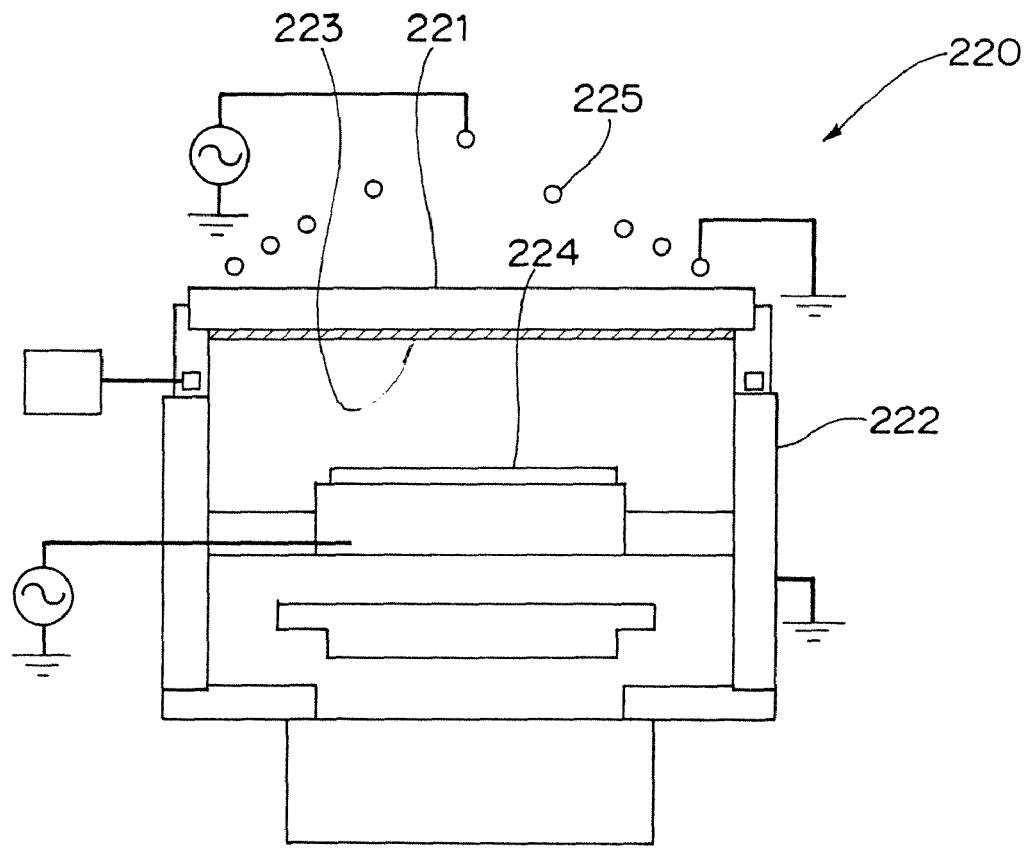
FIG. 25 is a view that shows a structure of an introducing device by which an impurity is introduced into a semiconductor by using an ICP plasma device of Patent Document 2.
Figure 26:
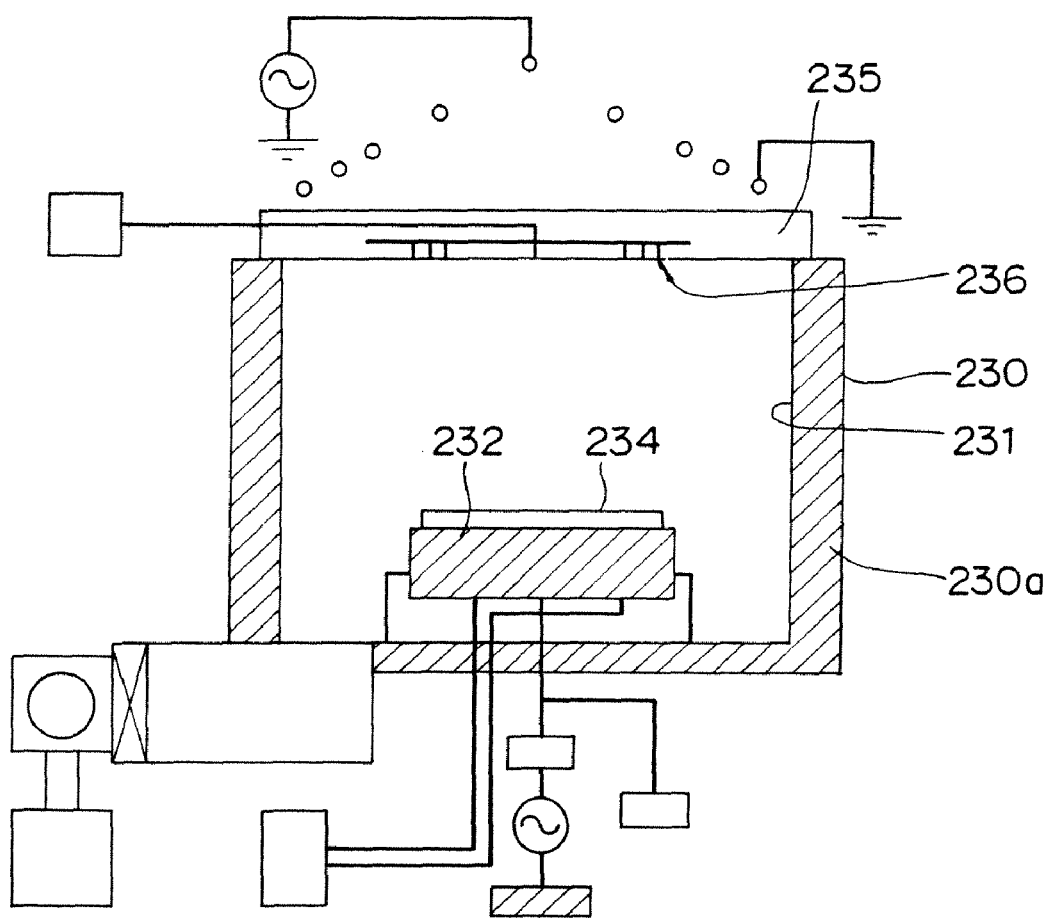
FIG. 26 is a view that shows a structure of a plasma doping apparatus that forms an impurity-introducing layer on a substrate to be processed by using a plasma doping apparatus of Patent Document 3.
Figure 27:
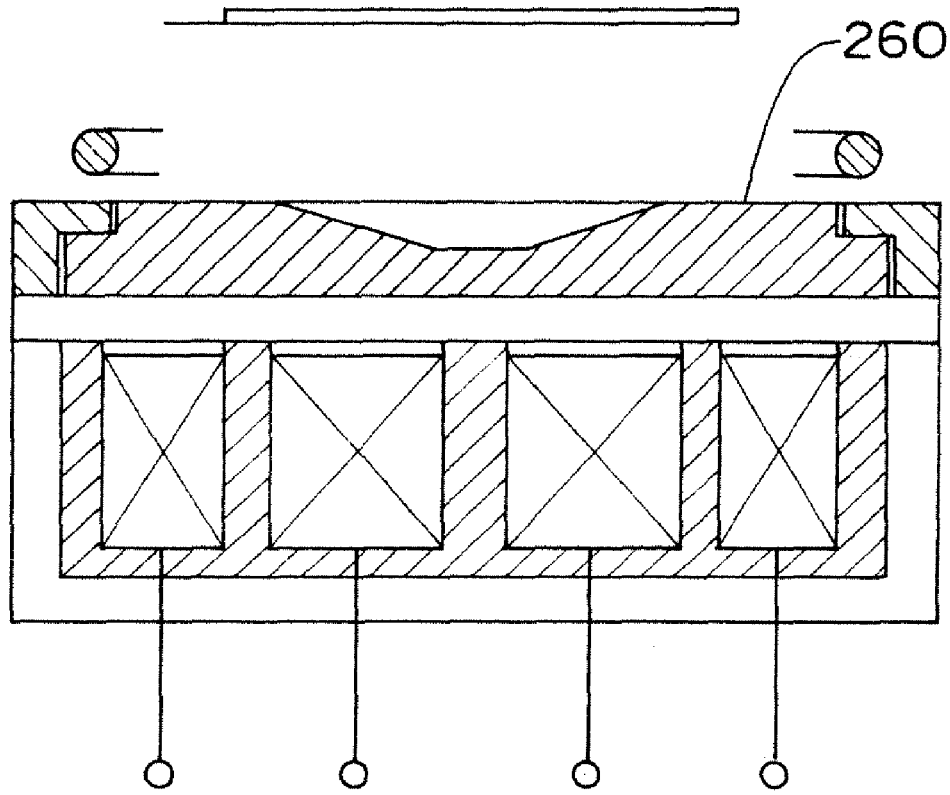
FIG. 27 is a view that shows a structure of a sputtering device relating to Patent Document 4.
Figure 28A:
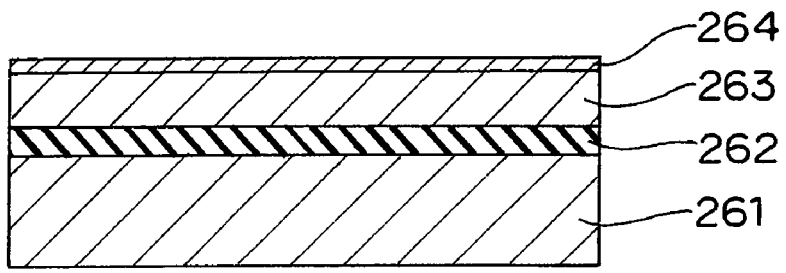
FIG. 28A is a partial cross-sectional view that shows a process for forming a source-drain extension area of a planer device by using a plasma doping process.
Figure 28B:
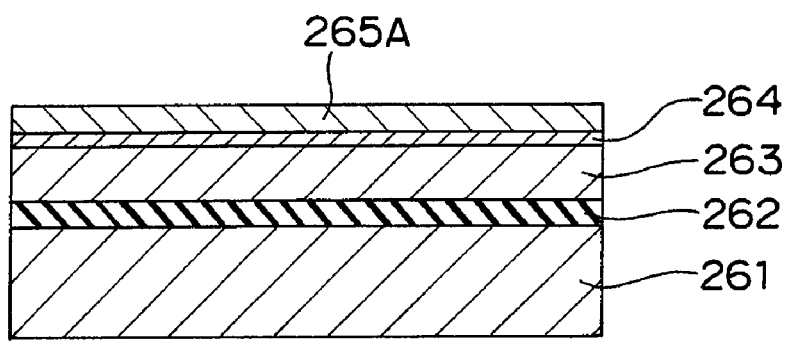
FIG. 28B is a view that shows a process for forming the source-drain extension area of the planer device by using a plasma doping process in succession to the process of FIG. 28A.
Figure 28C:
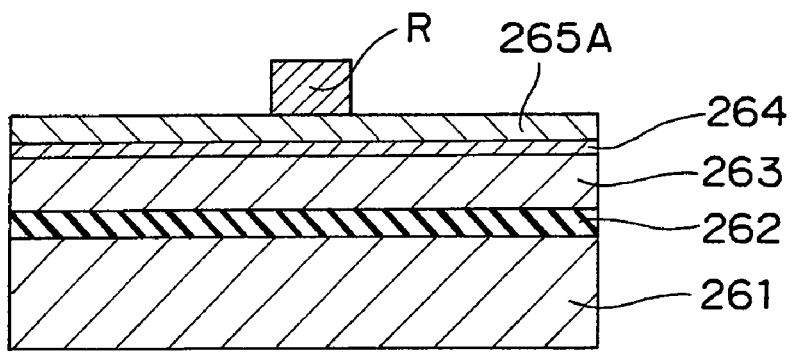
FIG. 28C is a view that shows a process for forming the source-drain extension area of the planer device by using a plasma doping process in succession to the process of FIG. 28B.
Figure 28D:
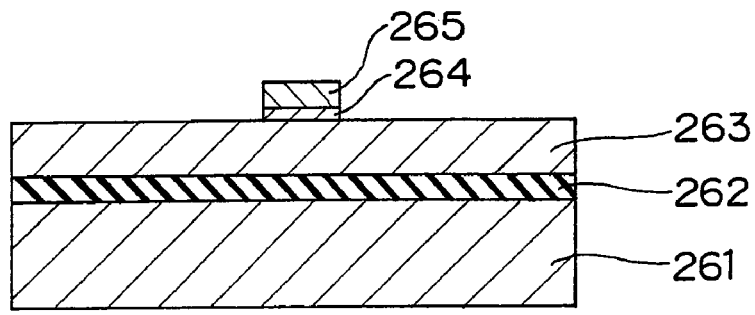
FIG. 28D is a view that shows a process for forming the source-drain extension area of the planer device by using a plasma doping process in succession to the process of FIG. 28C.
Figure 28E:
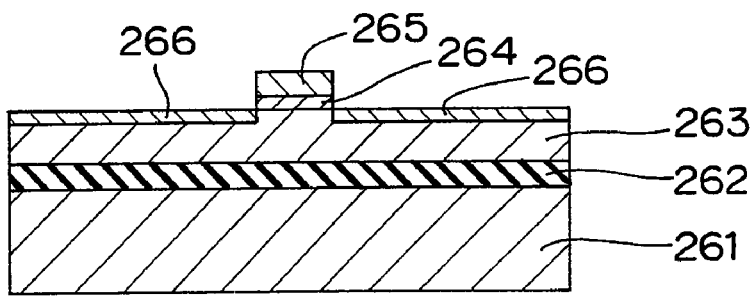
FIG. 28E is a view that shows a process for forming the source-drain extension area of the planer device by using a plasma doping process in succession to the process of FIG. 28D.
Figure 28F:
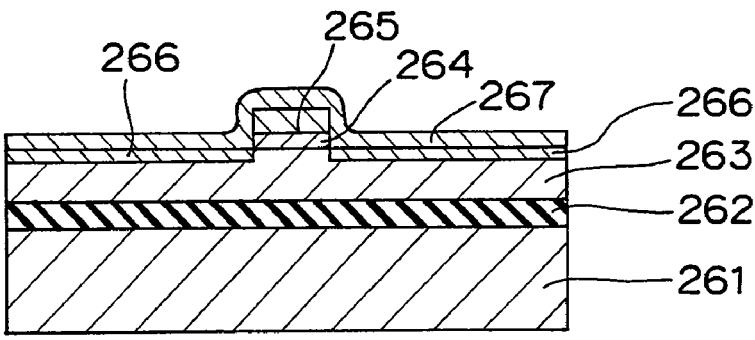
FIG. 28F is a view that shows a process for forming the source-drain extension area of the planer device by using a plasma doping process in succession to the process of FIG. 28E.
Figure 28G:
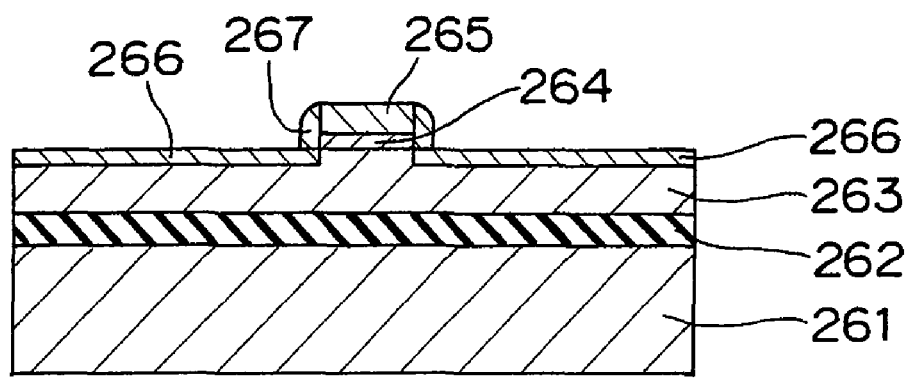
FIG. 28G is a view that shows a process for forming the source-drain extension area of the planer device by using a plasma doping process in succession to the process of FIG. 28F.
Figure 28H:
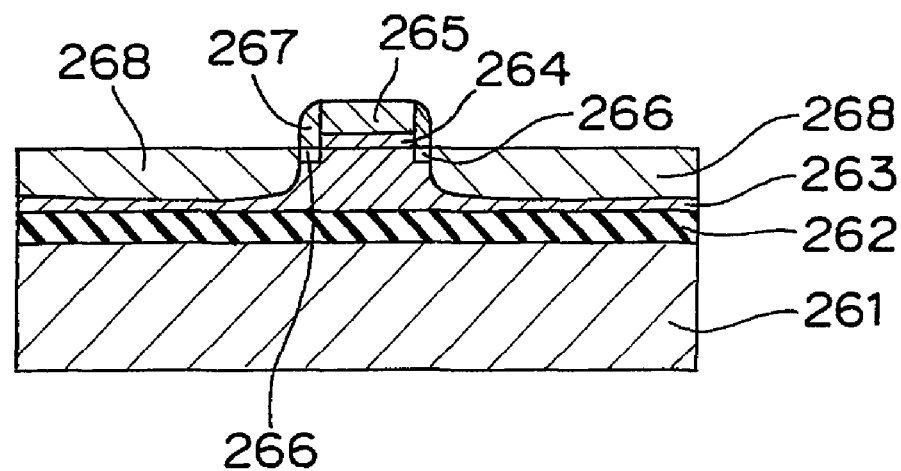
FIG. 28H is a view that shows a process for forming the source-drain extension area of the planer device by using a plasma doping process in succession to the process of FIG. 28G.
Figure 29A:
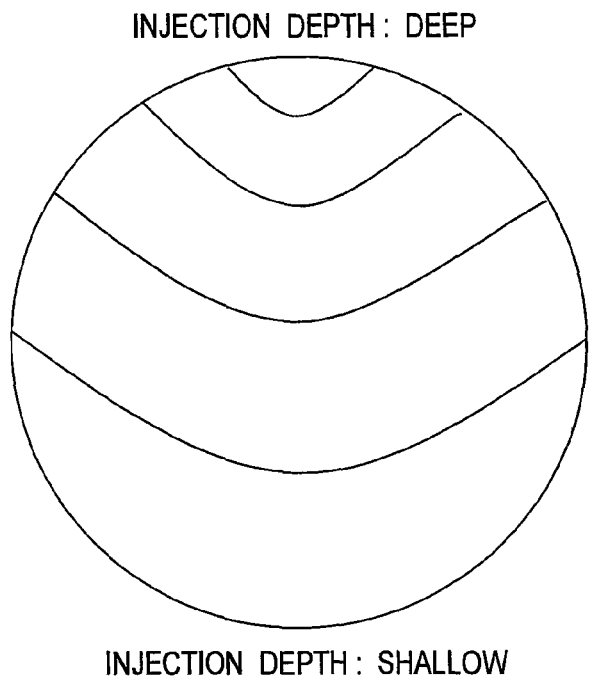
FIG. 29A is a view that shows a substrate in-plane distribution of injection depth after the plasma doping process of the source-drain extension area formed by using the device shown in FIG. 24 disclosed in Patent Document 1.
Figure 29B:
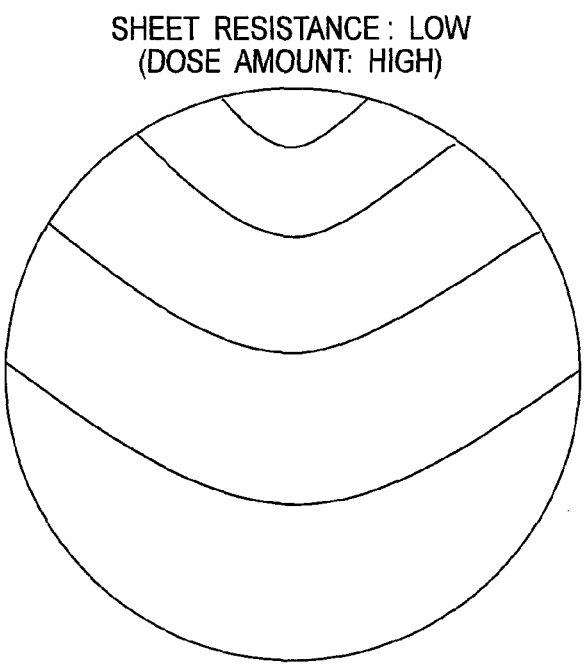
FIG. 29B is a view that shows a substrate in-plane distribution of sheet resistance after a heating process of the source-drain extension area formed by using the device shown in FIG. 24 disclosed in Patent Document 1.
Figure 30A:
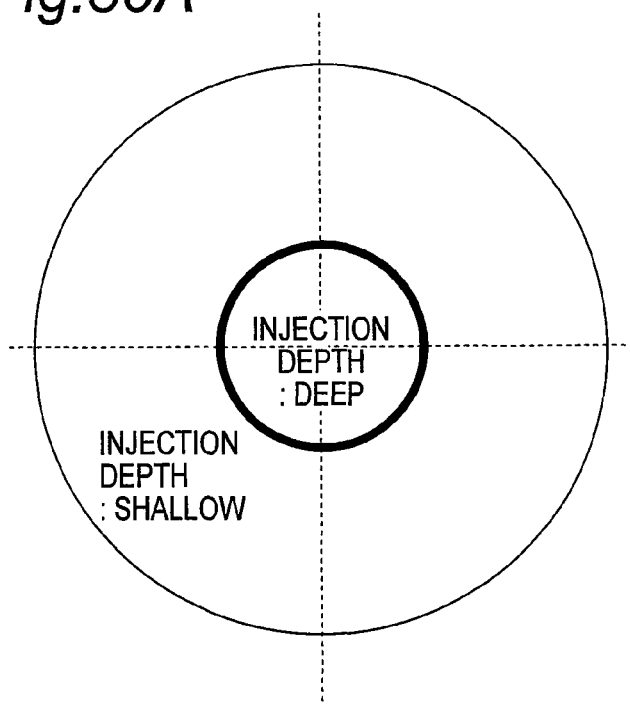
FIG. 30A is a view that shows a substrate in-plane distribution of injection depth of the layer of the source-drain extension area formed by using the device shown in FIG. 25 disclosed in Patent Document 2.
Figure 30B:
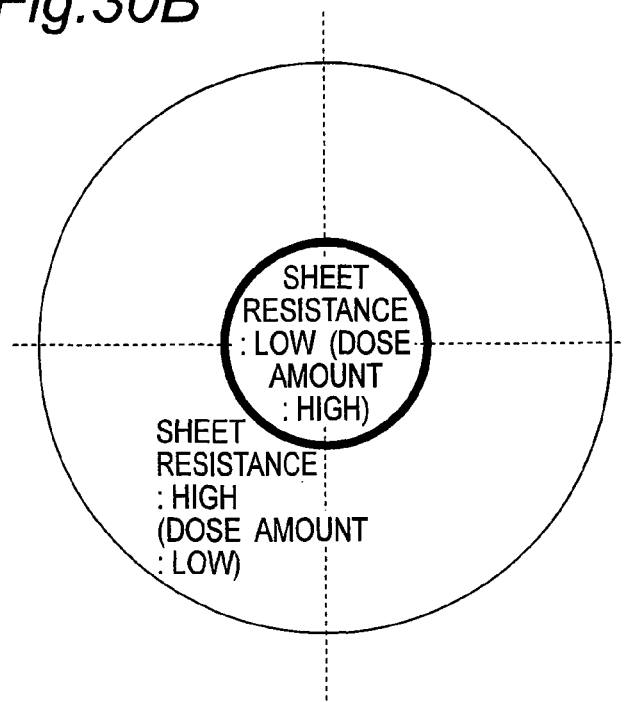
FIG. 30B is a view that shows a substrate in-plane distribution of sheet resistance of the layer of the source-drain extension area formed by using the device shown in FIG. 25 disclosed in Patent Document 2.
Figure 31A:
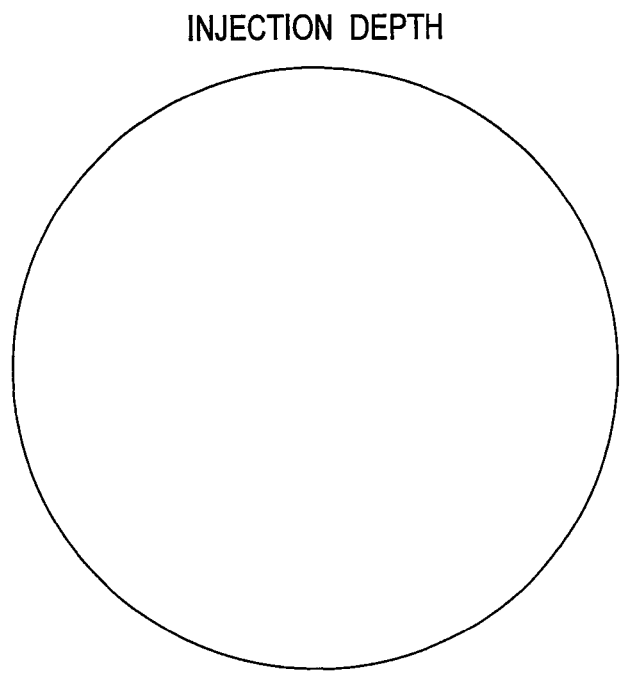
FIG. 31A is a view that shows a substrate in-plane distribution of injection depth of the layer of the source-drain extension area formed by using the device shown in FIG. 26 disclosed in Patent Document 3.
Figure 31B:
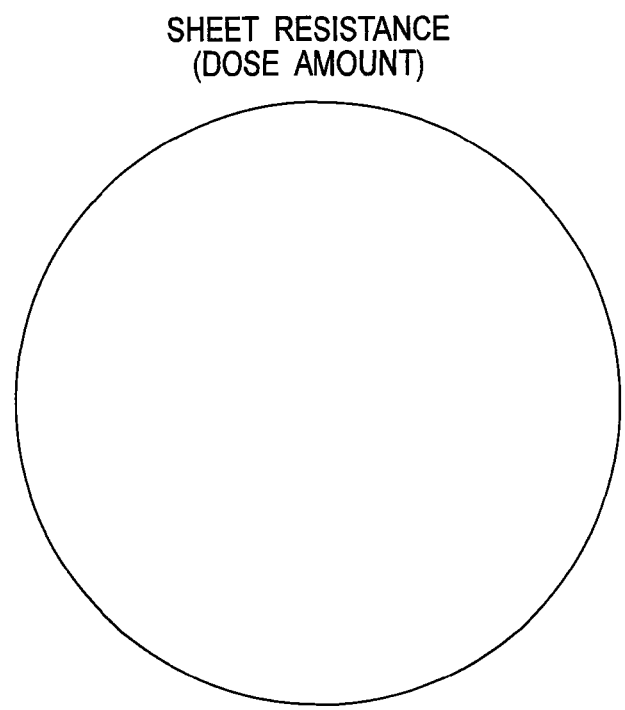
FIG. 31B is a view that shows a substrate in-plane distribution of sheet resistance of the layer of the source-drain extension area formed by using the device shown in FIG. 26 disclosed in Patent Document 3.

Therefore, based upon the results shown in FIG. 21A, the area of 113 mm or less in radius of the substrate is defined as "area in the center portion of the substrate", and the area exceeding 113 mm in radius of the substrate 3 is defined as "area on the peripheral edge portion of the substrate"; thus, two divided areas are defined. In this case, when the dose amount can be reduced in the area of the substrate center portion, it is possible to improve the uniformity of the dose amount within the in-plane of the substrate. As described earlier, in order to make the dose amount smaller, the boron-containing film facing a portion where the dose amount is to be reduced can be removed. That is, as shown in FIGS. 22A and 22B, it is assumed that by forming an opening portion on a boron-containing film within the area of the center portion 8x on the inner face of the top plate 8 corresponding to a portion right above "the area in the center portion of the substrate" that is the area within a range of 113 mm or less in radius from the center of the silicon substrate 3, as well as by forming a boron-containing film on the area of the peripheral edge portion 8y on the inner face of the top plate 8 corresponding to a portion right above "the area on the peripheral edge portion of the substrate" that is the area exceeding 113 mm in radius from the center of the silicon substrate 3, it is possible to improve the uniformity of the dose amount within the in-plane of the substrate. Note that, in FIGS. 22A and 22B, a gray-colored portion indicated by reference numeral 70 represents the portion in which the boron-containing film is formed on the top plate 8. Reference numeral 71 represents the outer diameter of the silicon substrate (in other words, the peripheral edge). Reference numeral 72 represents an opening portion of the boron-containing film. Reference numeral 73 represents the position of the gas introducing hole 13 of the top plate 8.

Figure 21B:
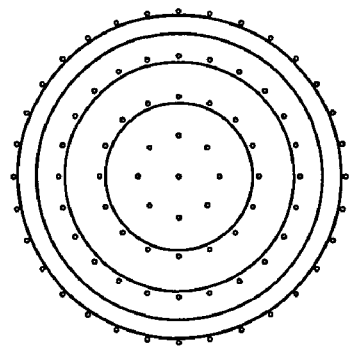
FIG. 21B is a view that shows a distribution of sheet resistance of the substrate having the diameter of 300 mm after a lapse of 60 seconds from the start of the plasma doping process, which corresponds to the results of a simulation carried out by using the conventional parallel flat-plate plasma doping apparatus provided with the top plate on which the film containing impurities with the uniform thickness is formed, shown in FIGS. 10 and 11.

In the same manner, FIG. 21B is a view that shows the distribution of sheet resistance of the silicon substrate 3 having a diameter of 300 mm after a lapse of 60 seconds from the start of plasma doping. A substrate center portion within a range of about 105 mm or less in radius of the silicon substrate 3 is illustrated as an area having a high dose amount. Moreover, a substrate peripheral edge portion within a range of from about 105 mm to about 150 mm in radius of the silicon substrate 3 is illustrated as an area having a low dose amount. Therefore, from the results shown in FIG. 21B, it is assumed that by forming an opening portion on the boron-containing film in an area of 105 mm or less in radius from the center of the inner face of the top plate 8, the uniformity of the dose amount within the in-plane of the substrate can be improved.

Figure 21C:
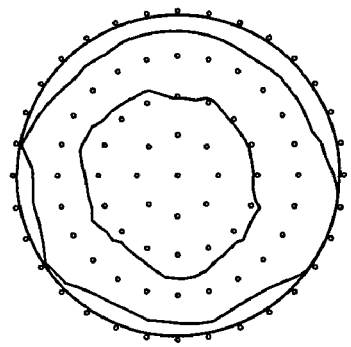
FIG. 21C is a view that shows a distribution of sheet resistance of the substrate having the diameter of 300 mm after a lapse of 120 seconds from the start of a plasma doping process, which corresponds to the results of a simulation carried out by using the conventional parallel flat-plate plasma doping apparatus provided with the top plate on which the film containing impurities with the uniform thickness is formed, shown in FIGS. 10 and 11.

In the same manner, FIG. 21C is a view that shows the distribution of sheet resistance of the silicon substrate 3 having a diameter of 300 mm after a lapse of 120 seconds from the start of plasma doping. A substrate center portion within a range of about 56 mm or less in radius of the silicon substrate 3 is illustrated as an area having a high dose amount. Moreover, a substrate peripheral edge portion within a range from about 56 mm to about 150 mm in radius of the silicon substrate 3 is illustrated as an area having a low dose amount. Therefore, from the results shown in FIG. 21C, it is assumed that by forming an opening portion on the boron-containing film in an area of about 56 mm or less in radius from the center of the inner face of the top plate 8, the uniformity of the dose amount within the in-plane of the substrate can be improved.

Figure 21D:
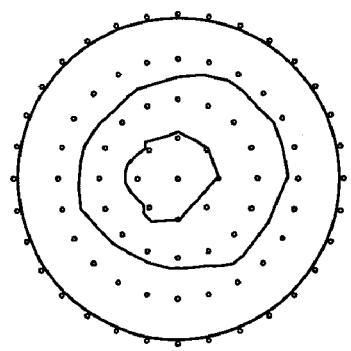
FIG. 21D is a view that shows a distribution of sheet resistance of the substrate having the diameter of 300 mm after a lapse of 200 seconds from the start of a plasma doping process, which corresponds to the results of a simulation carried out by using the conventional parallel flat-plate plasma doping apparatus provided with the top plate on which the film containing impurities with the uniform thickness is formed, shown in FIGS. 10 and 11.

In the same manner, FIG. 21D is a view that shows the distribution of sheet resistance of the silicon substrate 3 having a diameter of 300 mm after a lapse of 200 seconds from the start of plasma doping. A range within about 18 mm or less in radius of the silicon substrate 3 and a range of from about 90 mm to about 150 mm in radius thereof are illustrated as areas having a high dose amount. In contrast, a substrate peripheral edge portion within a range of from about 18 mm to about 90 mm in radius of the silicon substrate 3 is illustrated as an area having a low dose amount. Therefore, from the results shown in FIG. 21D, by reducing the amount of injected boron derived from the boron containing-film in the area within 18 mm or less in radius of the substrate 3 and the area from 90 mm or more to 150 mm or less in radius thereof, it becomes possible to improve the uniformity of the dose amount within the in-plane of the substrate. That is, as shown in FIG. 22B, it is assumed that opening portions can be desirably formed in the area within about 18 mm or less in radius from the center of the inner face of the top plate 8 as well as in the area from about 90 mm or more to about 150 mm or less in radius thereof.

In summary, the opening portion to be formed in the center portion of the boron-containing film may be formed in the area within about 113 mm or less in radius from the center of the inner face of the top plate 8 in the case of the plasma doping time of 20 seconds, may be formed in the area within about 105 mm or less in radius from the center of the inner face of the top plate 8 in the case of the plasma doping time of 60 seconds, may be formed in the area within about 56 mm or less in radius from the center of the inner face of the top plate 8 in the case of the plasma doping time of 120 seconds, and may be formed in the area within about 18 mm or less in radius from the center of the inner face of the top plate 8 in the case of the plasma doping time of 200 seconds, respectively. That is, it is assumed that the size of the opening portion to be formed in the center portion of the boron-containing film can be formed in a range of from 18 mm or more to 113 mm or less in radius from the center of the boron-containing film.

In this case, the explanation has been given of the silicon substrate 3 having a diameter of 300 mm, and the size of the opening portion of the boron-containing film is in proportion to the size of the silicon substrate 3. That is, the size of the opening portion of the boron-containing film can be set in the following manner by using a ratio (radius of the opening portion of the boron-containing film)/(radius of the silicon substrate).

From the results shown in FIG. 21A, based upon the results in the case of 20 seconds of the plasma doping time, the opening portion can be formed in the center portion of the boron-containing film so as to satisfy: (radius of the substrate):(radius of the opening portion of the boron-containing film)=150:113, and (radius of the opening portion of the boron-containing film)/(radius of the substrate)=0.75 or less.

In the same manner, from the results shown in FIG. 21B, based upon the results in the case of 60 seconds of the plasma doping time, the opening portion can be formed in the center portion of the boron-containing film so as to satisfy: (radius of the substrate):(radius of the opening portion of the boron-containing film)=150:105, and (radius of the opening portion of the boron-containing film)/(radius of the substrate)=0.70 or less.

In the same manner, from the results shown in FIG. 21C, based upon the results in the case of 120 seconds of the plasma doping time, the opening portion can be formed in the center portion of the boron-containing film so as to satisfy: (radius of the substrate):(radius of the opening portion of the boron-containing film)=150:56, and (radius of the opening portion of the boron-containing film)/(radius of the substrate)=0.37 or less.

In the same manner, from the results shown in FIG. 21D based upon the results in the case of 120 seconds of the plasma doping time, the opening portion can be formed in the center portion of the boron-containing film so as to satisfy: (radius of the substrate):(radius of the opening portion of the boron-containing film)=150:18, and (radius of the opening portion of the boron-containing film)/(radius of the substrate)=0.12 or less.

In summary, the ratio of the substrate 3 and the radius of the opening portion at the center portion of the boron-containing film is desirably set in a range of from 0.12 or more to 0.75 or less in the ratio (radius of the substrate)/(radius of the opening portion of the boron-containing film). In the case where the ratio is set in this range, as indicated by the results of the aforementioned estimation, it is possible to obtain particularly desirable uniformity in the dose amount within the in-plane of the substrate. That is, since the amount of injected boron derived from the boron-containing film into the silicon substrate 3 is made uniform within the in-plane of the silicon substrate 3, the amount of injected boron, as well as both of the dose amount and the injection depth, can be made uniform within the in-plane of the substrate.

Here, the present invention is not intended to be limited by the above-mentioned embodiments, and may be carried out in various other modes.

For example, as shown in FIG. 23, gas supply systems to be supplied from the center portion 8x and the peripheral edge portion 8y of the top plate 8 may be separated from each other so that two systems for supplying a gas from the gas supply device to the vacuum container 1 may be prepared.

That is, the gas supply device 5 may be configured by two devices, that is, a gas supply device 131 on the center portion side and a gas supply device 132 on the peripheral edge portion side, and the gas supply pipe 11 may be configured by two pipes, that is, a gas supply pipe 111 on the center portion and a gas supply pipe 110 on the peripheral edge portion.

Moreover, the gas chamber 12 is divided into a gas chamber 112 in the center portion and a ring-shaped gas chamber 113 on the peripheral edge portion separated therefrom by a barrier wall 114. In accordance with this structure, the gas is supplied by two routes, that is, a route that extends from the gas supply device 131 on the center portion side to reach the gas chamber 112 in the center portion through the gas supply pipe 111 on the center portion and a route that extends from the gas supply device 132 on the peripheral edge portion side to reach the gas chamber 113 on the peripheral edge portion through the gas supply pipe 110 on the peripheral edge portion. Therefore, from the gas chamber 112 in the center portion, a gas is supplied into the vacuum container 1 through the gas introducing hole 13 on the center portion of the top plate 8, and a gas is also supplied into the vacuum container 1 from the gas chamber 113 on the peripheral edge portion. Consequently, for example, by adjusting the amounts of supply of gases from the center portion 8x and the peripheral edge portion 8y of the top plate 8 to different values, the uniformity of the dose amount and the injection depth can be maintained with higher precision.

As shown in FIG. 22C that gives numeric value examples, in the case where the outer diameter (diameter) of the substrate 3 is 200 mm, a substrate-placing area 2s of the sample electrode 2 corresponds to a round-shaped area having a diameter of 200 mm, the outer diameter (diameter) D of the top plate 8 is in a range of 200 mm<D<340 mm, the ratio E of the opening portion in the center of the boron-containing film 4 (ratio of the opening portion based on the radius of the substrate-placing area 2s of the sample electrode 2) is in a range of $0.125 \leq E \leq 0.75$, and the thickness T of the boron-containing film 4 is in a range of $0.01~\mu m \leq T \leq 100~\mu m$.

In the case where the outer diameter (diameter) of the substrate 3 is 300 mm, a substrate-placing area 2s of the sample electrode 2 corresponds to a round-shaped area having a diameter of 300 mm, the outer diameter (diameter) D of the top plate 8 is in a range of 300 mm<D<510 mm, the ratio E of the opening portion in the center of the boron-containing film 4 (ratio of the opening portion based on the radius of the substrate-placing area 2s of the sample electrode 2) is in a range of $0.125 \leq E \leq 0.75$, and the thickness T of the boron-containing film 4 is in a range of $0.01~\mu m \leq T \leq 100~\mu m$.

In the case where the outer diameter (diameter) of the substrate 3 is 450 mm, a substrate-placing area 2s of the sample electrode 2 corresponds to a round-shaped area having a diameter of 450 mm, the outer diameter (diameter) D of the top plate 8 is in a range of 300 mm<D<765 mm, the ratio E of the opening portion in the center of the boron-containing film 4 (ratio of the opening portion based on the radius of the substrate-placing area 2s of the sample electrode 2) is in a range of $0.125 \leq E \leq 0.75$, and the thickness T of the boron-containing film 4 is in a range of $0.01~\mu m \leq T \leq 100~\mu m$.

That is, the substrate-placing area 2s of the sample electrode 2 is preferably formed into the same size as the substrate 3. The outer diameter (diameter) D of the top plate 8 has a constant ratio to the diameter of the substrate regardless of the size of the diameter of the substrate. The ratio E of the opening portion in the center of the boron-containing film 4 is made constant regardless of the size of the diameter of the substrate. The thickness T of the boron-containing film 4 is also made constant regardless of the size of the diameter of the substrate.

By properly combining the arbitrary embodiments of the aforementioned various embodiments, the effects possessed by the embodiments can be produced.

INDUSTRIAL APPLICABILITY

The plasma doping apparatus and method, as well as the method for manufacturing a semiconductor device, in accordance with the present invention make it possible to dramatically improve the uniformity of the injection depth and distribution of sheet resistance over the entire face of the substrate, and also to achieve stability for a long period of time, and are effectively used as a plasma doping apparatus and method that introduce impurities into a surface of a solid-state sample, such as a semiconductor substrate, and a method for manufacturing a semiconductor device that utilizes the plasma doping method.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A parallel flat-plate plasma doping apparatus comprising:
   a vacuum container;
   a sample electrode that is placed in the vacuum container, and has a substrate-placing area on which a substrate is placed;
   a high-frequency power supply for applying high-frequency power to the sample electrode;
   an exhaust device for evacuating the vacuum container;
   a gas supply device for supplying a gas containing an impurity into the vacuum container; and
   a plasma generation mechanism for exciting the gas to generate a plasma,
   the plasma doping apparatus further comprising:
   a top plate disposed on an upper portion of the vacuum container so as to face the substrate-placing area of the sample electrode and provided with an impurity-containing film that contains the impurity, with the film being not located in a top plate center portion area and being located only in a top plate peripheral edge portion area located at a peripheral edge of the top plate center portion area, on a face exposable to the plasma generated in the vacuum container and with the top plate center portion area facing a center portion of the substrate-placing area of the sample electrode.

2. The plasma doping apparatus according to claim 1, wherein the film is located on the top plate center portion area and the top plate peripheral edge portion area of the top plate with a thickness thereof being made thicker on the top plate peripheral edge portion area than that on the top plate center portion area of the top plate.

3. The plasma doping apparatus according to claim 1, wherein the film is located on the top plate center portion area and the top plate peripheral edge portion area of the top plate, and the plasma doping apparatus comprises a plasma contact preventive layer being formed on the top plate center portion area of the top plate so as not to be made in contact with the plasma.

4. The plasma doping apparatus according to claim 1, wherein the film has an outer diameter that is a same as, or larger than an outer diameter of the substrate-placing area of the sample electrode.

5. The plasma doping apparatus according to claim 1, wherein the gas containing an impurity, to be supplied from the gas supply device is a gas containing $B_2H_6$ with $B_2H_6$ having a concentration in a range of from 0.01% by mass or more to 1.0% by mass or less.

6. The plasma doping apparatus according to claim 1, wherein the impurity-containing film, located on the top plate peripheral edge portion area of the top plate, has an opening portion in a center portion with a size in a range of from 18 mm or more to 113 mm or less in radius from a center of the impurity-containing film.

7. The plasma doping apparatus according to claim 1, wherein a through hole that is used for introducing a gas, and connected to the gas supply device is formed on the impurity-containing film so that the gas is supplied into the vacuum container from the gas supply device through the through hole.

8. The plasma doping apparatus according to claim 1, further comprising:
   a detection device for detecting information as to an applicable or inapplicable state of the impurity-containing film of the top plate; and
   a control unit that controls so as to carry out operations of:
   forming the impurity-containing film on the top plate peripheral edge portion area of the top plate in a state where no substrate is placed on the sample electrode; carrying out the plasma doping process in a state where the substrate is placed on the sample electrode after the formation of the impurity-containing film; and comparing a value of the information as to an applicable or inapplicable state of the impurity-containing film detected by the detecting device after the plasma doping process with a reference value so that, if the value is the reference value or less, the plasma doping process is again carried out, and if the value exceeds the reference value, a process for removing the impurity-containing film from the top plate center portion area of the top plate is carried out.

9. A plasma doping method comprising:
   placing a substrate on a substrate-placing area of a sample electrode placed in a vacuum container; and
   evacuating the vacuum container by using an exhausting device, while supplying a gas containing an impurity into the vacuum container from a gas supply device with a high-frequency power being applied to the sample electrode from a high-frequency power supply, while the gas is being excited by a plasma generation mechanism to generate a plasma, so that a plasma doping process is carried out,
   the method further comprising, by the plasma generated between the top plate and the substrate of the sample electrode, introducing the impurity in the gas supplied into the vacuum chamber from the gas supply device, and an impurity, contained in an impurity-containing film that contains the impurity, that is not located in a top plate center portion area, and that is located only in a top plate peripheral edge portion area located at a peripheral edge of the top plate center portion area, on a face exposable to the plasma generated in the vacuum container, of a top plate disposed on an upper portion of the vacuum container so as to face the substrate-placing area of the sample electrode, with the top plate center portion area facing a center portion of the substrate-placing area of the sample electrode, into the substrate placed on the substrate-placing area of the sample electrode.

10. The plasma doping method according to claim 9, wherein, to the center portion area of the substrate facing the top plate center portion area of the top plate, the impurity in the gas supplied into the vacuum container is mainly introduced, while, to the peripheral edge portion area of the substrate facing the top plate peripheral edge portion area of the top plate, the impurity in the gas supplied into the vacuum container and the impurity, derived from the impurity-containing film that is located only in the top plate peripheral edge portion area of the top plate and has an annular shape, are introduced.

11. The plasma doping method according to claim 9, wherein the gas containing an impurity, to be supplied from the gas supply device is a gas containing $B_2H_6$, with $B_2H_6$ having a concentration in a range of from 0.01% by mass or more to 1.0% by mass or less.

12. A method for manufacturing a semiconductor device by carrying out the plasma doping process by use of the plasma doping method according to claim 9.

* * * * *